United States Patent
Ohyama et al.

(10) Patent No.: US 6,772,385 B2
(45) Date of Patent: Aug. 3, 2004

(54) ERROR-CORRECTING DEVICE AND DECODER ENABLING FAST ERROR CORRECTION WITH REDUCED CIRCUIT SCALE

(75) Inventors: Tatsushi Ohyama, Ogaki (JP); Hideki Yamauchi, Ogaki (JP); Hiroki Nagai, Anpachi-gun (JP); Toru Arisaka, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 522 days.

(21) Appl. No.: 09/772,072

(22) Filed: Jan. 30, 2001

(65) Prior Publication Data

US 2001/0014960 A1 Aug. 16, 2001

(30) Foreign Application Priority Data

| Jan. 31, 2000 | (JP) | 2000-022378 |
| Feb. 21, 2000 | (JP) | 2000-042867 |
| Jul. 7, 2000 | (JP) | 2000-207160 |
| Dec. 6, 2000 | (JP) | 2000-371610 |

(51) Int. Cl.[7] .................. H03M 13/29; H03M 13/05; G11G 29/00
(52) U.S. Cl. ................... 714/755; 714/769; 714/785; 714/804
(58) Field of Search ............... 714/755–756, 714/769–770, 785, 804

(56) References Cited

U.S. PATENT DOCUMENTS

| 5,920,578 A | * | 7/1999 | Zook .................. 714/755 |
| 5,974,580 A | | 10/1999 | Zook et al. |
| 6,032,283 A | * | 2/2000 | Meyer ................. 714/746 |
| 6,131,178 A | * | 10/2000 | Fujita et al. ........... 714/784 |
| 6,158,038 A | * | 12/2000 | Yamawaki et al. ...... 714/755 |
| 6,415,411 B1 | * | 7/2002 | Nakamura ............. 714/755 |
| 6,553,533 B2 | | 4/2003 | Demura et al. ......... 714/769 |
| 6,556,679 B1 | | 4/2003 | Kato et al. ............. 380/203 |
| 2001/0052099 A1 | * | 12/2001 | Yano et al. ............. 714/755 |
| 2002/0095638 A1 | * | 7/2002 | Weng et al. ............ 714/785 |

FOREIGN PATENT DOCUMENTS

| EP | 0 821 493 A1 | 1/1998 |
| EP | 0 905 911 A2 | 3/1999 |

(List continued on next page.)

OTHER PUBLICATIONS

Patent Abstracts of Japan, 11282703, Oct. 15, 1999, NEC Corp.

European Patent Office Communication, Dec. 30, 2003, 00125690. 8–1247, Sanyo Electric Co., Ltd.

1998 IEEE International Solid–State Circuits Conference, 0–7803–4344–Jan. 1998, ISSCC98/Session 24/Disk Drive Signal Processing/Paper SP 24.7.

U.S. Ser. No. 09/714,649; Error Correction Device; filed Nov. 17, 2000; First named inventor Tatsushi Ohyama.

*Primary Examiner*—R. Stephen Dildine
(74) *Attorney, Agent, or Firm*—Westerman, Hattori, Daniels & Adrian, LLP

(57) ABSTRACT

A data buffer receives and temporarily stores data including a product code enabling error correction in first and second directions. An exclusive-OR operation circuit uses an error amount detected by error correction in the first direction and data stored in a storage element to calculate a first error check result. A PI direction error-checking circuit according to the first error check result performs error check after error correction in the first direction. A PO direction partial error-checking circuit and a PO direction aggregate error-checking circuit use an error amount detected in error correction in the second direction and calculate a second error check result. The first and second error check results are used to generate a final error check result by an exclusive-OR operation circuit.

25 Claims, 35 Drawing Sheets

FOREIGN PATENT DOCUMENTS

| | | |
|---|---|---|
| JP | 1-276825 | 11/1989 |
| JP | 8-125549 | 5/1996 |
| JP | 2605270 | 2/1997 |
| JP | 2605271 | 2/1997 |
| JP | 2714129 | 10/1997 |
| JP | 10-65552 | 4/1998 |
| JP | 10-126279 | 5/1998 |
| JP | 11-55129 | 2/1999 |
| JP | 11-232039 | 8/1999 |
| JP | 11-338723 | 12/1999 |
| JP | 2000-010807 | 1/2000 |
| JP | 2000-106530 | 4/2000 |
| JP | 2000-114983 | 4/2000 |
| WO | WO 99/48097 | 9/1999 |

* cited by examiner

|  | COL181 | COL180 | : | COL2 | COL1 | COL0 |
|---|---|---|---|---|---|---|
| ROW0 | y181 | y180 | : | y2 | y1 | y0 |
| ROW1 | y181 | y180 | : | y2 | y1 | y0 |
| ROW2 | y181 | y180 | : | y2 | y1 | y0 |
| : | : | : | : | : | : | : |
| ROW4 | y181 | y180 | : | y2 | y1 | y0 |
| ROW207 | y181 | y180 | : | y2 | y1 | y0 |

FIG.37 PRIOR ART

|      | COL0 | COL1 | COL2 | COL3 | COL4 | COL5 | COL6 | COL7 | COL8 | COL9 |
|------|------|------|------|------|------|------|------|------|------|------|
| ROW0 | → | → | → | → | → | → | → | → | → | → |
| ROW1 | ← | → | → |   |   |   |   |   |   |   |
| ROW2 |   |   |   |   |   |   |   |   |   |   |
| ROW3 |   |   |   |   |   |   |   |   |   |   |

FIG.38 PRIOR ART

|      | COL0 | COL1 | COL2 | COL3 | COL4 | COL5 | COL6 | COL7 | COL8 | COL9 |
|------|------|------|------|------|------|------|------|------|------|------|
| ROW0 | ↓ | ↑↓ | ↑↓ | ↑↓ | ↑↓ | ↑ |   |   |   |   |
| ROW1 | ↓ | ↓ | ↓ | ↓ | ↓ |   |   |   |   |   |
| ROW2 | ↓ | ↓ | ↓ | ↓ | ↓ |   |   |   |   |   |
| ROW3 | ↓ | ↓ | ↓ | ↓ | ↓ |   |   |   |   |   |

|  | COL0 | COL1 | COL2 | COL3 | COL4 | COL5 | COL6 | COL7 | COL8 | COL9 |
|---|---|---|---|---|---|---|---|---|---|---|
| ROW0 | | | | | | | | | | |
| ROW1 | | | | | | | | | | |
| ROW2 | | | | | | | | | | |
| ROW3 | | | | | | | | | | |

ERROR-CORRECTING DEVICE AND DECODER ENABLING FAST ERROR CORRECTION WITH REDUCED CIRCUIT SCALE

BACKGROUND OF THE INVENTION

1. Field of the Invention

The present invention relates to data transfer systems. In particular, the invention relates to an error-correcting method, an error-checking device, a decoding method and a decoder applied to a system for error correction and check of a multidimensional code such as a product code.

2. Description of the Background Art

Image information and the like containing a large amount of information are now recorded, reproduced and transmitted by digital signals in most instances. Accordingly, there arises an increased importance of error correction and error check in order to enhance the reliability of recorded information or transmitted information. Especially real-time recording and reproduction requires high-speed processing for correcting and checking any error in such a large amount of information.

A conventional data transfer system, for example, a recordable and reproducible magneto-optical disk device adds an error-correcting code formed of a product code to received data and stores the data on a recording medium.

The stored data is thereafter called by an error-correcting device as required and any error is corrected. Error check is then carried out by an error detecting code (hereinafter referred to as EDC) to confirm absence of errors, and the data is output to the outside.

In a reproduction-only optical disk device, stored data is similarly called as required by an error-correcting device where any error is corrected. Error check is thereafter performed by an error detecting code to confirm absence of errors. The data is then output to the outside.

Problems of Error Correction and Error Check

According to a conventional error-correcting method, data read from a DVD (Digital Versatile Disk) for example is temporarily stored in a buffer of an external semiconductor memory device such as a Synchronous Dynamic Random Access Memory (SDRAM). The data is then called by an error-correcting device to correct any error.

The DVD employs for example a product code constituted of data arranged in a rectangular shape to which error-correcting codes are added in two directions, i.e., the vertical direction (PO direction) and the horizontal direction (PI direction).

FIG. 32 shows a format of a conventional error-correcting product code for the DVD.

Here, one block refers to data formed of information data arranged in two-dimension in 172 bytes×192 rows to which horizontal 10-byte parity PI (error-correcting inter code) and vertical 16-byte parity PO (error-correcting outer code) are added. The horizontal and vertical directions are also called PI and PO directions respectively in FIG. 32.

FIG. 33 shows a relation between the error-correcting product code (error-correcting inter code and error-correcting outer code) in FIG. 32 and error detecting codes (EDC).

One block mentioned above is divided into sixteen sectors each consisting of data arrangement in 172 bytes×12 rows. One sector includes a 4-byte EDC at its end.

FIG. 34 shows data arrangement in one sector containing the error detecting code. The bits are numbered in descending order from the leading bit.

The one-sector data are arranged as data from bit data b16511 to bit data b0 and bit data b31 to b0 correspond to the EDC.

FIG. 35 is a schematic block diagram illustrating a first conventional structure for error correction and error check applied to the DVD data structured as discussed above.

Referring to FIG. 35, a basic decoding pattern follows the procedure for example described below.

1. An input signal is stored in a data buffer (SDRAM: Synchronous Dynamic Random Access Memory) 3024 via a data bus 3021, and a PI direction error-correcting circuit 3020 reads data in PI direction from data buffer 3024 to calculate a syndrome.
2. PI direction error-correcting circuit 3020 detects an error amount and an error position from the value of the PI direction syndrome to correct any error in the data stored in data buffer 3024.
3. A PO direction error-correcting circuit 3022 reads data in PO direction from data buffer 3024 to calculate a syndrome.
4. PO direction error-correcting circuit 3022 calculates an error amount and an error position from the value of the PO direction syndrome to correct any error in the data stored in data buffer 3024.

These processes are repeated to correct errors.

5. After the error correction is completed, an error-checking circuit 3023 reads the data from data buffer 3024 to confirm absence of errors by using error detecting codes.

A problem here in these processes is that the error correction and check takes a long time since, after error correction, data buffer (SDRAM) 3024 is accessed again for error check.

For example, in the structure shown in FIG. 35, only after error correction of data read from data buffer 3024 is completed, error-checking circuit 3023 reads the data from data buffer 3024. Relatively time-consuming data reading and writing from and to data buffer 3024 is carried out frequently, resulting in a longer time taken by the processes.

Japanese Patent Laying-Open No. 11-55129 for example discloses a method to overcome this problem.

FIG. 36 is a schematic block diagram illustrating a second conventional structure for error correction and error check disclosed in Japanese Patent Laying-Open No. 11-55129.

The error-correcting and checking device shown in FIG. 36 is structured to use a data bus shared by an error-correcting circuit and an error-checking circuit.

FIGS. 37, 38, 39 and 40 respectively show first to fourth models illustrating a general process followed by the error-correcting and checking device shown in FIG. 36.

In FIGS. 37 and 38, data to be error-checked are shown in a decreased number, i.e., 40 data (10 columns×4 rows) for the purpose of simplifying illustration.

Error check by means of the error-correcting and checking device shown in FIG. 36 is carried out in two stages.

In the first stage, data is read from a buffer 3034 for error correction in PI direction for example, and the data is transferred in the data arrangement order as shown in FIG. 37 to a DATA syndrome generating circuit 3036 to calculate a DATA syndrome.

The calculated DATA syndrome is stored in a memory device 3032.

In the first stage, in addition to the DATA syndrome calculation, an ERROR syndrome is calculated by using an error amount detected by a PI direction error-correcting circuit 3030 according to the data arrangement order shown in FIG. 37.

In the second stage, an error amount detected by a PO direction error-correcting circuit 3032 is further used to perform subsequent ERROR syndrome calculation according to the data arrangement order shown in FIG. 38.

Referring to FIG. 39, an exclusive-OR operation unit 3035 calculates the exclusive-OR of the two syndromes, DATA syndrome and ERROR syndrome, so as to determine a final check syndrome. Based on the check syndrome, a decision circuit 3031 judges results of error check.

The second-time data reading from data buffer 3034 for generating a check syndrome is thus unnecessary so that fast and parallel error correction and check processes are possible.

Further, in the calculation of the error-correction syndrome by PO direction error-correcting circuit 3032, if codewords in column 3 (COL3) have no error, subsequent detection of an error amount and an error position is skipped. According to this, in the ERROR syndrome calculation, the speed of operation is enhanced by using offset values for the codewords without error as shown in FIG. 40.

However, this offset calculation requires, in ERROR syndrome generating circuit 3038, an operating circuit having at least three paths for syndrome calculation corresponding respectively to an operation proceeding through rows one by one in the vertical direction, an operation through columns from one column to the next column, and an operation through columns at every other columns. A problem then arises of increase in the circuit scale.

Problems of Syndrome Calculation

Other problems of syndrome calculation in the error-correcting operation are discussed below.

The conventional error-correcting system such as DVD uses a product code as described above having data arranged in the rectangular shape to which error-correcting codes are added in the vertical and horizontal directions.

FIG. 41 is a schematic block diagram showing a structure of a conventional error-correcting device 4000 for the error-correcting calculation as discussed above.

Referring to FIG. 41, in error-correcting device 4000, data read into an external memory 4021 undergoes error correction by an error-correcting circuit 4022.

Error-correcting circuit 4022 reads the data from external memory 4021 for correcting any error and then the data with its error corrected is written into external memory 4021 again.

After all errors are corrected, a descramble operation is performed by a descrambling circuit 4023.

Descrambling circuit 4023 reads the data from external memory 4021 to descramble the data and the descrambled data is written into external memory 4021 again.

Specifically, a basic decoding pattern follows the procedure below.

1. PI direction data is read from external memory (e.g. SDRAM) 4021 to calculate a syndrome.
2. An error amount and an error position are calculated from the syndrome value to correct any error on external memory 4021.
3. PO direction data is read from external memory 4021 to calculate a syndrome.
4. An error amount and an error position are calculated from the syndrome value to correct any error in data stored on external memory 4021.

These processes are repeated to accomplish error correction.

5. After this error correction, data ($D'_k$: data produced by scrambling data $D_k$ is hereinafter represented by $D'_k$) is read from external memory 4021 again to descramble the data by descrambling circuit 4023 according to the following expression.

$$D_k = D'_k \text{ Exor } S_k (k=0-2047) \tag{A1}$$

Here, S0 is supplied as an initial value by a table provided in advance. Further, data $S_k$ derived from the following expressions is used to descramble data $D'_k$.

$$T_0 = \{7'd0, S0\} \tag{A2}$$

$$T_{n+1}[14:0] = \{T_n[13:1], (T_n[14] \text{ Exor } T_n[10])\} \tag{A3}$$

$$(n=0-8\times2047)$$

$$S_k = T_{8k}[7:0] \tag{A4}$$

In expression (A2), "7'd0" means there are seven data "0" that are lined. Expression (A2) represents that seven "0" and S0 as the initial value are connected to form data $T_0$ of 15 bits from the 14th bit to the 0th bit.

Expression (A3) represents that data $T_n$ [13:0] from the 13th bit to the 0th bit in data $T_n$ [14:0] generated in the n-th step is lined next to the exclusive-OR of the 14th bit data $T_n$ [14] and the tenth bit data $T_n$ [10] in data $T_n$ [14:0] to generate in the (n+1)-th step data $T_{n+1}$ [14:0] formed of 15-bit data from the 14th bit to the 0th bit.

Expression (A4) represents that in the data $T_n$ [14:0] thus generated the data of the 7th bit to the 0th bit in the data $T_{8k}$ [14:0] formed in the 8-multiple-th step corresponds to data $S_k$.

The access to the external memory is enormous in the circuit structure shown in FIG. 41, which consumes a longer time and accordingly makes it difficult to enhance the speed of error correction and descrambling.

A conventional art for overcoming such a problem is described below.

FIG. 42 is a schematic block diagram showing a structure of an error-correcting device 5000 as such a conventional art that is disclosed in Japanese Patent Laying-Open No. 10-126279.

Referring to FIG. 42, for data read into an external memory 5031, syndrome calculation is performed by a syndrome operating circuit 5032 as a part of error-correcting calculation.

At the same time, the read data is sent to a descrambling circuit 5033 to be descrambled. The descrambled data is written into external memory 5031.

A syndrome determined by the syndrome calculation is supplied to an error amount calculating unit 5034 to calculate an error amount and an error position. Error amount calculating unit 5034 reads data corresponding to the error position from external memory 5031, corrects any error, and the data is written into external memory 5031 again.

Although this method reduces the access to the external memory approximately by two thirds, this reduction is not enough.

Further, the method considers nothing about the repeating processes specific to the product code. Therefore, efficient error correction/descrambling for the actual DVD and the like is difficult to achieve.

Specifically, error correction of the product code is generally performed in each of the directions (PO and PI directions) repeatedly. Here, syndrome calculation for performing error correction uses data before descrambling. If descrambling as shown in FIG. 42 is employed, data stored in external memory 5031 must be scrambled again in order to perform subsequent error correction repeatedly, resulting in increase in the calculation amount and circuit scale.

Problems of Euclidean Calculation

Problems of Euclidean calculation in the error-correcting operation are described below.

FIG. 43 is a schematic block diagram showing a structure of an error-correcting device 6000 in a conventional data transmission system, for example, a recordable and reproducible magneto-optical disk device.

Referring to FIG. 43, the data transmission system adds an error-correcting code formed of a product code to data to be recorded and stores the data on a recording medium. The data stored on the recording medium is then supplied as received data to error-correcting device 6000 as required and thereafter output to the outside after error correction.

Such a structure is employed not only in the recordable and reproducible magneto-optical disk device but also in a reproduction only optical disk device.

An error-correcting process is discussed below carried out in a DVD for example. The DVD employs error correction by a Reed-Solomon code (RS code) exhibiting a high correcting ability.

Received data called for transmission from a disk to error-correcting device 6000 is temporarily stored in a semiconductor memory device, specifically memory 6010 such as an SRAM (Static Random Access Memory). The data in memory 6010 is thereafter called for the error-correcting process in which the following procedure steps are successively followed.

The five steps below are generally employed for error correction using the Reed-Solomon code.

1. A syndrome calculating circuit 6020 calculates a syndrome from the received data.
2. A Euclidean calculating circuit 6030 determines an error locator polynomial and an error evaluator polynomial from that syndrome.
3. A Chien search circuit 6040 determines an error position from the error locator polynomial.
4. Chien search circuit 6040 determines an error amount from the error locator polynomial, error evaluator polynomial and error position.
5. An error-correcting circuit 6050 corrects any error using the error amount and position.

Regarding the error correction by the Reed-Solomon code having a high correction ability, a Euclidean method derived from the Euclidean algorithm is known that is used in step 2 above for determining the error locator polynomial and the error evaluator polynomial from the syndrome.

This Euclidean method is now described in detail below.

A reception polynomial r (x) of the received data described above is represented here by the expression below:

$$r(x) = r_{n-1}x^{n-1} + r_{n-2}x^{n-2} + \ldots + r_1 x + r_0 \tag{B1}$$

where n is a code length.

A syndrome polynomial determined by syndrome calculation is represented as below.

$$S(x) = S_{2t-1}x^{2t-1} + S_{2t-2}x^{2t-2} + \ldots + S_1 x + S_0 \tag{B2}$$

$$S_j = \sum_i r_i \alpha^{j \times i} \quad (i = 0, \ldots, n-1, \ j = 0, \ldots, 2t-1) \tag{B3}$$

In the expressions above, t denotes the number of correctable errors and $\alpha$ denotes the root of a primitive polynomial on GF (P). With respect to GF ($2^8$), roots in a root set of the primitive polynomial are expressed by $0, 1, \alpha^1, \alpha^2, \alpha^6$.

Error locator polynomial $\sigma$ (x) is defined here by the following expression:

$$\sigma(x) = \prod_{i \in E}(x - \alpha^{-li}) \tag{B4}$$

where E denotes a set of errors, i denotes an element of set E, and li denotes an error position.

The syndrome polynomial and error locator polynomial $\sigma$ (x) have the relation determined as shown below.

$$\sigma(x) \cdot S(x) \equiv \omega(x) \bmod x^{2t} \tag{B5}$$

In expression (B5), error evaluator polynomial $\omega$ (x) is a polynomial as written below.

$$\omega(x) = \sum_{i \in E} e_i \cdot \alpha^{-li} \prod_{\substack{j \neq i \\ j \in E}}(x - \alpha^{-lj}) \tag{B6}$$

Similarly, j denotes an element of set E and lj denotes an error position.

Alternatively, expression (B5) is written by an equivalent expression below.

$$\phi(x) \cdot x^{2t} + \sigma(x) \cdot S(x) = \omega(x) \tag{B7}$$

Expression $\phi$ (x) is represented as follows.

$$\phi(x) = \sum_{i \in E} e_i \cdot \alpha^{li \cdot 2t} \prod_{\substack{j \neq i \\ j \in E}}(x - \alpha^{-lj}) \tag{B8}$$

Euclidean decoding algorithm is a method of determining error locator polynomial $\sigma$ (x) and error evaluator polynomial $\omega$ (x) based on relation (B7) above.

Specifically, when the number of errors is equal to t or less, error locator polynomial $\sigma$ (x) and error evaluator polynomial $\omega$ (x) can uniquely be determined from expression (B7) by Euclidean algorithm to determine the greatest common divisor polynomial of $x^{2t}$ and S (x).

Brief description is given below concerning a procedure of determining error locator polynomial $\sigma$ (x) and error evaluator polynomial $\omega$ (x) from expression (B7).

According to this procedure, polynomial $\sigma$ (x) with degree t or lower and polynomial $\omega$ (x) with degree (t−1) or lower, which satisfy expression (B7) and are prime to each other, are determined.

Recurrence formula of polynomials $Z_i$ (x) is represented as shown below.

$$Z_{-1}(x) = x^{2t}, \ Z_0(x) = S(x) \tag{9}$$

Based on expression (B9), polynomials $X_i$ (x), $Y_i$ (x) and $Z_i$ (x) satisfying expression (B10) below are successively generated and this operation is repeated until $Y_i$ (x) has degree t or lower and $Z_i$ (x) has degree (t−1) or lower.

$$X_i(x) Z_{-1}(x) + Y_i(x) Z_0(x) = Z_i(x) \tag{B10}$$

It can be proved that polynomials $Y_i(x)$ and $Z_i(x)$ thus generated correspond to error locator polynomial $\sigma(x)$ and error evaluator polynomial $\omega(x)$, except for multiples of a constant. The following explanation assumes that such a correspondence is established.

Respective initial values of $X_i(x)$ and $Y_i(x)$ are expressed as shown below.

$$X_{-1}(x)=1, X_0(x)=0 \tag{B11}$$

$$Y_{-1}(x)=0, Y_0(x)=1 \tag{B12}$$

For i=−1, 0, it is apparent that expression (B10) is satisfied.

However, since $Z_{-1}(x)=x^{2t}$ is a polynomial of degree t or higher and the degree of S (x) is at least t as long as the number of errors is t or less, $Z_0(x)=S(x)$ is a polynomial of degree t or higher. Therefore, $Z_{-1}(x)$ and $Z_0(x)$ are never error evaluator polynomial $\omega(x)$.

In the following process, the degree of $Z_i(x)$ is decreased with expression (B10) being satisfied.

It is assumed here that following expressions (B13) and (B14) are satisfied for i ($\geq 1$).

$$X_{i-2}(x)Z_{-1}(x)+Y_{i-2}(x)Z_0(x)=Z_{i-2}(x) \tag{B13}$$

$$X_{i-1}(x)Z_{-1}(x)+Y_{i-1}(x)Z_0(x)=Z_{i-1}(x) \tag{B14}$$

$Z_{i-1}(x)$ is lower in degree than $Z_{i-2}(x)$.

The degree can be lowered based on expressions (B13) and (B14). $Z_{i-2}(x)$ is divided by $Z_{i-1}(x)$ and the resultant quotient is here denoted by $Q_i(x)$. Members on both sides of expression (B14) are multiplied by $Q_i(x)$, and resultant products are subtracted from both members of expression (B13).

This corresponds to the following expressions in which $X_i(x)$, $Y_i(x)$ and $Z_i(x)$ are represented as shown below based on expressions (B13) and (B14).

$$Z_i(x)=Z_{i-2}(x)-Q_i(x)Z_{i-1}(x) \tag{B15}$$

$$X_i(x)=X_{i-2}(x)-Q_i(x)X_{i-1}(x) \tag{B16}$$

$$Y_i(x)=Y_{i-2}(x)-Q_i(x)Y_{i-1}(x) \tag{B17}$$

If expressions (B13) and (B14) are satisfied, then expression (B10) is satisfied for polynomials $X_i(x)$, $Y_i(x)$ and $Z_i(x)$ that satisfy expressions (B15) to (B17).

$Z_i(x)$ corresponds to the remainder determined by dividing $Z_{i-2}(x)$ by $Z_{i-1}(x)$, therefore, the degree thereof is lower than that of $Z_{i-1}(x)$. The operation of expression (B15) is exactly the process of Euclidean algorithm to determine the greatest common divisor of $x^{2t}$ and S (x) in expression (B9).

FIG. 44 is a flowchart illustrating a flow of process for determining error locator polynomial $\sigma(x)$ and error evaluator polynomial $\omega(x)$ by such Euclidean algorithm.

FIG. 44 shows a decoding algorithm for (182, 172, 11) RS code for example.

The Euclidean algorithm is applied for determining the greatest common divisor of expression $x^{2t} \times x^{10}$ and syndrome polynomial S (x) below.

$$S(x)=S_9x^9+S_8x^8+S_7x^7+S_6x^6+S_5x^5+S_4x^4+S_3x^3+S_2x^2+S_1x^1+S_0 \tag{B18}$$

Referring to FIG. 44, calculation starts for determining error locator polynomial $\sigma(x)$ and error evaluator polynomial $\omega(x)$ by Euclidean algorithm (step S10) and an initial value is set.

Variable $R0_i$ (i=0, 1, . . . , 10) is set as shown below corresponding to coefficient of $x^{10}$.

$R0_{10}=1$, $R0_i=0$ (i=0, 1, . . . , 9)

Variable $R1_i$ (i=0, 1, . . . , 9) is set as below corresponding to coefficient of S (x).

$R1_i=S_i$ (i=0, 1, . . . , 9)

Further, variables $B0_i$, $B1_i$ (i=0, 1, . . . , 5) are set as below corresponding to respective coefficients of $Y_{-1}(x)$ and $Y_0(x)$.

$B0_i=0$ (i=0, 1, . . . , 5)
$B1_i=0$ (i=1, . . . , 5), $B1_0=1$

The initial setting is now completed (step S12).

The degree of a polynomial having coefficient $R0_i$ is determined as N0 and the highest-degree coefficient of the polynomial is determined as Q0. Further, the degree of a polynomial having coefficient $R1_i$ is determined as N1 and the highest-degree coefficient of the polynomial is determined as Q1 (step S14).

N1 and 0 are compared (step S16). If N1=0, this process ends (step S30). If N1 is not equal to 0, the process proceeds to the next step.

After DN=N0−N1 operation, flag variable FN is set to 1 if DN<0 and to 0 if DN$\geq$0 (step S18).

Flag variable FN and 0 are compared and the process proceeds to step S22 if FN=0 and to step S28 if FN=1 (step S20).

In step S20, the following operation is performed if FN=0.

$R1_i=Q0*R1_{(i-DN)}$ (i=0, 1, . . . , 9)
$R0_i=Q1*R0_i$ (i=0, 1, . . . , 9)
$R1_{10}=0$
$B1_i=Q0*B1_{(i-DN)}$ (i=0, 1, . . . , 5)
$B0_i=Q1*B0_i$ (i=0, 1, . . . , 5)

Operation * represents multiplication on an element on a Galois field. If (i−DN) is negative, 0 is assigned to $R1_i$ and $B1_i$ in the left side member (step S22).

The following operation is further performed on coefficients.

$R0_i=R0_i$ exor $R1_i$ (i=0, 1, . . . , 9)
$B0_i=B0_i$ exor $B1_i$ (i=0, 1, . . . , 5)

Operation exor represents exclusive-OR operation (step S24).

Decision is made on whether the degree of polynomial R0x expressed by variable $R0_i$ is equal to t (5 in this example) or lower (step S26). If the degree of polynomial R0x is equal to or lower than t, this process ends (step S30). If not, the process proceeds to step S28.

If FN=0 is not satisfied in step S20 or the degree of polynomial R0x is greater than t in step S26, values of variables $R0_i$ and $R1_i$ are exchanged with each other and values of variables $B0_i$ and $B1_i$ are exchanged with each other. After such exchange, the process returns to step S14 (step S28).

Calculation by Euclidean algorithm by another Reed-Solomon code or BCH code (Bose-Chaudhuri-Hpcquenghem code) in more general case is similarly done.

This calculation requires a multiplier of a Galois field dedicated to operation "*".

However, a problem here is the need of many multipliers for fast processing. In other words, although the greater number of multipliers increase the circuit size, an enhanced processing rate is achieved.

Reduction of the times multiplication is performed is also necessary, since power consumption increases if multiplication is carried out many times.

As an example, when the conventional circuit structure for implementing the Euclidean method discussed above employs one multiplier and the algorithm shown in FIG. 44 is followed therein, the circuit scale and throughput are estimated as below.

Number of multipliers: 1
Number of steps required for multiplication: 2×2t×2t
Number of times multiplication is performed: 2×2t×2t A problem arises that, since the number of steps is proportional to the square of t, an increased t makes it impossible to enhance the processing rate.

Japanese Patent Laying-Open No. 1-276825 discloses a circuit structure for achieving fast calculation for such Euclidean method.

According to Japanese Patent Laying-Open No. 1-276825, speed enhancement of Euclidean calculation is accomplished by providing one multiplier per register.

For example, when the number of correctable errors is t, the minimum number of necessary registers is (2t+1). The circuit scale and throughput of the circuit structure disclosed in Japanese Patent Laying-Open No. 1-276825 are estimated as follows.

Number of multipliers: 2×(2t+1)
Number of steps required for multiplication: 2t
Number of times multiplication is performed: 2×2t×2t Although speed enhancement is accomplished here, numerous multipliers are used and accordingly the circuit scale cannot be reduced.

Japanese Patent Laying-Open No. 10-65552 for example discloses another circuit structure for speedily performing such Euclidean calculation.

According to Japanese patent Laying-Open No. 10-65552, four multipliers are provided for example for improving the calculation speed in the Euclidean method.

For example, when the number of correctable errors is t, the circuit scale and throughput of the circuit structure disclosed in Japanese Patent Laying-Open No. 10-65552 are estimated as follows.

Number of multipliers: 4
Number of steps required for multiplication: 2t×2t
Number of times multiplication is performed: 2×2t×2t Here again, since the number of steps is proportional to the square of t, the processing rate cannot be enhanced if the value of t increases.

In addition, power consumption is difficult to reduce in the conventional circuit structures discussed above due to the number of multiplying operations, i.e., ×2t×2t.

SUMMARY OF THE INVENTION

One object of the present invention is to provide an error-correcting device to achieve reduction in the time required for error check by shortening the access time to a memory device and performing the error check in parallel with error correction without increasing the circuit scale.

Another object of the invention is to provide a decoder capable of speedily perform error correction and descrambling of a product code.

Still another object of the invention is to provide an error-correcting device and an error-correcting method to achieve reduction in the time required for Euclidean processing without increase in the circuit scale resulting from an increased number of multipliers.

A further object of the invention is to provide an error-correcting device and an error-correcting method to achieve reduction in the power consumption of the circuit by reducing the number of multiplying operations in Euclidean processing.

According to one aspect of the invention, the present invention is, in brief, an error-correcting device including an error-correction operating unit, a first storage element and an error-checking unit.

The error-correction operating unit performs error correction on data to be corrected including an error-correcting code. The error-correcting code has a product code enabling error correction in first and second directions of a data block. The error-correction operating unit includes first and second error-correcting units. The first error-correcting unit is used for correction in the first direction of the product code. The second error-correcting unit is used for correction in the second direction.

The first storage element can store data to be corrected.

The error-checking unit performs error check by error detecting codes for confirming the correction by the error-correction operating unit. The error detecting codes are provided successively in the first direction of the data block. The error-checking unit includes a first logic operation unit and first and second direction error-checking units. The first logic operation unit uses an error amount detected by the error correction in the first direction and data stored in the first storage element to calculate a first error check result. The first-direction error-checking unit according to the first error check result performs error check after the error correction in the first direction. The second direction error-checking unit uses an error amount detected in the error correction in the second direction, calculates a second error check result and performs logical operation on the first and second error check results to perform error check after the error correction in the second direction.

According to another aspect of the invention, an error-correcting method includes the steps of: receiving data to be corrected including an error-correcting code having a product code enabling error correction in first and second directions of a data block to perform error correction in the first direction; receiving the data to be corrected to perform error correction in the second direction, using successively the data before error correction and an error amount detected by the error correction in the first direction to calculate a first error check result; performing error check after the error correction in the first direction according to the first error check result; and using an error amount detected in the error correction in the second direction, calculating a second error check result and performing a logical operation on the first and second error check results to perform error check after the error correction in the second direction.

According to still another aspect of the invention, a decoder for data including an error-correcting product code includes a control unit, a first storage element, an error-correcting unit, and a descrambling unit.

The control unit controls an operation of the decoder. The first storage element temporarily stores transmitted data. The error-correcting unit performs error correction on the data read into the first storage element. The descrambling unit descrambles the data stored in the first storage element. The control unit causes the error-correcting unit to perform error correction on the data read into the first storage element to transfer the error-corrected data to the descrambling unit where the error-corrected data is descrambled and thereafter written back into the first storage element.

According to a further aspect of the invention, a decoder includes a control unit, a first storage element, a first error-correcting unit, a descrambling unit and a second error-correcting unit.

The control unit controls an operation of the decoder. The first storage element temporarily stores transferred data including an error-correcting product code. The first error-correcting unit performs error correction in a first-direction on data read from the first storage element. The descrambling unit descrambles the data. The second error-correcting unit receives a first direction error-correction result to perform error correction in the second direction.

The controller causes, i) after error correction in the first direction on the data read from the first storage element, the descrambling unit to descramble the data having been subjected to the first direction error correction, ii) the descrambled data to be written back into the first storage element, and iii) in parallel with descrambling, the second error-correcting unit to perform error correction on the data stored in the first storage element to be written back into the first storage element.

According to a further aspect of the invention, a Euclidean calculating unit includes a first storage unit, a second storage unit, a control unit, a multiplier, a selector and a logical operation unit.

The first storage unit stores, in an operation for serially deriving coefficients of an error evaluator polynomial indicating an error amount of received data, first data corresponding to the coefficients of the error evaluator polynomial and the first storage unit can shift the first data. The second storage unit stores, in an operation for serially deriving coefficients of an error locator polynomial indicating an error position of the received data based on Euclidean algorithm, second data corresponding to the coefficients of the error locator polynomial, and the second storage unit can shift the second data. The control unit performs, based on a syndrome polynomial corresponding to the received data, initial setting of the data stored in the first and second storage units and controls Euclidean algorithm processing. The multiplier is provided commonly to the first and second storage units to perform multiplication on a Galois field based on the Euclidean algorithm. The selector controlled by the control unit controls data transfer between the multiplier and the first and second storage units. The logic operation unit performs a logical operation on the data stored in the first and second storage units based on the Euclidean algorithm.

According to a further aspect of the invention, a Euclidean calculating unit includes a first evaluation polynomial storage unit, a second evaluation polynomial storage unit, a control unit, a storage unit, a multiplier, a logic operation unit and an exchanging unit.

The first evaluation polynomial storage unit stores, for serially performing operations for deriving coefficients of an error evaluator polynomial indicating an error amount of received data based on Euclidean algorithm, first coefficient data in course of the operations. The second evaluation polynomial storage unit stores second coefficient data in course of the operations for deriving the coefficients of the error evaluator polynomial and can shift the second coefficient data. The control unit performs initial setting of the first and second coefficient data based on a syndrome polynomial corresponding to the received data, and controls Euclidean algorithm processing. The storage unit stores a multiplication result of a highest-degree coefficient of a first polynomial corresponding to the first coefficient data and a reciprocal of a highest-degree coefficient of a second polynomial corresponding to the second coefficient data. The multiplier multiplies each of the second coefficient data shifted by a difference between respective degrees of the first and second polynomials by an output of the storage unit, and stores again a multiplication result as the second coefficient data in the second evaluation polynomial storage unit. The logical operation unit performs logical operation on the second coefficient data stored again by the multiplier in the second evaluation polynomial storage unit and the first coefficient data stored in the first evaluation polynomial storage unit, and stores operation result as the first coefficient data in the first evaluation polynomial storage unit. The exchanging unit exchanges the data stored respectively in the first and second evaluation polynomial storage units when the first polynomial corresponding to the first coefficient data has a degree higher than a predetermined degree or the first polynomial has its degree higher than a degree of the second polynomial. The control unit decides that the first polynomial is the error evaluator polynomial when the first polynomial has its degree lower than the predetermined degree.

According to a further aspect of the invention, an error-correcting method includes the steps of determining, based on a syndrome polynomial corresponding to received data, an error locator polynomial indicating an error position and an error evaluator polynomial indicating an error amount by a Euclidean method, and performing error correction on the received data.

The step of determining the error position and error evaluator polynomials includes: a zeroth step of storing in a storage unit first coefficient data $R0_i$ ($0 \leq i \leq 2t$) as $R0_{2t}=1$, $R0_i=0$ ($0 \leq i \leq 2t-1$), second coefficient data $R1_i$ ($0 \leq i \leq 2t-1$) as $R1_i=S_i$ ($0 \leq i \leq 2t-1$), a third coefficient $B0_i$ as $B0_i=0$ ($0 \leq i \leq t$), and a fourth coefficient $B1_i$ as $B1_i=0$ ($0 \leq i \leq t$), $B1_0=1$, a first step of determining degree N0 and highest degree coefficient Q0 of a first polynomial corresponding to the first coefficient data $R0_i$ and determining degree N1 and highest degree coefficient Q1 of a second polynomial corresponding to the second coefficient data $R1_i$ to store $Q=Q0*(1/Q1)$ in the storage unit, a second step of determining a difference DN=N0−N1 between respective degrees of the first and second polynomials, a third step of exchanging, when the difference in degree DN is less than 0, respective values of the first and second coefficient data $R0_i$ and $R1_i$ and exchanging respective values of the third and fourth coefficients $B0_i$ and $B1_i$ to proceed to the first step, a fourth step of storing in the storage unit $R1_i=Q*R1_{(i-DN)}$ ($0 \leq i \leq 2t-1$) when (i−DN) for the second coefficient data is at least 0, and storing the second coefficient data $R1_i$ as 0 when the (i−DN) is negative, a fifth step of storing in the storage unit $B1_i=Q*B1_{(i-DN)}$ ($0 \leq i \leq t$) when (i−DN) for the fourth coefficient is not negative, and storing the fourth coefficient $B1_i$ as 0 when the (i−DN) is negative, a sixth step of performing for the first and second coefficient data an operation $R0_i=R0_i$ exor $R1_i$ ($0 \leq i \leq 2t-1$)

$R1_{2t}=0$ and performing for the third and fourth coefficients an operation $B0_i=B0_i$ exor $B1_i$ ($0 \leq i \leq t$), and a seventh step of exchanging, when the first polynomial represented by the first coefficient data $R0_i$ has its degree higher than t respective values of the first and second coefficient data $R0_i$ and $R1_i$ and exchanging respective values of the first and fourth coefficients $B0_i$ and $B1_i$ and to proceed to the first step.

In the step of performing error correction on received data, when the degree of the first polynomial is equal to or less than t, the error evaluator polynomial is the first polynomial and the error locator polynomial is a third polynomial represented by the third coefficient $B0_i$ to calculate the error position and the error amount.

The present invention has thus an advantage that the time required for error check can be shortened, without increase in the number of storage elements and the circuit scale, by shortening the access time to the storage element and concurrently performing error correction and error check.

Another advantage is that fast data processing is possible by descrambling data with errors corrected that is read from a data buffer thereby reduce accesses to the buffer memory approximately by one-half.

Still another advantage is that effective fast processing is possible by calculating a syndrome of an outer code by data which has not been descrambled and performing error correction by descrambled data to achieve the minimum access to the buffer memory.

A further advantage is that an error-correcting device achieving fast error-correction can be provided, that implements an Euclidean algorithm operation for determining an error locator polynomial and an error amount polynomial without increase in the circuit area and power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 37 shows a first model of a process by an error-correcting and checking device shown in FIG. 36.

FIG. 38 shows a second model of the process by the error-correcting and checking device in FIG. 36.

DESCRIPTION OF THE PREFERRED EMBODIMENTS

First Embodiment

Structure of Disk Reproducing Apparatus 1000

Figure 1:
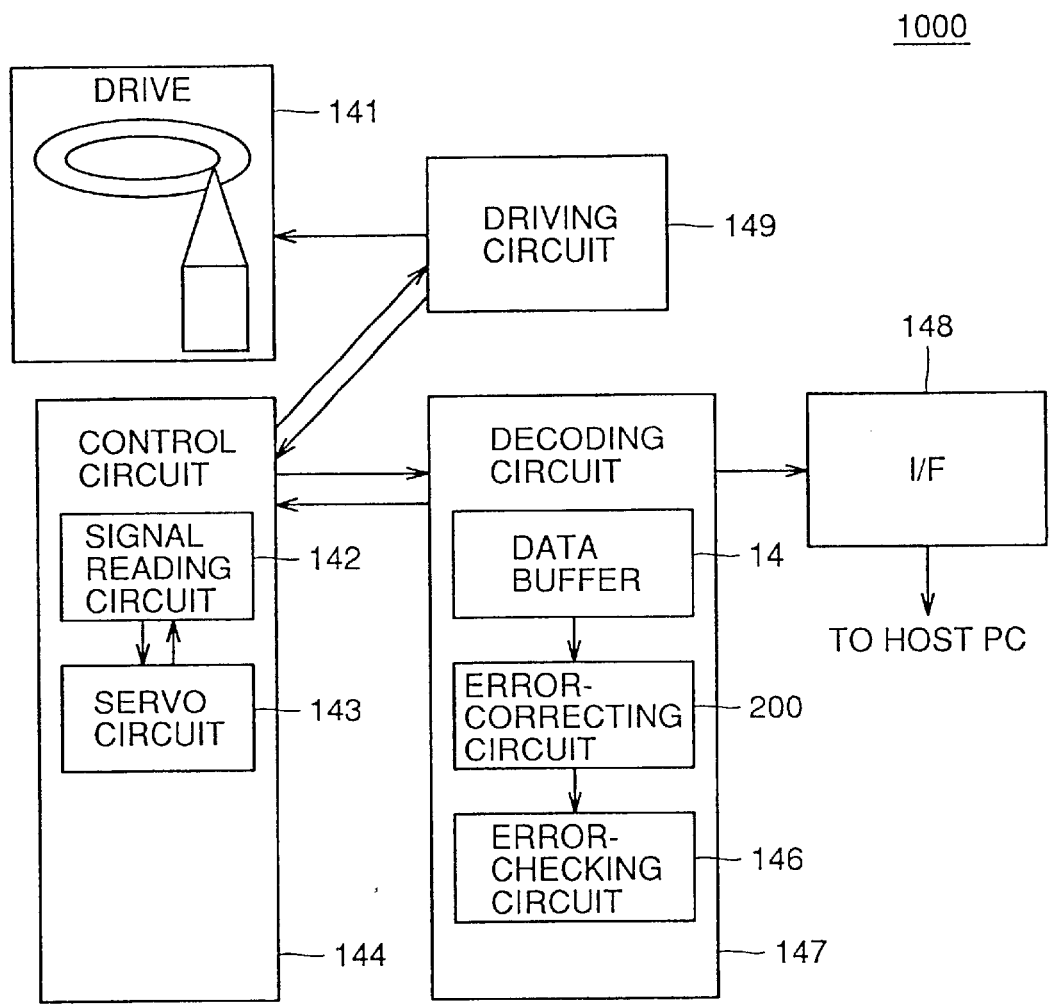
FIG. 1 is a schematic block diagram showing a structure of a disk reproducing apparatus 1000 including an error-correcting and concurrent-checking device according to the present invention.

FIG. 1 is a schematic block diagram showing a structure of a disk reproducing apparatus 1000 including an error-correcting and concurrent-checking device according to the present invention.

Referring to FIG. 1, data read from a disk in a drive 141 driven by a driving circuit 149 is demodulated by a signal reading circuit 142 in a control circuit 144. A servo circuit 143 controls driving circuit 149 based on a signal read by signal reading circuit 142.

The data from the disk is demodulated by signal reading circuit 142 and thereafter transferred to a data buffer 14 in a decoding circuit 147. The transferred data undergoes error correction by an error-correcting circuit 200, and then absence of errors is confirmed by an error-checking circuit 146. The data is thereafter descrambled and transferred to a host PC as information data via an interface 148.

The following discussion is applied to a DVD as one example for explaining error-correcting and concurrent-checking device and method for a product code corresponding to data recorded on the DVD. However, the invention is not limited to this example and is thus applicable to error-correcting and concurrent-checking device and method for a product code having an error-correcting product code arranged in one-block data and predetermined error detecting codes arranged in respective sectors in that one block.

Figure 2:
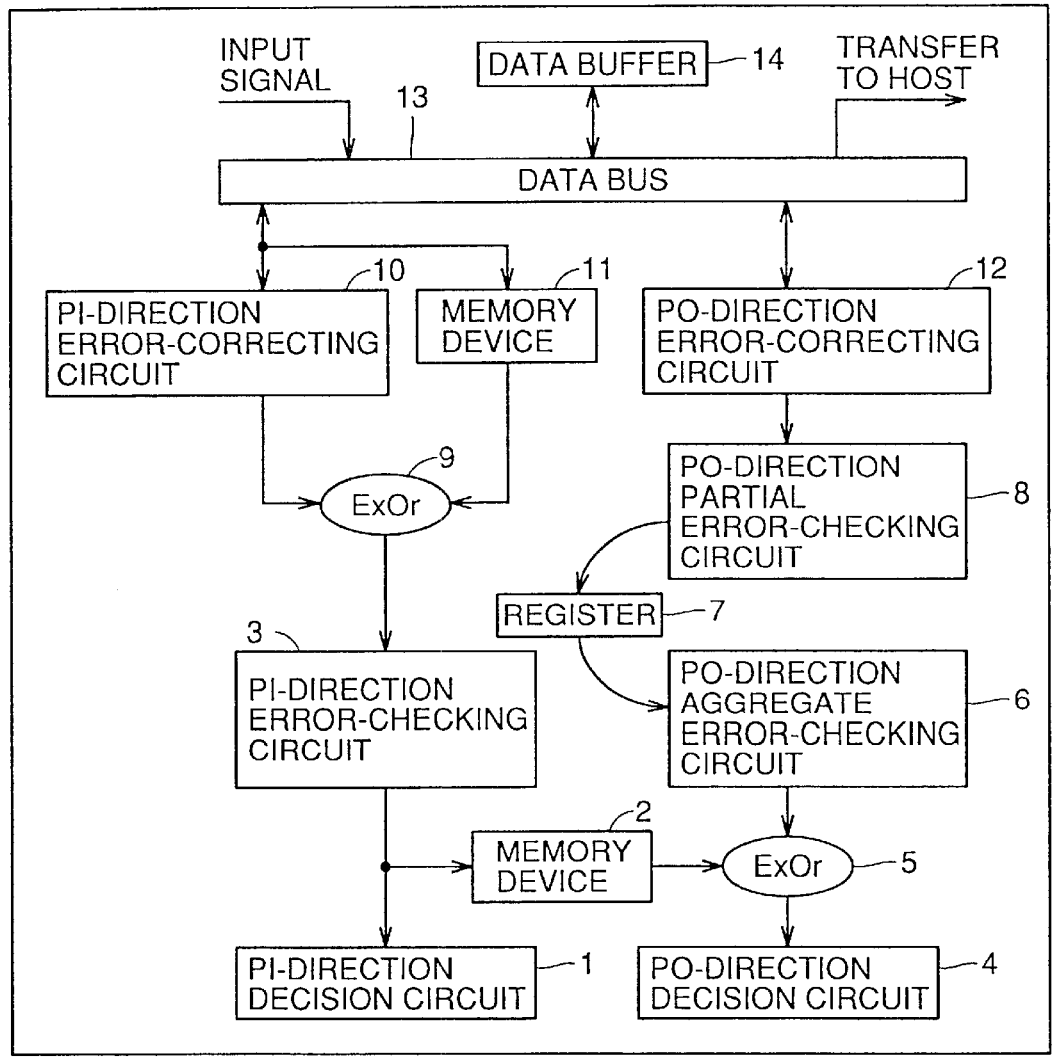
FIG. 2 is a schematic block diagram illustrating a structure of a decoding circuit 147 in FIG. 1.
Figure 3:
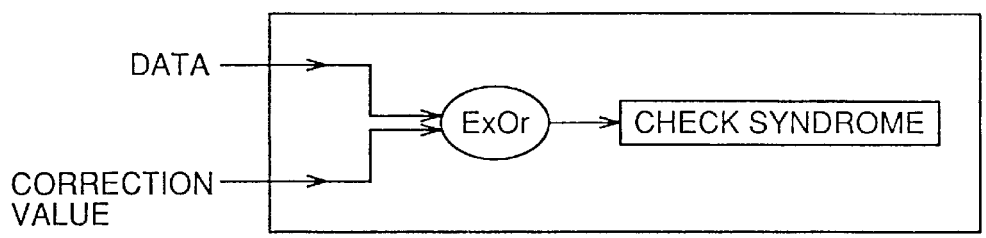
FIG. 3 illustrates an operation of an exclusive-OR circuit 9 in the decoding circuit.

Structure of Error-correcting and Concurrent-checking Device for Product Code FIG. 2 is a schematic block diagram illustrating a structure of decoding circuit 147 in FIG. 1. FIG. 3 illustrates an operation of an exclusive-OR circuit 9 in the decoding circuit.

The structure and operation of decoding circuit 147 is now described in conjunction with FIG. 2.

In a first process step of decoding circuit 147, input data provided from signal reading circuit 142 is transferred via a data bus 13 to a data buffer 14. An SDRAM is employed here for example as data buffer 14.

In a second process step, the data read from data buffer 14 is transferred to an error-correcting circuit 10 with respect to a first direction (PI direction). Concurrently, at least data in one row in a data block is stored in a memory device 11.

In a third step, data are transferred from memory device 11 via exclusive-OR circuit 9 to an error-checking circuit 3 with respect to PI direction. In this data arrangement, regarding data having errors detected by PI-direction error-correcting circuit 10, an error amount is output from PI-direction error-correcting circuit 10. The exclusive-OR of the error amount and remaining data is calculated by exclusive-OR circuit 9. The data arrangement with its errors corrected is thus transferred to a PI-direction error-checking circuit 3.

In a fourth step, check result data calculated by PI-direction error-checking circuit 3 is transferred to a PI-direction decision circuit 1.

The check result here denotes a result of calculation such as {I (x) mod g (x)} Exor EDC and the like as detailed later.

The check result data calculated by PI-direction error-checking circuit 3 is held in memory device 2 for using it in decision on error check results with respect to PO direction discussed below.

In a fifth step, a data arrangement is supplied from data buffer 14 to a PO-direction error-correcting circuit 12 where PO-direction error-correction is performed.

According to this embodiment, in order to improve the processing rate of error correction, PI-direction error-correcting circuit 10 and PO-direction error-correcting circuit 12 are separately provided.

If any error is detected, the error amount is supplied from PO-direction error-correcting circuit 12. If data has no error, the data arrangement with the error amount of 0 is transferred from PO-direction error-correcting circuit 12 to a PO-direction partial error-checking circuit 8.

As detailed later, partial error-checking circuit 8 calculates check results on the basis of each column to store the results in a register 7.

When the PI-direction error-correction is completed in the third step, PO-direction error-correcting circuit 12 can access data buffer 14 via data bus 13. Therefore, the fifth step above may be started when the PI-direction error-correction in the third step is completed.

In a sixth step, the results calculated by PO-direction partial error-checking circuit 8 are called from register 7. Then, aggregation is performed on the PO-direction error check with respect to the row direction by a PO-direction aggregate error-checking circuit 6.

An exclusive-OR circuit 5 determines the exclusive-OR of the results calculated speedily by these circuits and the error-check results in PI direction held by memory device 2, and transfers its result to a PO-direction error decision circuit 4 to make judgement.

In a seventh step, the product code is used as described above for error correction. The information data on data buffer 14 that exhibits no error as a result of checking is transferred to the host PC as required by the host.

The error-checking processes in PI and PO directions respectively are carried out almost concurrently with error-correcting processes in PI and PO directions respectively. Consequently, very fast processing is accomplished. Further, after any of the PI- and PO-direction error-correction, check is completed concurrently. Therefore, when the check results exhibit nothing abnormal after error correction with respect to any of PI and PO directions, the information data can immediately be transferred to the host.

In the discussion above, error correction with respect to PI and error correction with respect to PO are each performed once. However, the present invention is not limited to this and is applicable to a correcting device in which PI-related error correction and PO-related error correction are each repeated at least twice.

Details of Error Calculation Method

Details of an error calculation method are given below according to the invention.

Figure 34:
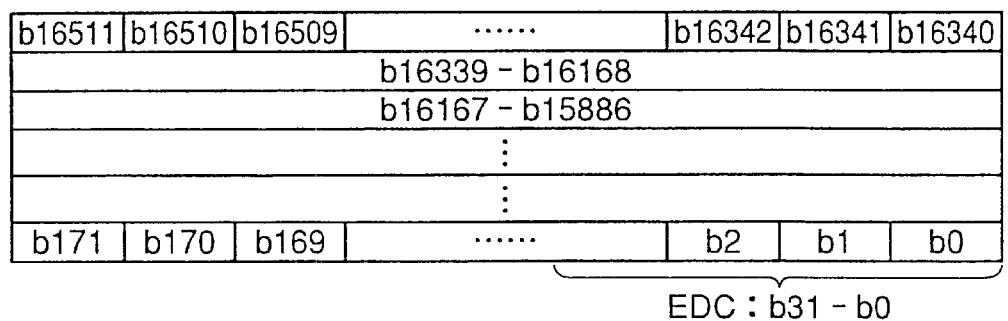
FIG. 34 shows a data arrangement of one sector including error detecting codes, in which the bits are numbered in descending order from the leading bit.
Figure 35:
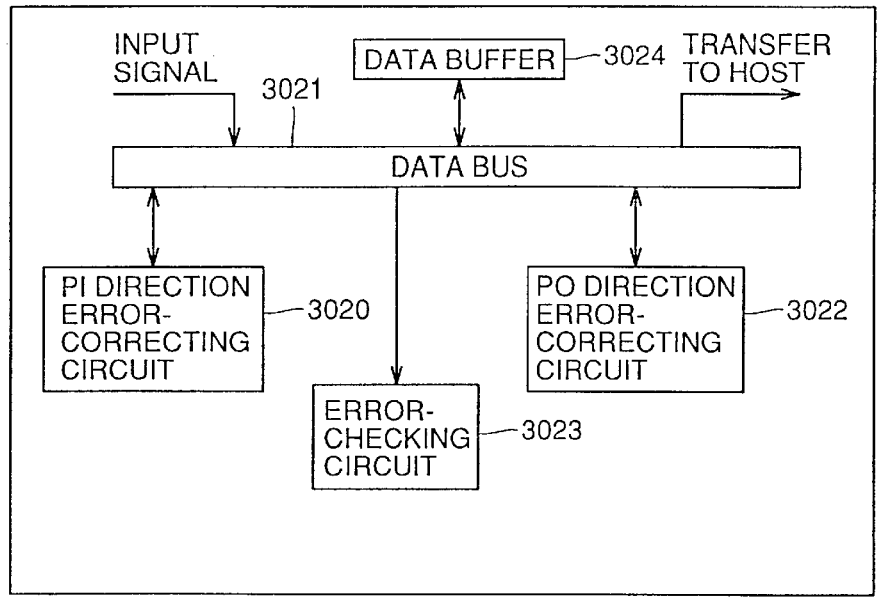
FIG. 35 is a schematic block diagram illustrating a first conventional structure for error correction and check on DVD data.
Figure 36:
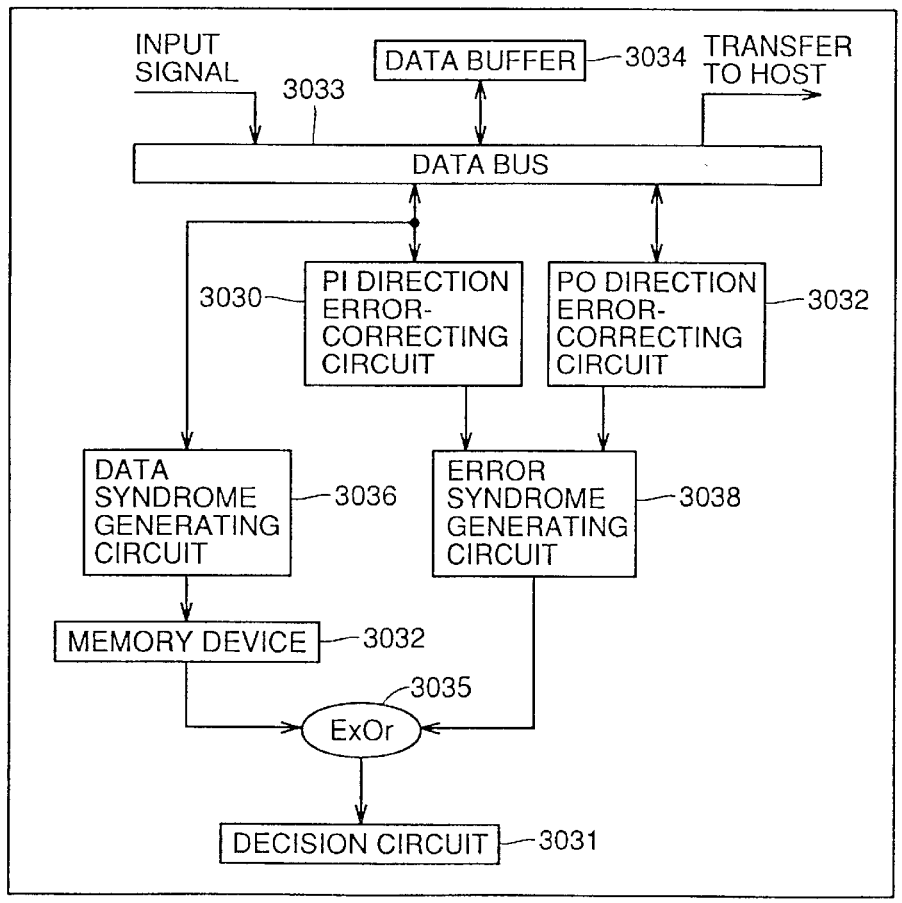
FIG. 36 is a schematic block diagram illustrating a second conventional structure.
Figures 39, 40:
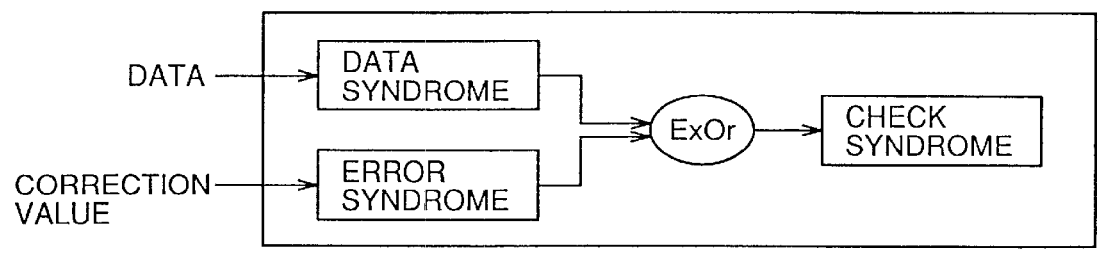
FIG. 39 shows a third model of the process by the error-correcting and checking device in FIG. 36.
FIG. 40 shows a fourth model of the process by the error-correcting and checking device in FIG. 36.
Figure 41:
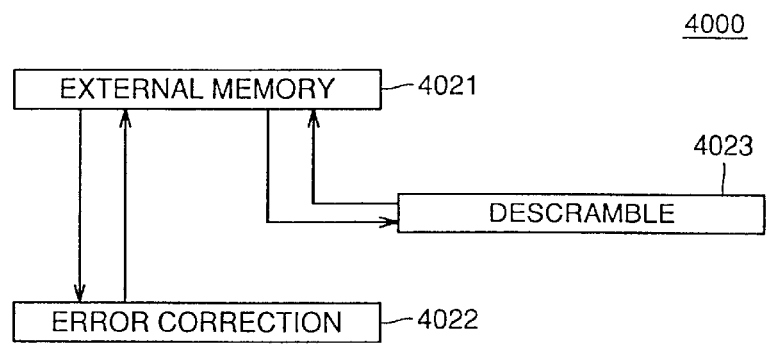
FIG. 41 is a schematic block diagram showing a structure of a conventional error-correcting device 4000.
Figure 42:
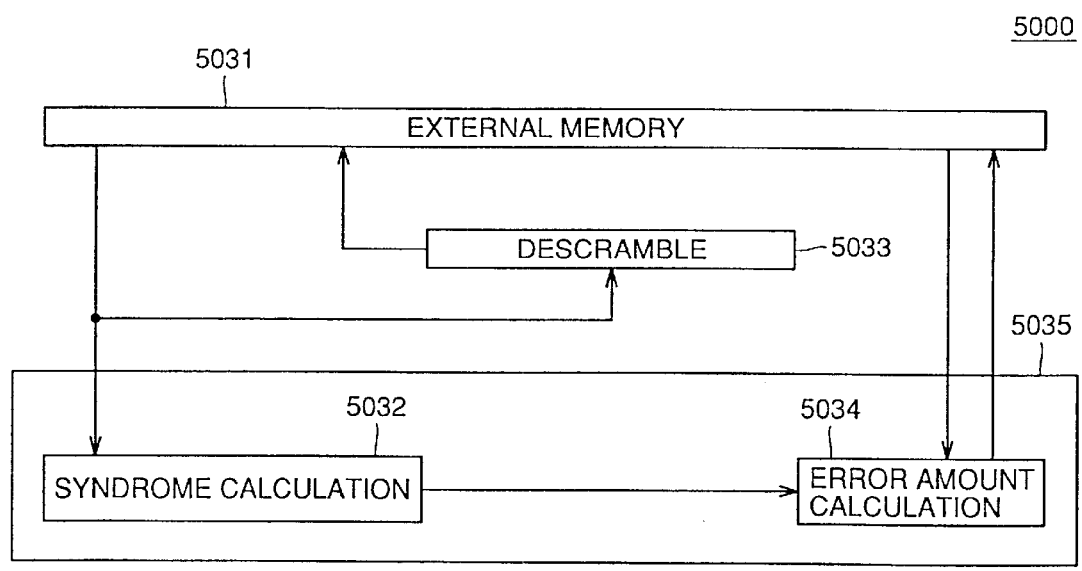
FIG. 42 is a schematic block diagram showing a structure of a conventional error-correcting device 5000.

The sector unit shown in FIG. 34 is formed of 16512-bit data. The data are used to represent EDCi which is an EDC of the i-th sector by the following expressions.

Here, bj denotes 1-bit data shown in FIG. 34.

$$EDCi(x) = \sum_{j=31}^{0} bj \times x^j = I(x) \bmod g(x) \tag{1}$$

-continued $$I(x) = \sum_{j=16511}^{32} bj \times x^j \qquad (2)$$

$$g(x) = x^{32} + x_{31} + x^4 + 1 \qquad (3)$$

Specifically, polynomial I (x) calculated from the data is divided by polynomial g (x). If the resultant reminder (check syndrome) is equal to EDCi (x), there is no error.

Figure 4:
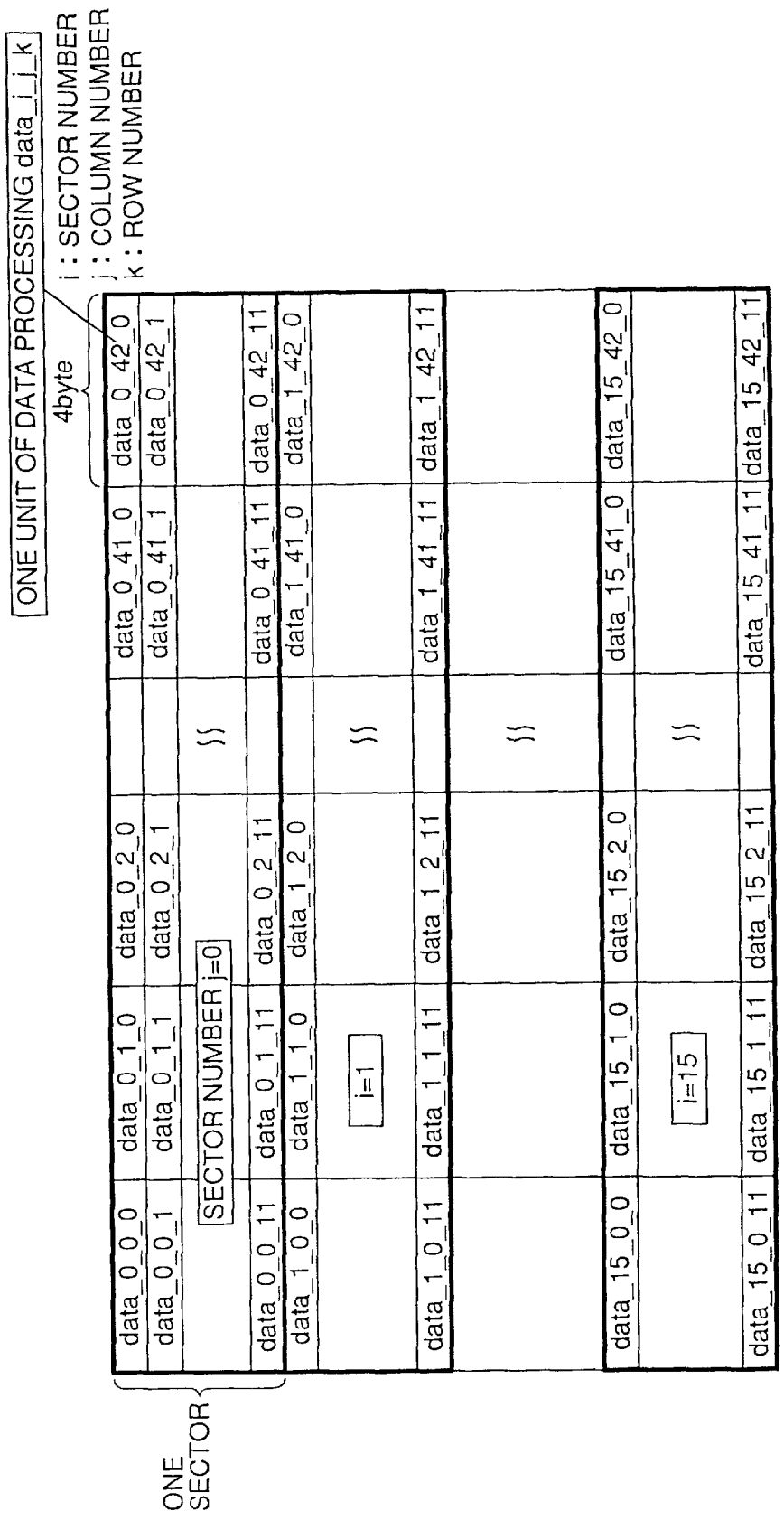
FIG. 4 illustrates an arrangement of data processing units in error checking.
Figure 18:
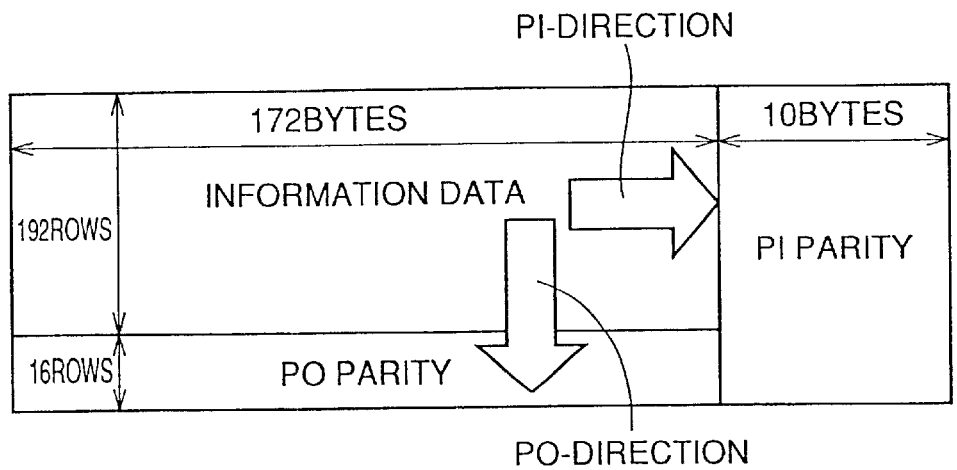
FIG. 18 illustrates a format of an error-correcting product code of a DVD.

FIG. 4 shows 16 sectors except for the parity check data shown in FIG. 18, where units of data are arranged that are to be processed in error check.

Referring to FIG. 4, a unit for data processing in each sector is 4-byte. According to this, 4-byte data is represented by data data_ijk where i denotes sector number, j denotes column number and j denotes row number, and i, j and k are respectively positive integers having relations $0 \leq i \leq 15$, $0 \leq j \leq 42$, and $0 \leq k \leq 11$.

Figure 5:
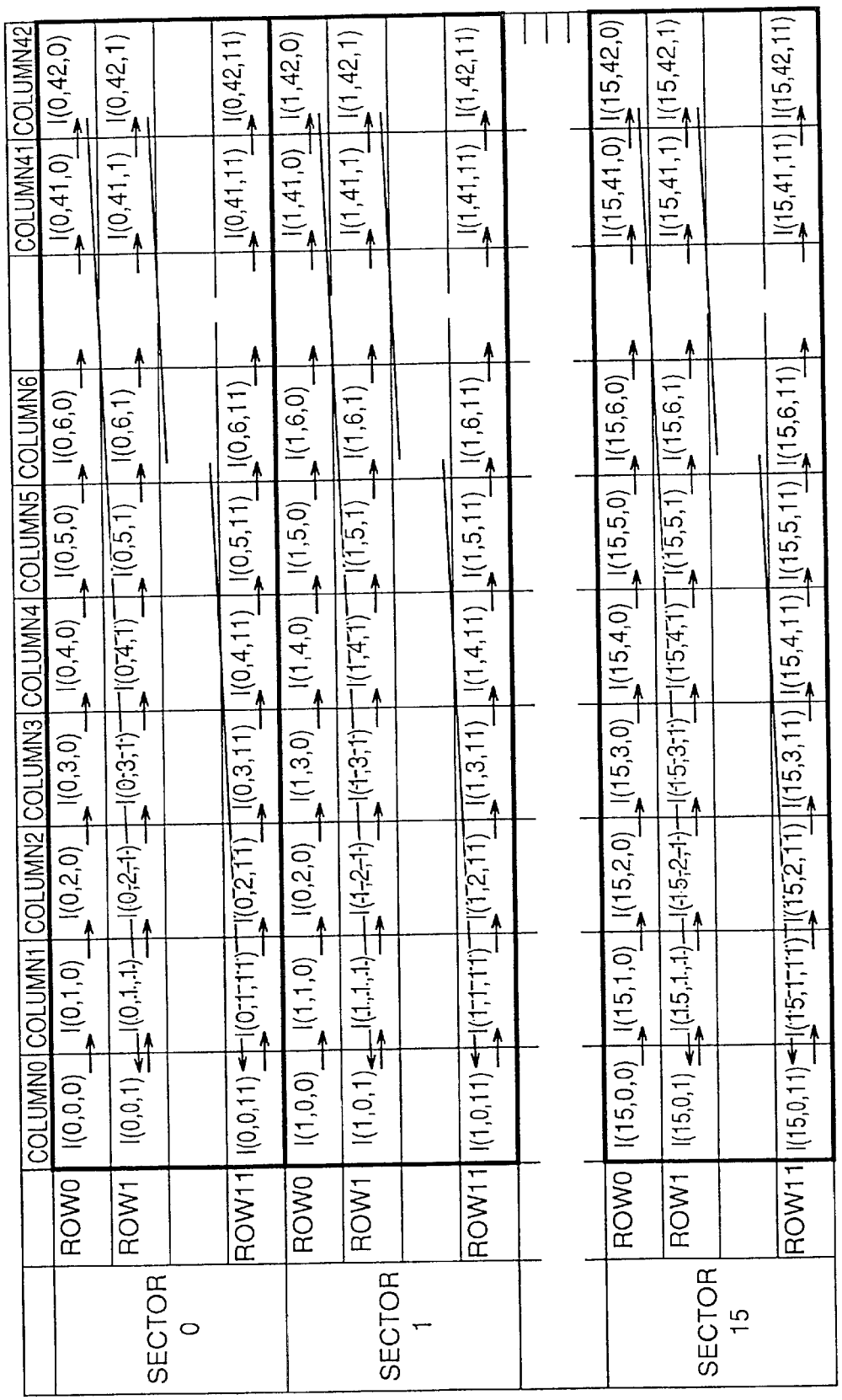
FIG. 5 shows a first model of the order in which data are processed in error correction and check.
Figure 6:
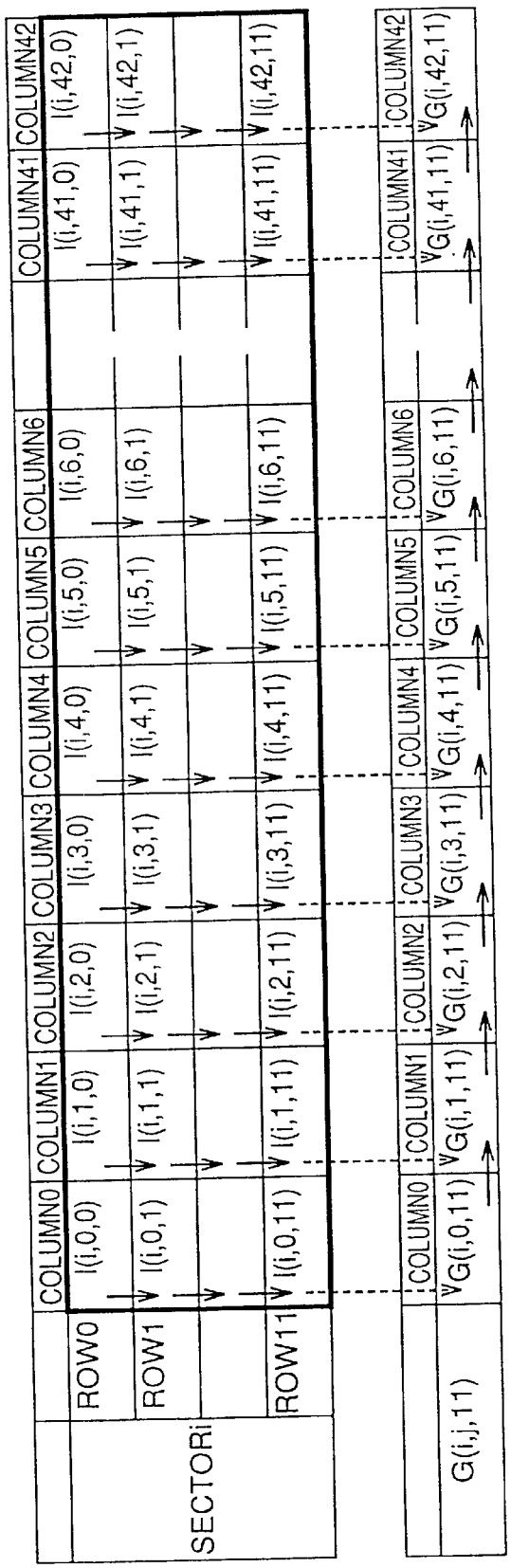
FIG. 6 shows a second model of the order in which data are processed in error correction and check.

FIGS. 5 and 6 respectively illustrate first and second models showing the order in which data are processed in the error correction and check process described below.

As discussed above, the number of data units to be error-checked in one sector is 516 (=43×12). Each data unit data_ijk is 32 bits (8 bits×4).

This code can be used to make validation on the DVD format. Error correction on the data structure as shown in FIGS. 5 and 6 is hereinafter described.

When a polynomial corresponding to each data unit data_ijk is represented by I (i, j, k), EDCi for i-th sector is calculated as defined by the following expressions.

$$EDCi(x) = I(i, 42, 11) \qquad (4)$$
$$= I(x) \bmod g(x)42$$

$$I(x) = I(i, 0, 0) \times x^{32 \times 515} + I(i, 1, 0)x^{32 \times 514} + \ldots + \qquad (5)$$
$$I(i, 42, 0) \times x^{32 \times 473} + I(i, 0, 1) \times x^{32 \times 472} + \ldots +$$
$$I(i, 41, 11) \times x^{32}$$

$$I(i, j, k) = \sum_{m=0}^{31} bijkm \times x^m \qquad (6)$$

Here, bijkm represents, in the data arrangement shown in FIG. 34, m-th bit data (one bit) from the least significant bit among bit data corresponding to data unit data_ijk.

If {I (x) mod g (x)} Exor I (i, 42, 11) is 0, then the i-th sector has no error. The symbol Exor represents an operation of determining the exclusive-OR of coefficients having the same degree in two polynomials to generate a polynomial with its coefficient derived therefrom.

The calculation above is modified by using function fpi for the following polynomial Y.

$$fpi\{Y\} = \{Y \times x^-\} \bmod g(x) \qquad (7)$$

Using such function fpi, the calculation above can be performed as repetitive calculation shown below.

$$F(i, 1, 0) = fpi\{I(i, 0, 0)\} \text{Exor } I(i, 1, 0)$$
$$F(i, 2, 0) = fpi\{F(i, 1, 0)\} \text{Exor } I(i, 2, 0)$$
$$F(i, 0, 1) = fpi\{F(i, 42, 0)\} \text{Exor } I(i, 0, 1)$$
$$F(i, 42, 11) = fpi\{F(i, 41, 11)\} \text{Exor } I(i, 42, 11) = \{I(x) \bmod g(x)\} \text{Exor } I(i, 42, 11) \qquad (8)$$

If F (i, 41, 11) is 0, then the i-th sector has no error.

Operation fpi corresponds to the operation represented by one arrow in FIG. 5. The speed of these operations can be enhanced by implementing them as a table.

The calculation by expression (8) for the i-th sector can be modified by using function fpo for the following polynomial Y.

$$fpo\{Y\} = \{Y x^{32 \times 43}\} \bmod g(x) \qquad (9)$$

For example, the calculation can be modified into two types of repetitive calculations.

i) Calculation 1

$$G(i, j, 1) = fpo\{I(i, j, 0)\} \text{Exor } I(i, j, 1)$$
$$G(i, j, 2) = fpo\{G(i, j, 1)\} \text{Exor } I(i, j, 2)$$
$$G(i, j, 1) = fpo\{G(i, j, 10)\} \text{Exor } I(i, j, 11) \qquad (10)$$

ii) Calculation 2

$$H(i, 1, 11) = fpi\{G(i, 0, 11)\} \text{Exor } G(i, 1, 11)$$
$$H(i, 2, 11) = fpi\{H(i, 1, 11)\} \text{Exor } G(i, 2, 11)$$
$$H(i, 42, 11) = fpi\{H(i, 41, 11)\} \text{Exor } G(i, 42, 11) = \{I(x) \bmod g(x)\} \text{Exor } I(i, 42, 11) \qquad (11)$$

The first calculation corresponds to the process performed by PO-direction partial error-checking circuit 8 shown in FIG. 2, and the second calculation corresponds to the process by PO-direction aggregate error-checking circuit 6.

Specifically, error check is possible by using the column data only shown in FIG. 6 by calculating partial syndromes by PO-direction partial error-checking circuit 8 and thereafter performing the aggregate operation by PO-direction aggregate error-checking circuit 6 based on the results from PO-direction partial error-checking circuit 8.

For this operation, a circuit can be structured by using two operations fpi and fpo only.

In FIG. 6, operation fpi denotes the operation indicated by the arrow in PI direction and fpo represents the operation indicated by the arrow in PO direction.

Figure 19:
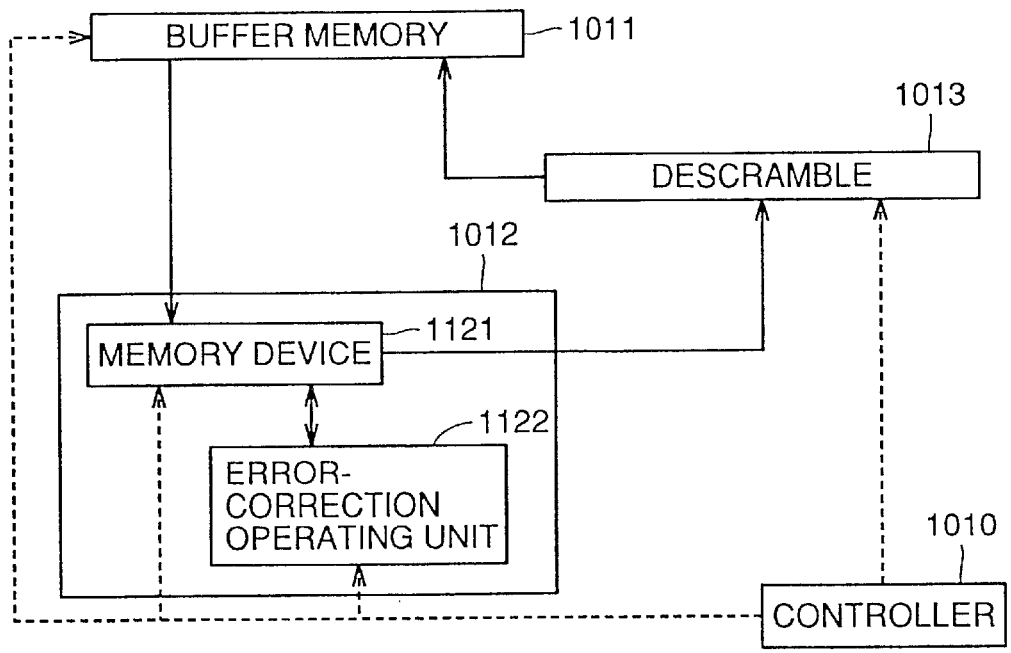
FIG. 19 is a block diagram illustrating a structure of a decoding circuit 1100.

If a certain column j has no error, calculation of G (i, j, 11) is unnecessary that has value 0. No extra circuit is required corresponding to three syndrome operations as shown in FIG. 19 so that extremely simple and fast calculation is possible.

Flow of Error Correction and Check Process

Figure 7:
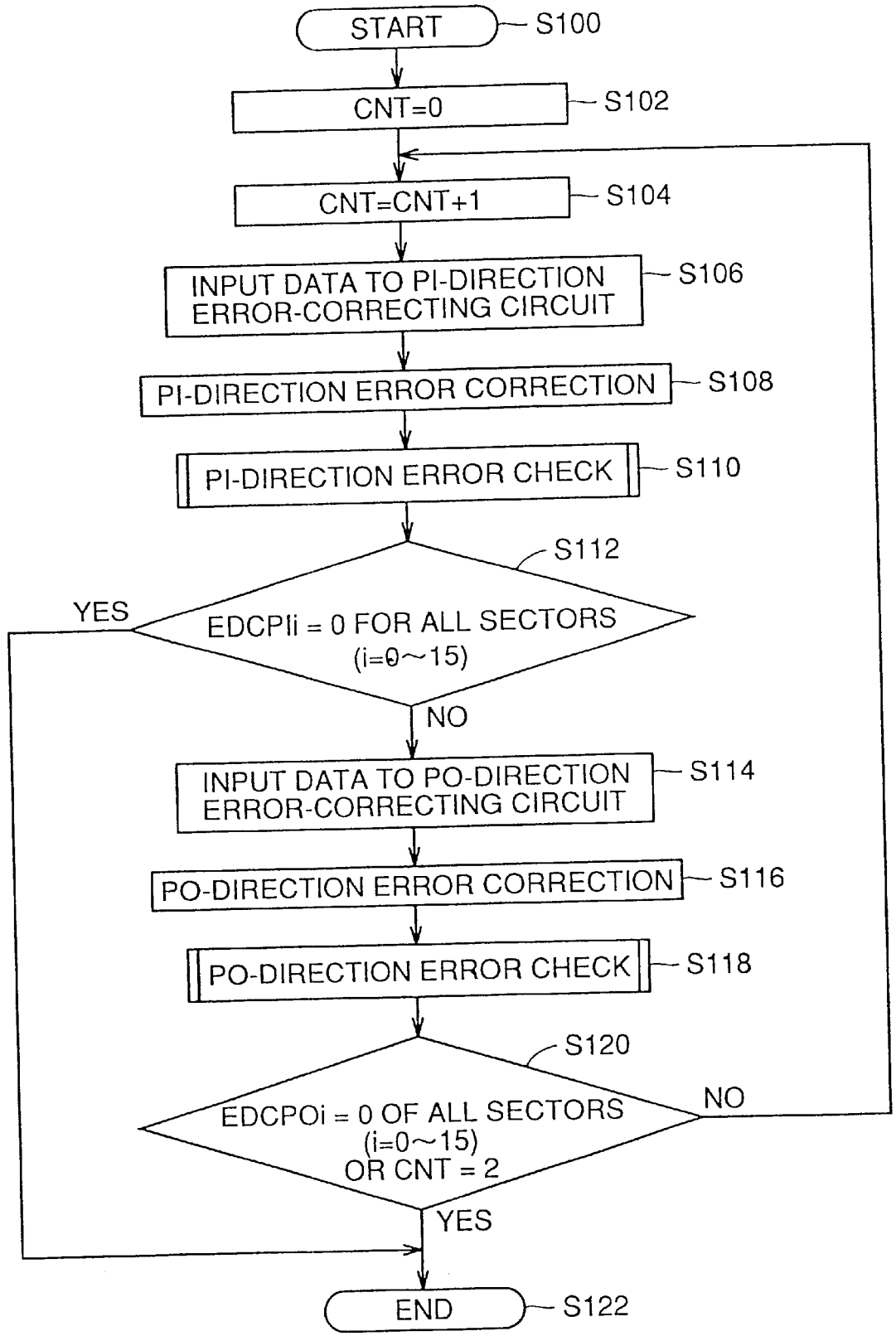
FIG. 7 is a flow chart illustrating a process flow of error correction and check.

FIG. 7 is a flow chart illustrating a process flow for error correction and error check described above.

Referring to FIG. 7, the error correction and check process is started (step S100), and the value of control variable CNT is initialized to 0 (step S102).

The value of variable CNT is incremented by 1 (step S104), data is supplied from data buffer 14 to PI-direction error-correcting circuit 10 (step S106), and PI-direction error-correction is carried out based on a calculated syndrome (step S108).

After the PI-direction error correction, PI-direction error check is carried out by PI-direction error-checking circuit 3 (step S110).

According to the result of PI-direction error check, for all sectors, it is decided whether or not the result of PI-direction error check EDCPIi (i=0–15) is 0 (step S112). If result EDCPIi of the error check with respect to PI direction for all sectors is 0, all errors have been corrected. Then this process is completed (step S122).

If result EDCPIi of PI-direction error check is not 0 for one sector only, for example, data is supplied from data buffer 14 to PO-direction error-correcting circuit 12 (step S114).

After error correction with respect to PO direction (step S116), error check is carried out with respect to PO direction by PO-direction partial error-checking circuit 8 and PO-direction aggregate error-checking circuit 6 (step S118).

Based on the result of PO-direction error check, for all sectors, it is determined whether error check result EDCPOi (i=0–15) for PO direction is 0 and whether the value of control variable CNT is 2 (step S120). If error check result EDCPIi for PO direction is 0 for all sectors, all errors have been corrected. If variable CNT is equal to 2, a required number of process steps have been completed. Then, this process is completed (step S122).

With the respect to all sectors, if PO-direction error check result EDCPIi is not 0 and variable CNT is not equal to 2, the process returns to step S104 (step S120).

In the description above, after PI-direction error check, PO-direction error correction is performed. However, after PI-direction error correction, PO-direction error correction may be performed concurrently (in parallel).

Although error correction and error check are each performed twice, depending on the operating conditions and the like of the system, the correction and check may be performed once or at least three times.

Figure 8:
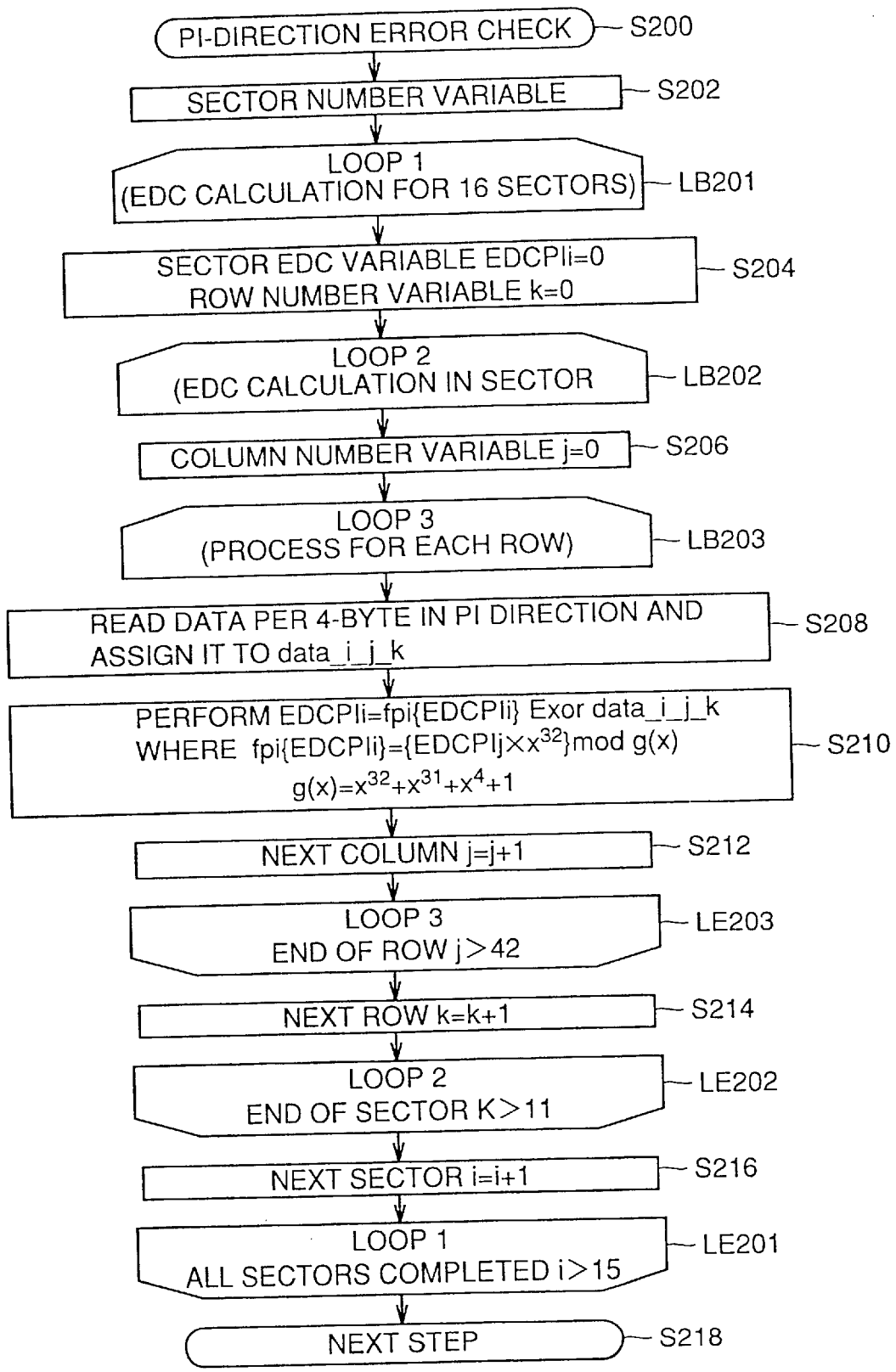
FIG. 8 is a flow chart illustrating error check in PI direction in step S110 in FIG. 7.

FIG. 8 is a flow chart illustrating the PI-direction error check in step S110 shown in FIG. 7.

PI-direction error check starts (step S200), and then the value of sector number variable i (i: positive integer) indicating the sector number is initialized to 0 (step S202).

Subsequent steps are performed in loop LB201–LE201 in which EDC check is conducted on 16 sectors. The steps from LB201 to LE201 are repeated until 16 sectors are processed (loop LB201–LE201).

Sector EDC variable EDCPIi corresponding to the i-th sector is initialized to 0 and the value of row number variable k is also initialized to 0 (step S204). Here, sector EDC variable EDCPIi represents a variable for calculation shown by expression (8).

The process proceeds to loop LB202–LE202 for EDC check in each sector. Specifically, steps from LB202 to LE202 are repeated until all data in the sector are processed (loop LB202–LE202).

The value of column number variable j is initialized to 0 (step S206).

The process then proceeds to loop LB203–LE203 in which each sector is processed per row. Specifically, steps from LB203 to LE203 are repeated until all columns are processed, as data units to be processed that are included in one row as a data unit to be processed (loop LB203–LE203).

In loop LB203–LE203, PI-direction error-checking circuit 3 reads data on the basis of 4 bytes in PI direction and assigns it to variable data_ijk (step S208).

Based on the above expression (8), the following operation is performed.

$$\text{EDCPIi} = \text{fpi}\{\text{EDCPi}\} \text{Exor data\_ijk} \tag{12}$$

The value of variable j is incremented by 1 and the process proceeds to the next column as a data unit to be processed (step S212).

Steps S208–S212 are repeated for all columns as data units to be processed, that are included in one row as a data unit to be processed (loop LB203–LE203).

The value of variable k is incremented by 1 and the process proceeds to the next row as a data unit to be processed (step S214).

Steps S206–S214 are repeated until data in the sector are processed (loop LB202–LE202).

After one sector has been processed, the value of variable i is incremented by 1 and a next sector is processed (step S216). The process then returns to step S202 again. Until all sectors are processed, steps S202–S216 are repeated (loop LB201–LE201).

When all sectors have been processed, the PI-direction error check is completed (step S218).

Figure 9:
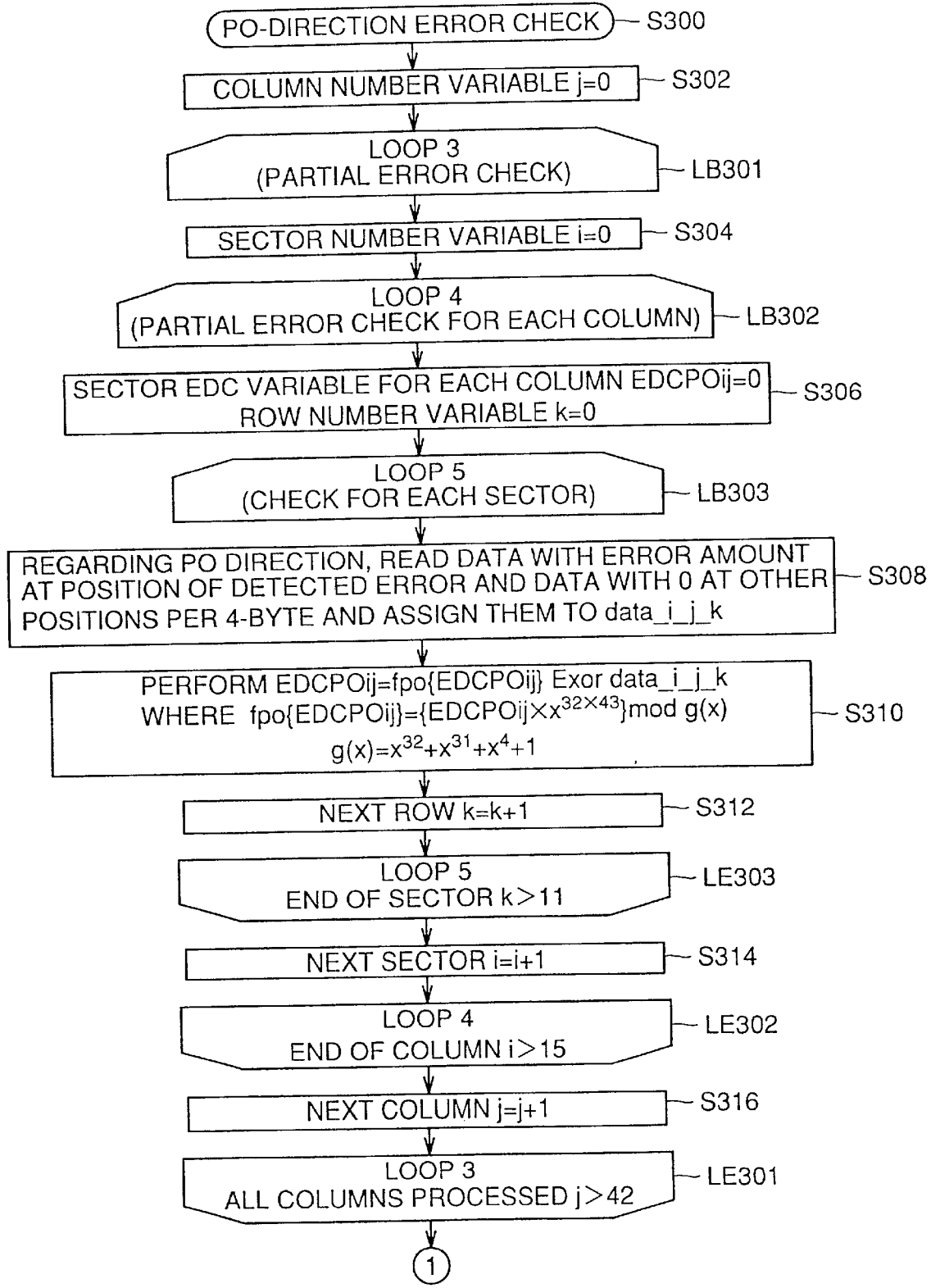
FIG. 9 is a first flow chart illustrating error check in PO direction in FIG. 7.
Figure 10:
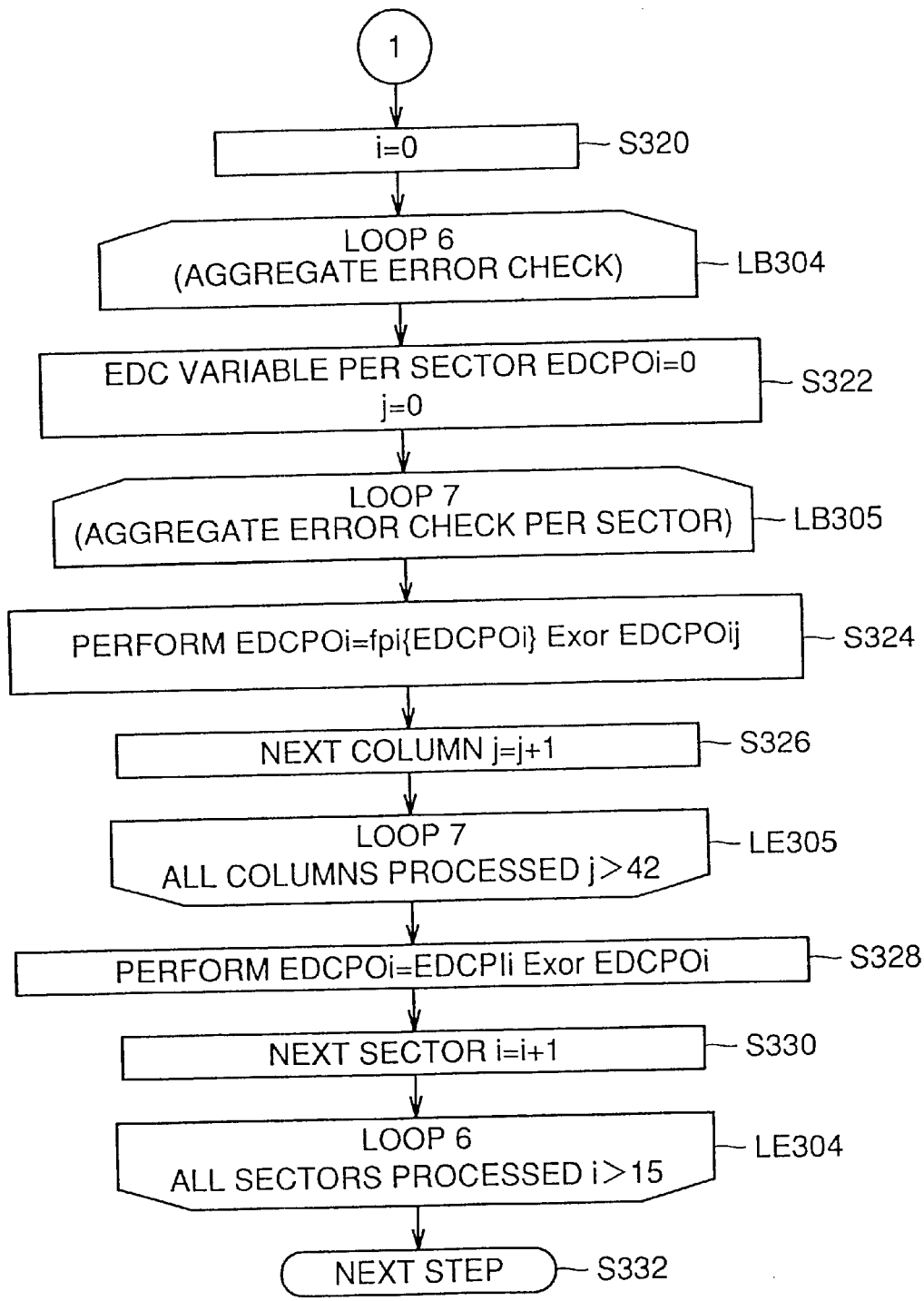
FIG. 10 is a second flow chart illustrating error check in PO direction in FIG. 7.

FIGS. 9 and 10 are first and second flow charts illustrating step S118 of PO-direction error check shown in FIG. 7.

PO-direction error check starts (step S300), and the value of column number variable j is initialized to 0 (step S302).

The process proceeds to loop LB301–LE301 for partial error check with respect to all columns. Specifically, the loop LB301–LE301 is repeated until all columns are processed (loop LB301–LE301).

The value of sector number variable i is initialized to 0 (step S304).

The process proceeds to loop LB302–LE302 for partial error check per column.

The value of sector EDC variable EDCPOij representing sector EDC value for each column and the value of row number variable k are initialized to 0 (step S306). Here, sector EDC variable EDCPOij is a variable for the first calculation represented by expression (10). In the process shown in FIG. 9, the data represented by expression (10) is not directly employed, and only the error amount is used for simplifying the process.

Specifically, the process proceeds to loop LB303–LE303 for partial error check for each sector (loop LB303–LE-303).

In loop LB303–LE303, PO-direction partial error-checking circuit 8 reads data with an error amount at the position of a detected error and reads data with 0 at other positions per 4-byte in PO direction, and assigns the read data to variable data_ijk (step S308). If there is no detected error in a checked column, loop LB302–LE302 can be skipped.

Based on expression (10) above, the following operation is performed.

$$\text{EDCPOij} = \text{fpo}\{\text{EDCPOij}\} \text{Exor data\_ijk} \tag{13}$$

The value of row number variable k is incremented by 1 and the process proceeds to the next row (step S312).

Steps S308–S312 are repeated until the data in the j-th column of the i-th sector is processed (loop LB303–LE303).

After the j-th column of the i-th sector has been processed, the value of variable i is incremented by 1, and the process proceeds to a next sector (step S314). The process again returns to step S306. Until the j-th column of the 15th sector is processed, steps S306–S314 are repeated (loop LB302–LE302).

When the j-th columns of all sectors have been processed, the value of variable j is incremented by 1 and the process proceeds to a next column (step S316). Again the process returns to step S304. Until the 42-th column is processed, steps S304–S316 are repeated (loop LB301–LE301).

Referring to FIG. 10, after loop LB301–LE301, variable i is reset to 0 (step S320).

The process then proceeds to loop LB304–LE304 for aggregate error check. Specifically, steps in loop LB304–LE304 are repeated until all sectors are processed (loop LB304–LE304).

The value of EDC variable EDCPOi corresponding to the i-th sector and variable j are initialized to 0 (step S322).

The process then proceeds to loop LB305–LE305 for aggregate error check for each sector.

In loop LB305–LE305, PO-direction aggregate error-checking circuit 6 performs with respect to PI direction operation and assignment based on expression (11) above as follows (step S324).

$$\text{EDCPOi}=\text{fpi}\{\text{EDCPOi}\}\text{Exor EDCPOij} \tag{14}$$

The value of variable j is incremented by 1 and the process proceeds to a next column (step S326).

Until all columns in the sector being processed are processed, steps S324–S326 are repeated (loop LB305–LE305).

When all the columns in the i-th sector have been processed, exclusive-OR operating unit 5 performs the following operation (step S328).

$$\text{EDCPOi}=\text{EDCPIi Exor EDCPOi}$$

It is then determined whether there is any error in the i-th sector by PO-direction decision circuit 4.

The value of control variable i is incremented by 1 (step S330), the process proceeds to a next sector, and the process again returns to step S322. Until the last sector is processed, steps S322–S330 are repeated (loop LB304–LE304).

When loop LB304–LE304 is completed, the error correction and check reaches the end. Then, a next step (step S120 in FIG. 7) is carried out (step S320).

Second Embodiment

As discussed in conjunction with the first embodiment, a sector unit on the basis thereof error check is performed is formed of 16512 data (bi) shown in FIG. 34. Using these data, EDCi for the i-th sector is represented by expressions (1)–(3).

According to the first embodiment, in order to calculate EDCi (x) represented by expression (1), function fpo defined by expression (9) is used for simplifying operation. Then, PO-direction partial error-checking circuit 8 shown in FIG. 2 performs the operation represented by expression (13) as discussed in conjunction with step S310 in FIG. 9.

The process by function fpo is represented by expression (15) below for easy understanding of description.

$$fpo\{Jk(x)\}=\{Jk(x) \times x^{43 \times 32}\} \bmod \{g(x)\} \tag{15}$$

Jk (x) is a polynomial with the degree of 31.

Accordingly, expression (15) can be executed by a 32-bit operating unit. However, according to the second embodiment, in order to enhance the operating speed, a table is prepared for operational results corresponding to $2^{32}$ numerical values. Based on this table, an operation is performed corresponding to expression (15).

As shown by expression (10), an expression represented by expression (6) for example is assigned as Jk (x).

Figure 11:
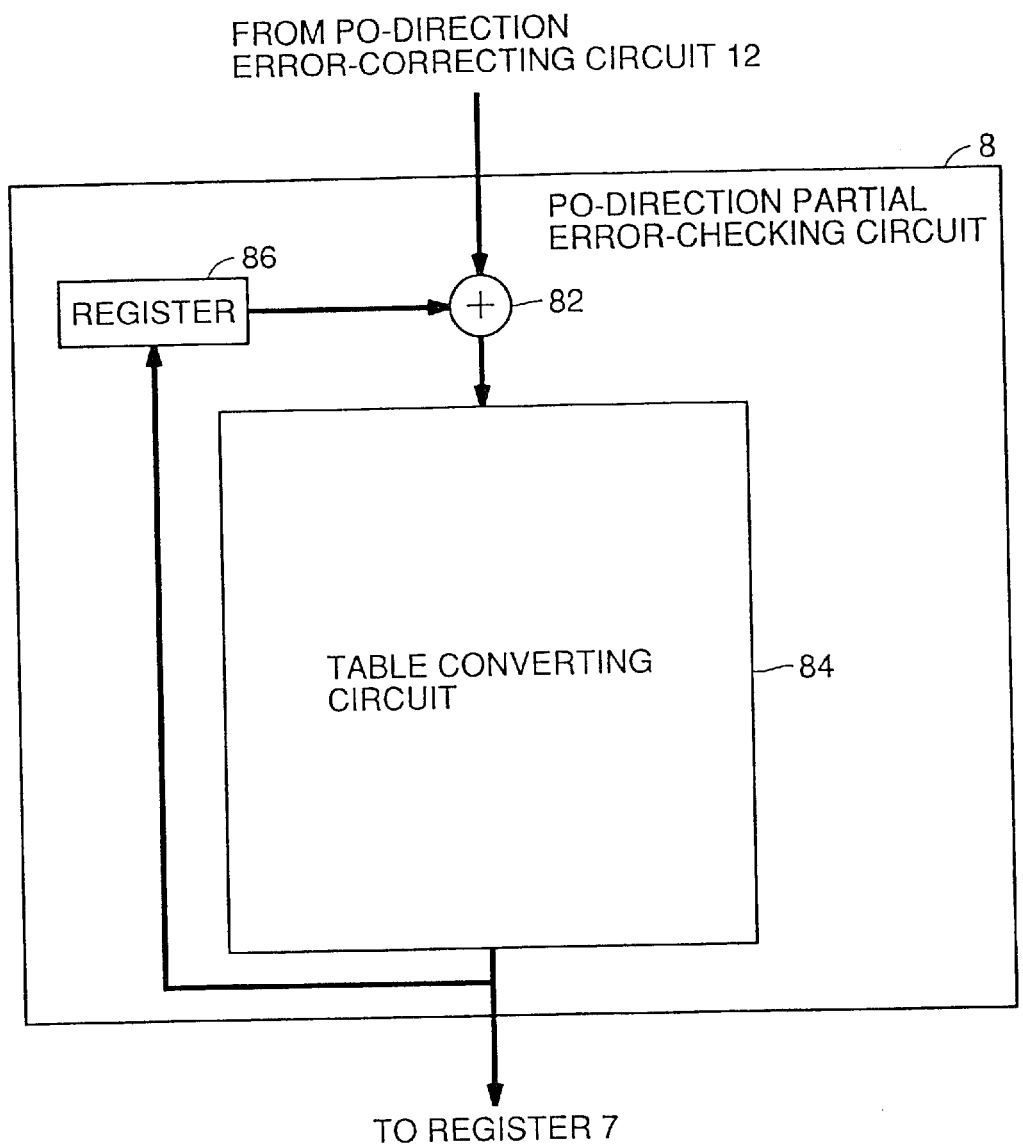
FIG. 11 is a schematic block diagram illustrating a structure of a PO-direction partial error-checking circuit 8.

FIG. 11 is a schematic block diagram illustrating a structure of a PO-direction partial error-checking circuit 8 implementing this operation.

Referring to FIG. 11, PO-direction partial error-checking circuit 8 includes an exclusive-OR operating circuit 82 receiving an output of a PO-direction error-correcting circuit 12, a table converting circuit 84 receiving an output of exclusive-OR operating circuit 82 to output an operational result represented by expression (15) based on the table corresponding to $2^{32}$ operational results on 32-bit data as described above, and a register circuit 86 for temporarily storing an output of table converting circuit 84.

Exclusive-OR operating circuit 82 successively receives I (i, j, k) (k=1–11) from PO-direction error-correcting circuit 12, and supplies, the exclusive-OR of it and an output of table converting circuit 84 in the step preceding by one step that is stored in register 86, to table converting circuit 84 again.

In other words, it is possible to perform an operation corresponding to expression (10) by the process loop formed of exclusive-OR operating circuit 82, table converting circuit 84 and register 86.

Figure 12:
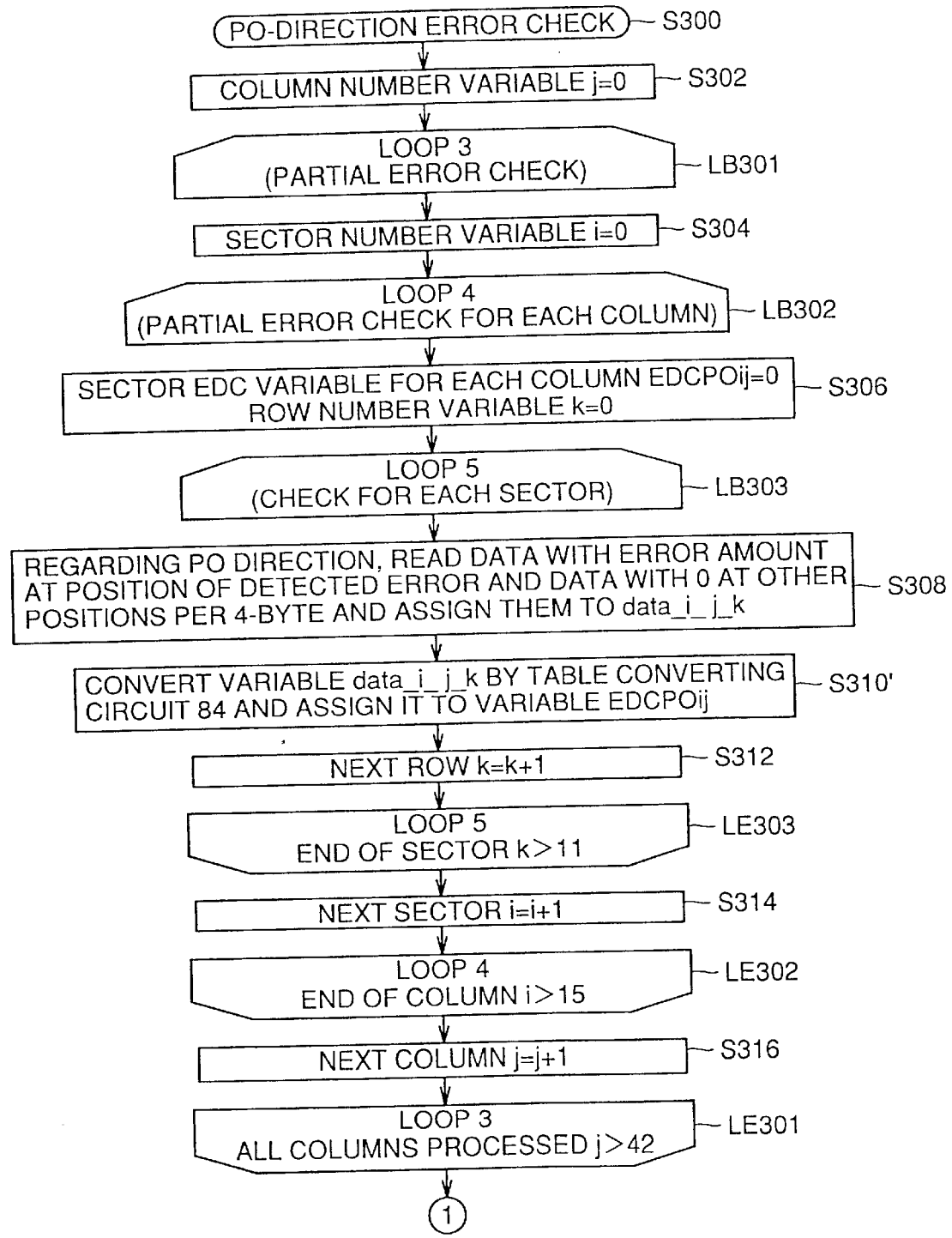
FIG. 12 is a first flow chart illustrating operations of PO-direction partial error-checking circuit 8, a register 7 and a PO-direction aggregate error-checking circuit 6.
Figure 13:
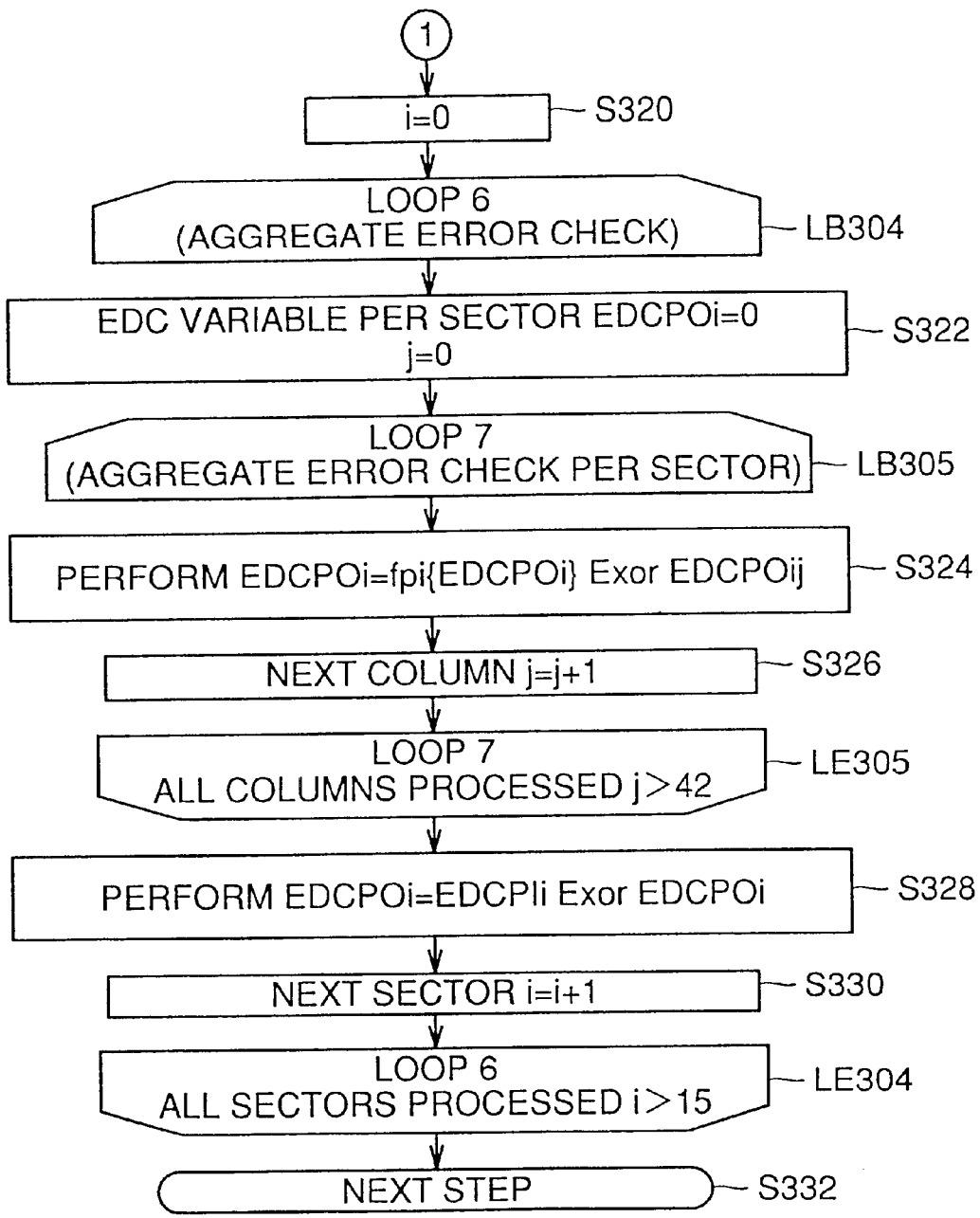
FIG. 13 is a second flow chart illustrating operations of PO-direction partial error-checking circuit 8, register 7 and PO-direction aggregate error-checking circuit 6.

FIGS. 12 and 13 are flow charts illustrating operations of PO-direction partial error-checking circuit 8 shown in FIG. 11, register 7 and PO-direction aggregate error-checking circuit 6 that are comparable to FIGS. 9 and 10 according to the first embodiment.

The process shown in FIGS. 12 and 13 is different from that in FIG. 9 in that, in step S310', the exclusive-OR of data data_ijk supplied from PO-direction error-correcting circuit 12 and data stored in register circuit 86 calculated by exclusive-OR operating circuit 82 is converted by table converting circuit 84 to update the value of variable EDCPOij and supply the value again to register 86.

The process in FIGS. 12 and 13 is similar to that in FIGS. 9 and 10 except for this, and the same or corresponding components therein have the same reference character and description thereof will not be repeated.

Using such a structure, PO-direction partial error-checking circuit 8 updates the value of variable EDCPOij based on the table provided in advance, so that advantageously the operating speed is enhanced and the time for error correction is shortened.

Third Embodiment

The process represented by expression (15) by PO-direction partial error-checking circuit 8 is described according to the second embodiment in which table converting circuit 84 operates the expression using a table generated based on pre-calculated results.

According to the third embodiment, a structure is described that further enhances the speed of operation represented by expression (15).

A decoding circuit in the third embodiment has a structure basically similar to that of decoding circuit 147 shown in FIG. 2. A PO-direction partial error-checking circuit 8 differs from the corresponding circuit in the embodiments above as discussed below.

Specifically, expression Jk (x) in expression (15) can be divided as shown by expression (16).

$$Jk(x)=Jk-0(x) \times x^{24}+Jk-1(x) \times x^{16}+Jk-2(x) \times x^{8}+Jk-3 \tag{16}$$

Namely, expression Jk (x) can be divided into four parts.

Expression (16) can be used to modify expression (15) as shown by expression (17) below.

$$fpo\{Jk(x)\}=$$
$$\{Jk-0(x) \times x^{24} \times x^{43 \times 32}$$
$$\} \bmod \{g(x)\}+\{Jk-1$$
$$(x) \times x^{16} \times x^{43 \times 32}\} \bmod \{g$$
$$(x)\}+\{Jk-2$$
$$(x) \times x^{8} \times x^{43 \times 32}\} \bmod \{g$$
$$(x)\}+\{Jk-3(x) \times x^{43 \times 32}$$
$$\} \bmod \{g(x)\} \tag{17}$$

Accordingly, it is possible to perform, with respect to each term of expression (17), operations by four table converting circuits performing PO-direction partial error check based on a prepared table having $2^8$ patterns and three exclusive-OR operating units for exclusive-OR operation applied to respective outputs of four table converting circuits as explained below.

Figure 14:
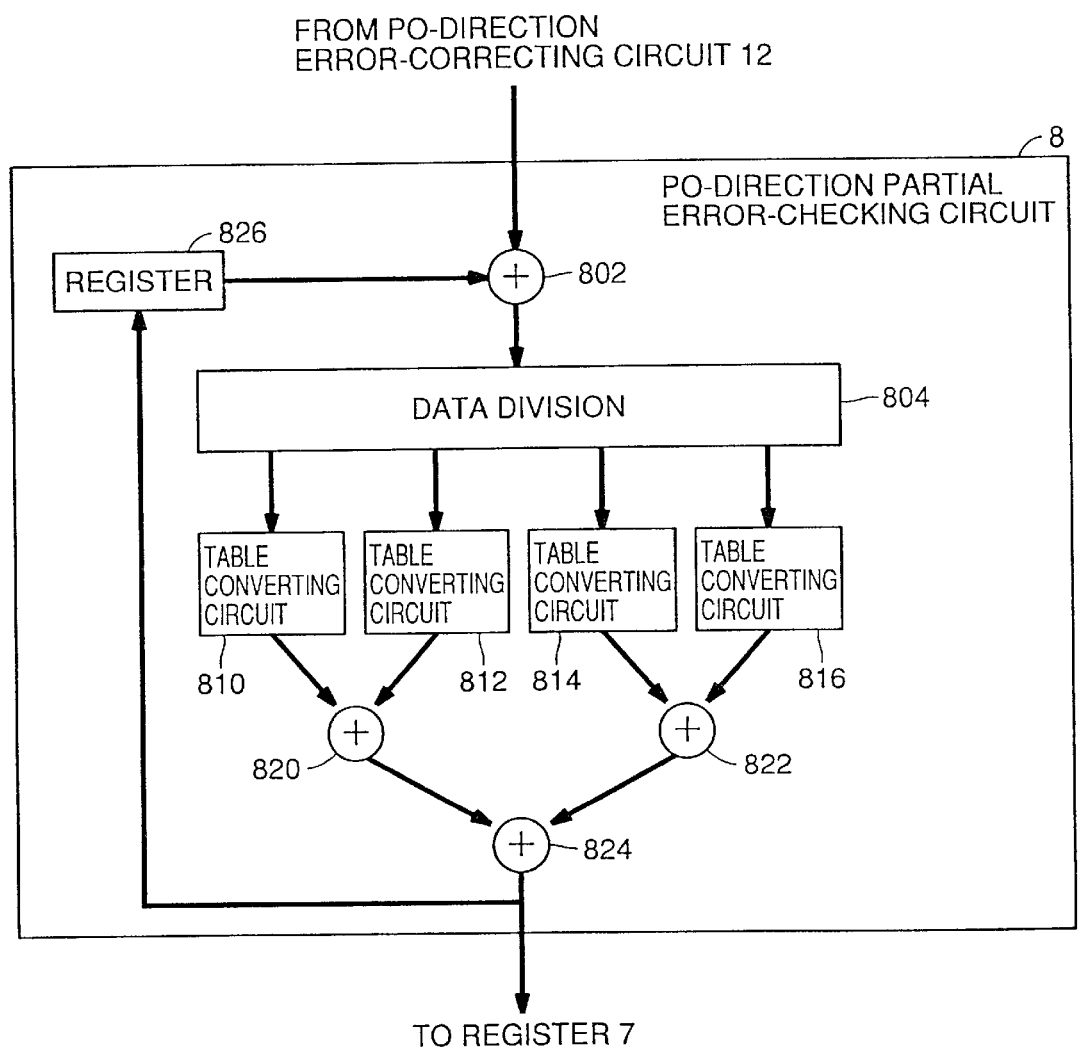
FIG. 14 is a schematic block diagram illustrating a structure of PO-direction partial error-checking circuit 8.

FIG. 14 is a schematic block diagram illustrating a structure of PO-direction partial error-checking circuit 8 as structured above.

Referring to FIG. 14, PO-direction partial error-checking circuit 8 according to the third embodiment includes an exclusive-OR operating circuit 802 receiving data data_ijk from a PO-direction error-correcting circuit 12, a data dividing circuit 804 for dividing a received output of exclusive-OR operating circuit 802 into data each of 8 bits, table converting circuits 810, 812, 814 and 816 each receiving 8-bit data from data dividing circuit 804 to perform calculation corresponding to each term of expression (17) according to the table with $2^8$ patterns calculated in advance, an exclusive-OR operating circuit 820 receiving respective outputs of table converting circuits 810 and 812 to output the exclusive-OR thereof, an exclusive-OR operating circuit 822 receiving respective outputs of table converting circuits 814 and 816 to output the exclusive-OR thereof, an exclusive-OR operating circuit 824 receiving respective outputs of exclusive-OR operating circuits 820 and 822 to output the exclusive-OR thereof to register 7 shown in FIG. 2, and a register 826 receiving and temporarily storing the output of exclusive-OR operating circuit 824.

Exclusive-OR operating circuit 802 determines the exclusive-OR of data data_ijk from PO-direction error-correcting circuit 12 and the output of register 826 to supply the result to data dividing circuit 804.

Figure 15:
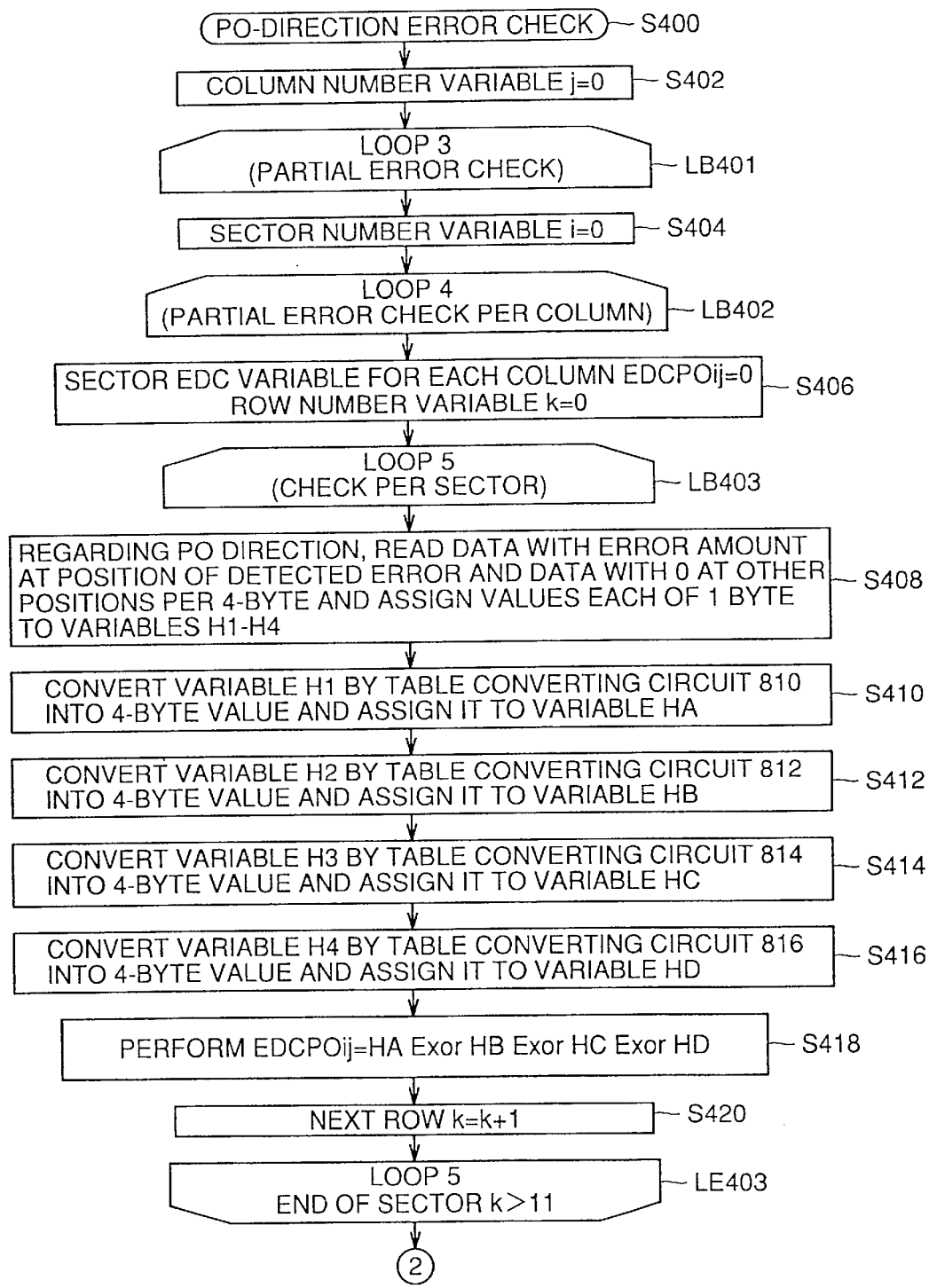
FIG. 15 is a first flow chart illustrating processing by PO-direction partial error-checking circuit 8, register 7 and PO-direction aggregate error-checking circuit 6.
Figure 16:
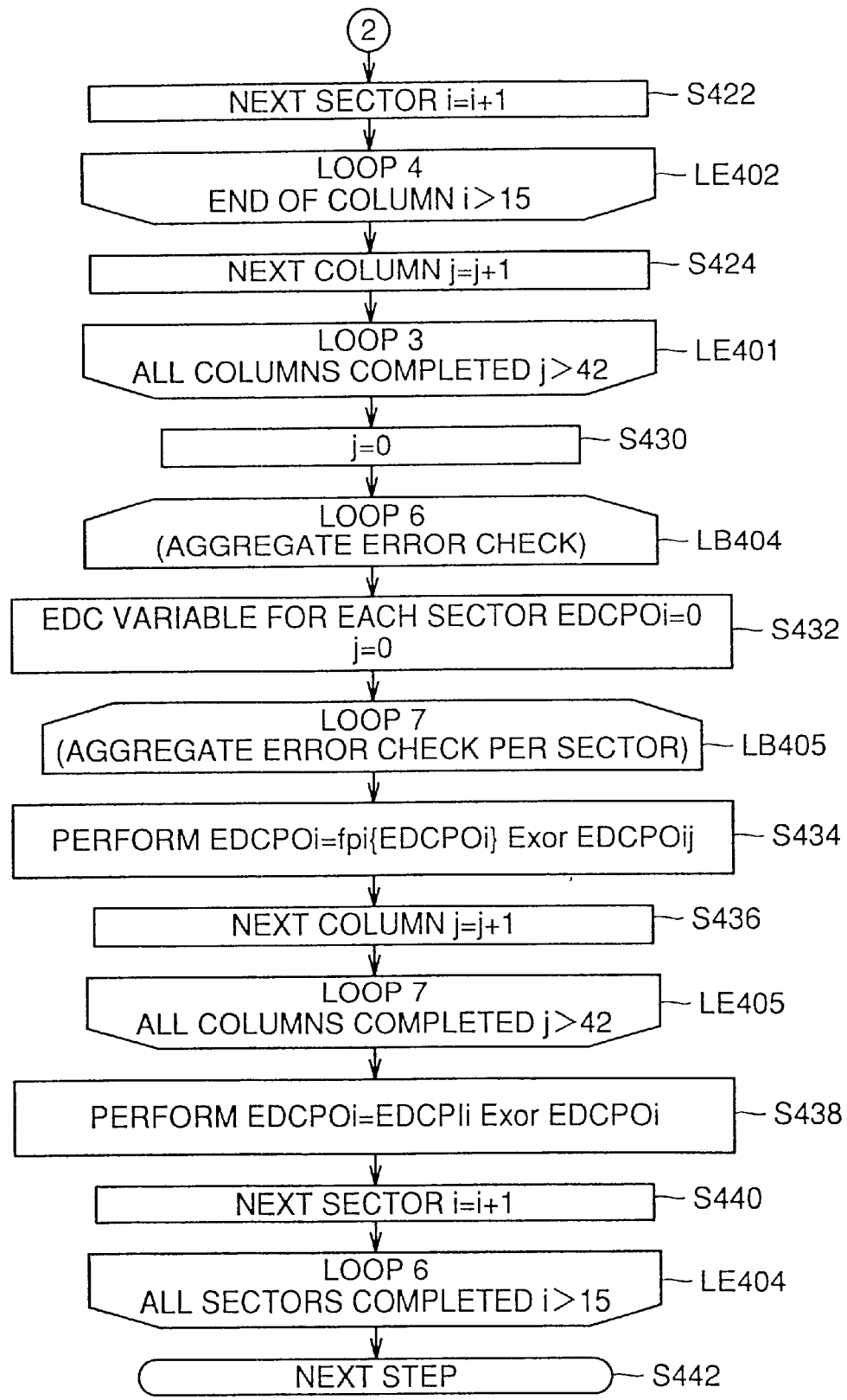
FIG. 16 is a second flow chart illustrating processing by PO-direction partial error-checking circuit 8, register 7 and PO-direction aggregate error-checking circuit 6.

FIGS. 15 and 16 are flow charts illustrating a process followed by PO-direction partial error-checking circuit 8 of the third embodiment shown in FIG. 14 and register 7 and PO-direction aggregate error-checking circuit 6 shown in FIG. 2.

Referring to FIGS. 15 and 16, PO-direction error checks starts (step S400), and the value of column number variable j is initialized to 0 (step S402).

The process then proceeds to loop LB401–LE401 for partial error check on all the columns. Specifically, loop LB401–LE401 is repeated until all columns are processed (loop LB401–LE401).

The value of sector number variable i is initialized to 0 (step S404).

The process then proceeds to loop LB402–LE402 for partial error check per column.

The value of sector EDC variable EDCPOij representing sector EDC value of each column and the value of row number variable k are initialized to 0 (step S406). Here, sector EDC variable EDCPOij denotes a variable for the calculation represented by expression (17). Similarly to the process shown in FIG. 9, expression (17) processes only the data corresponding to any row having errors.

The process proceeds to loop LB403–LE403 for partial error check per sector (loop LB403–LE403).

In loop LB403–LE403, PO-direction partial error-checking circuit 8 reads data with the error amount at the position of any detected error and data with 0 at other positions on the basis of 4 bytes in PO direction. Data dividing circuit 804 divides the data into parts of 1 byte each starting from the leading byte. The divided data each of 1 byte are hereinafter denoted by variables H1 to H4 respectively (step S408). According to this step, respective values corresponding to variables H1 to H4 are supplied respectively to table converting circuits 810 to 816.

Table converting circuit 810 receives data corresponding to variable H1 from data dividing circuit 804 and converts the data based on a corresponding table (operation table). Table converting circuit 810 further converts the data of 4 bytes such that the leading 1 byte is equal to the converted value and remaining bit-data of 3 bytes are all 0. The data output from table converting circuit 810 is represented by variable HA (step S410). According to this step, the output of table converting circuit 810 is provided to exclusive-OR operating circuit 820.

Table converting circuit 812 receives data corresponding to variable H2 from data dividing circuit 804 and converts the data based on a corresponding table (operation table). Table converting circuit 812 further converts the data of 4 bytes such that the second 1-byte data is equal to the converted value and remaining bit-data of 3 bytes are all 0. The data output from table converting circuit 812 is denoted by variable HB (step S412). According to this step, the output of table converting circuit 812 is supplied to exclusive-OR operating circuit 820.

Table converting circuit 814 receives data corresponding to variable H3 from data dividing circuit 804 and converts the data based on a corresponding table (operation table). Table converting circuit 814 further converts the data of 4 bytes such that the third 1-byte data is equal to the converted value and remaining bit-data of 3 bytes are all 0. The data output from table converting circuit 814 is denoted by variable HC (step S414). According to this step, the output of table converting circuit 814 is supplied to exclusive-OR operating circuit 822.

Table converting circuit 816 receives data corresponding to variable H4 from data dividing circuit 814 and converse the data based on a corresponding table (operation table). Table converting circuit 816 further converts the data such that the fourth 1-byte data is equal to the converted value and remaining bit-data of 3 bytes are all 0. The data output from table converting circuit 816 is indicated by variable HD (step 416). According to this step, the output of table converting circuit 816 is supplied to exclusive-OR operating circuit 822.

Following this, the value of sector EDC variable EDCPOij is operated by exclusive-OR operating circuits 820, 822 and 824 by the following expression (18) (step S418).

$$EDCPOij=(HA)Exor(HB)Exor(HC)Exor(HD) \qquad (18)$$

The value of row number variable k is incremented by 1 and the process proceeds to a next row (step S420).

Until data in the j-th column of the i-th sector is processed, steps S408 to S412 are repeated (loop LB403–LE403).

Referring to FIG. 16, when the j-th column of the i-th sector has been processed, the value of variable i is incremented by 1. The process proceeds to a next sector (step S422) and the process returns to step S406. Until the process for the j-th column of the 15th sector is completed, steps S406 to S422 are repeated (loop LB402–LE402).

When the j-th columns of all sectors have been processed, the value of variable j is incremented by 1 and the process proceeds to a next column (step S424). The process returns to step S404. Until the process for the 42-th column is completed, steps S404 to S424 are repeated (loop LB401–LE401).

Following loop LB401–LE401, the value of variable i is reset to 0 (step S430).

Then, the process proceeds to loop LB404–LE404 for aggregate error check. Specifically, loop LB404–LE404 is repeated until all sectors are processed (loop LB404–LE404).

The value of EDC variable EDCPOi corresponding to the i-th sector and the value of variable j are initialized to 0 (step S432).

The process proceeds to loop LB405–LE405 for aggregate error check per sector.

In loop LB405–LE405, PO-direction aggregate error-checking circuit 6 performs in PI direction an operation and assignment for expression (14) below based on expression (11) (step S434).

$$EDCPOi = fpi\{EDCPOi\} \text{Exor } EDCPOij \quad (14)$$

The value of variable j is incremented by 1 and the process proceeds to a next column (step S436).

Until the process for all columns in a sector being processed is completed, steps S434 to S436 are repeated (loop LB405–LE405).

When all columns of the i-th sector have been processed, exclusive-OR operating unit 5 performs the following operation (step S438).

$$EDCPOi = EDCPIi \text{ Exor } EDCPOi$$

Accordingly, PO-direction decision circuit 4 decides whether the i-th sector has any error.

The value of control variable i is incremented by 1 (step S440), and the process proceeds to a next sector and returns to step S432. Until the process for the last sector is completed, steps S432 to S440 are repeated (loop LB404–LE404).

When loop LB404–LE404 is completed, the error correction and check is accordingly completed, and the process proceeds to the next step (step S120 in FIG. 7) (step S442).

The process discussed above can also be applied to PO-direction partial error-checking circuit 8. The PO-direction partial error-check is divided on the basis of 8 bits and tables are used to perform concurrent processing. Consequently, fast processing is achieved.

In general, for function fpo, a table requires a size corresponding to $2^{(n/m)}$ data and the required number of tables is (m−1) when the original data is n-bit and the number of data parts resulting from data division is m (m is divisor of n). The number of exclusive-OR operating units is (m−1).

In this way, the table converting circuits performing calculation based on the divided table can be employed to remarkably reduce the circuit scale.

In addition, according to the present invention, the time required for error check can be shortened, without increase in the number of memory devices and circuit scale, by reducing the access time to the memory device and performing error check concurrently with error correction.

Fourth Embodiment

An error-correcting and descrambling circuit according to the fourth embodiment of the invention is hereinafter described in conjunction with the drawings.

Figure 17:
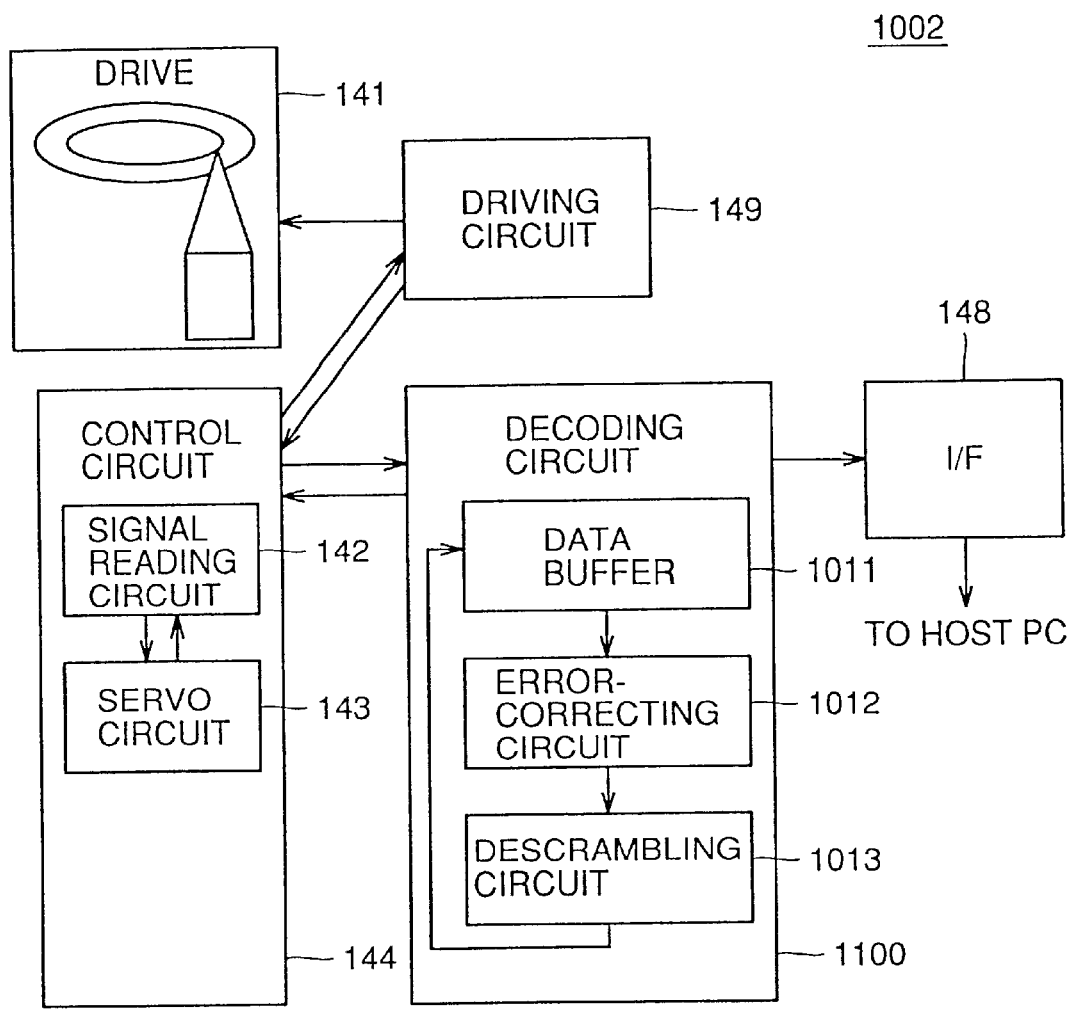
FIG. 17 is a schematic block diagram showing a structure of a disk reproducing apparatus 1002 having an error-checking and descrambling circuit.

FIG. 17 is a schematic block diagram showing a structure of a disk reproducing apparatus 1002 having the error-correcting and descrambling circuit according to the invention.

Referring to FIG. 17, data read from a disk at a drive 141 driven by a driving circuit 149 is demodulated by a signal reading circuit 142 in a control circuit 144. Based on a signal read by signal reading circuit 142, a servo circuit 143 controls driving circuit 149.

The data from the disk is demodulated by signal reading circuit 142 and thereafter transferred to a data buffer 1011 in a decoding circuit 1100. The transferred data is subjected to error correction by an error-correcting circuit 1012 and descrambled by a descrambling circuit 1013 to be transferred as information data to a host PC via an interface 148.

FIG. 18 illustrates a format of an error-correcting product code for the DVD shown in FIG. 17. One block of data is formed of information data of 172×192 bytes arranged in two-dimension to which 10-byte parity PI in the horizontal direction and 16-byte parity PO in the vertical direction are added.

FIG. 19 is a block diagram illustrating a structure of decoding circuit 1100 in FIG. 17. The operation of decoding circuit 1100 is controlled by a decoding controller 1010.

The structure and operation of decoding circuit 1100 is now described in conjunction with FIG. 19.

In a first step, input data is transferred to buffer memory 1011. Here, for example, an SDRAM is employed as buffer memory 1011.

In a second step, error-correcting circuit 1012 reads from buffer memory 1011 data corresponding to one codeword, for example, on the basis thereof error check is performed, to perform error correction. Error-correcting circuit 1012 includes a memory device 1121 for temporarily storing uncorrected one-codeword data as well as an error-correction operating unit 1122. A correction amount determined by error-correction operation unit 1122 is used for correct data that is temporarily stored in memory device 1121.

In a third step, the corrected data thus obtained and temporarily stored is provided to descrambling circuit 1013 to be descrambled.

Figure 20:
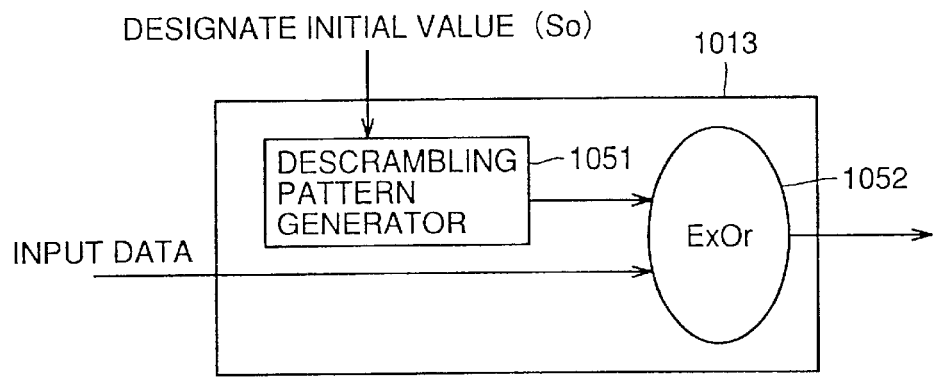
FIG. 20 is a schematic block diagram illustrating a structure of a descrambling circuit 13.

FIG. 20 is a schematic block diagram illustrating a structure of descrambling circuit 1013. The data supplied to descrambling circuit 1013 is used for determining the exclusive-OR with a value obtained from a descrambling pattern generator 1051 by an exclusive-OR operating circuit 1052. Descrambling pattern generator 1051 receives initial value $S_0$ based on data stored in advance on the DVD.

The description of the operation of decoding circuit 1100 in FIG. 19 is continued here. In a fourth step, the descrambled data is written into buffer memory 1011.

Such a circuit structure can reduce access to data buffer memory 1011 approximately by ½. Then, fast error-correction and descrambling for a product code is accomplished.

Fifth Embodiment

Figure 21:
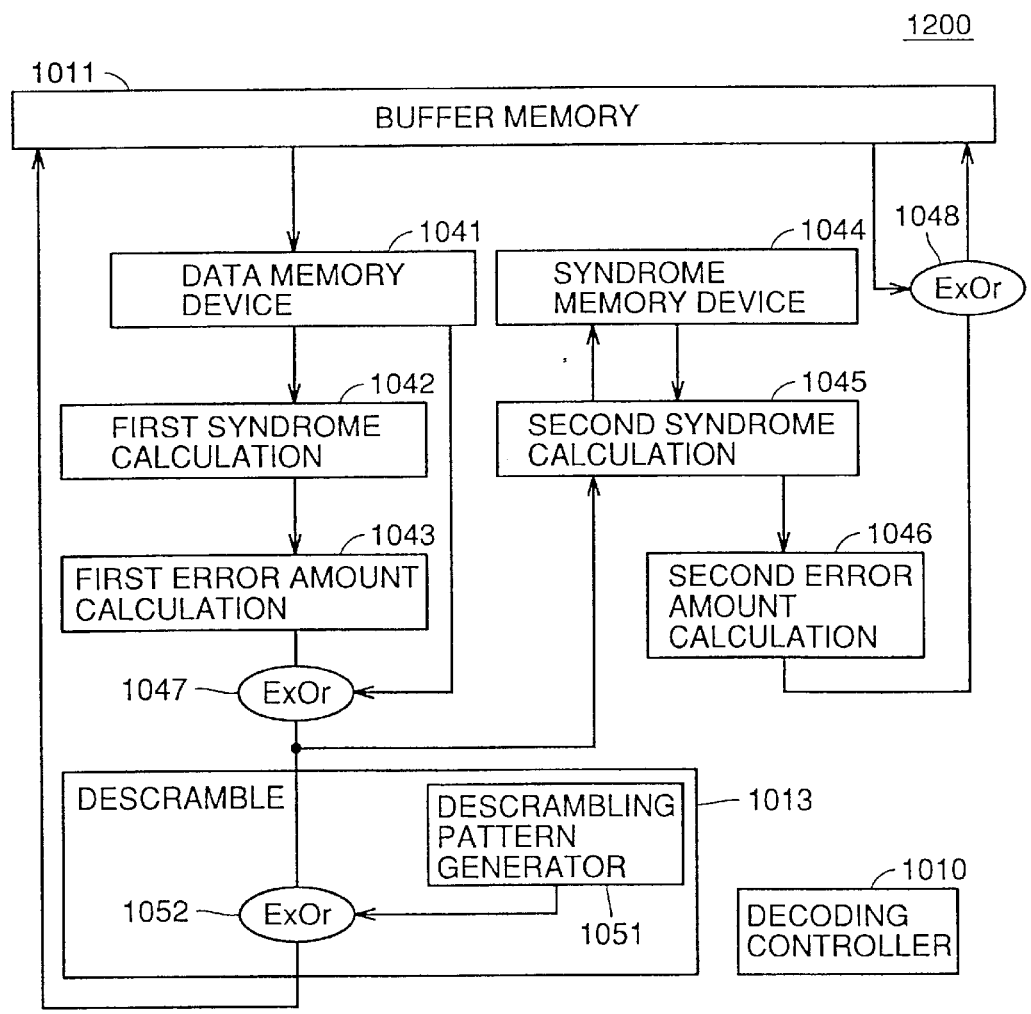
FIG. 21 is a schematic block diagram illustrating a structure of a decoding circuit 1200.

FIG. 21 is a schematic block diagram illustrating a structure of a decoding circuit 1200 having the error-correcting and descrambling circuit for a product code according to the fifth embodiment of the invention. In other words, in disk reproducing apparatus 1002 shown in FIG. 17, decoding circuit 1200 detailed below can be used instead of decoding circuit 1100.

The operation of decoding circuit 1200 is controlled by a decoding controller 1010.

According to the fifth embodiment, the characteristics of error correction in processing the product code are considered. As described below, fast processing is accomplished in the error correction and descrambling using the product code for the DVD as shown in FIG. 18.

The error-correcting process of the product code in decoding circuit 1200 of the fifth embodiment is applied for example to a case in which an inter code (PI) of the product code is processed and thereafter an outer code (PO) is processed.

Figure 22:
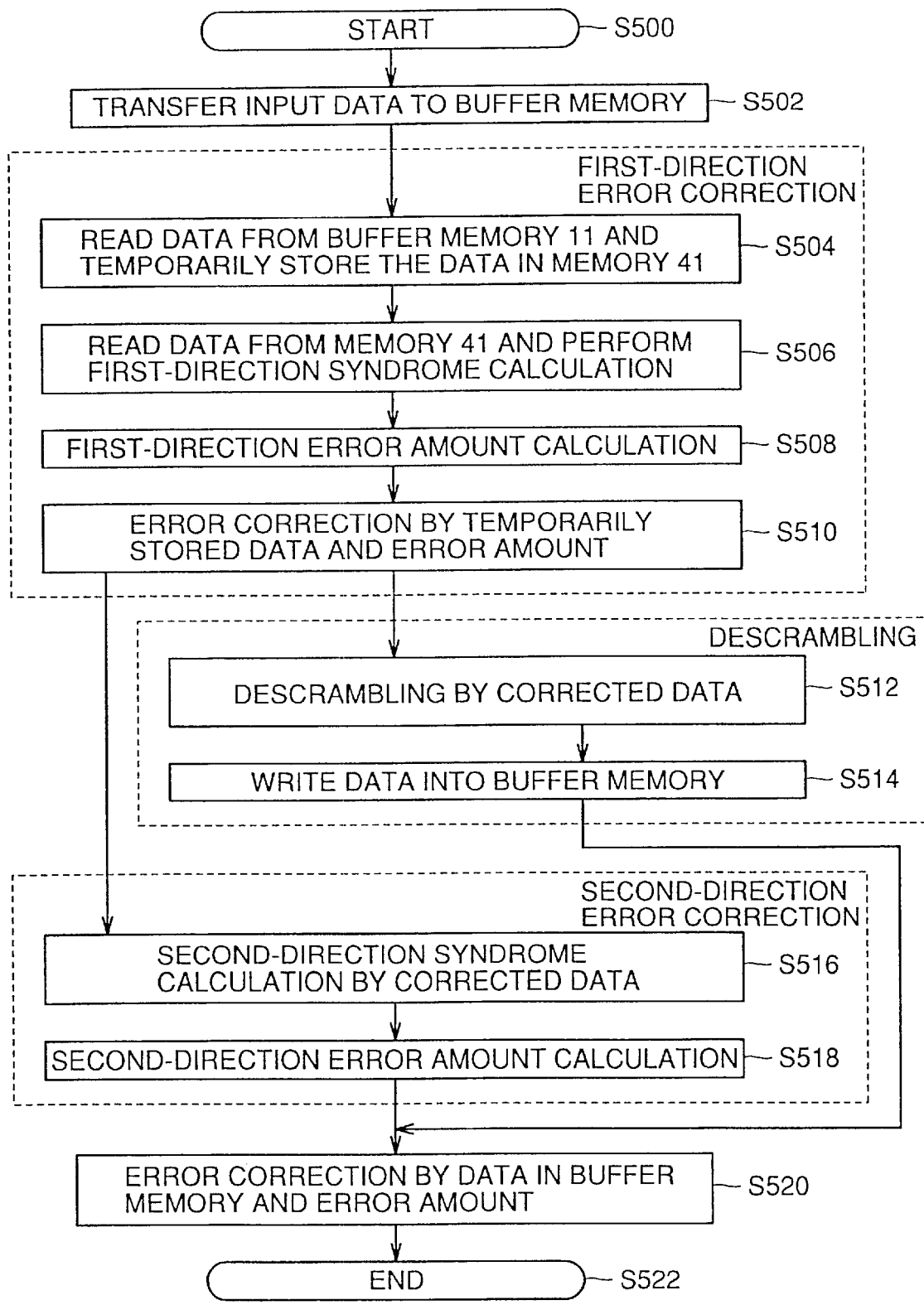
FIG. 22 is a flow chart illustrating an operation of decoding circuit 1200.

FIG. 22 is a flow chart illustrating an operation of decoding circuit 1200 according to the fifth embodiment shown in FIG. 21.

Referring to FIGS. 21 and 22, the structure and operation of decoding circuit 1200 of the fifth embodiment is described.

The process starts and then in a first step, input data is transferred to buffer memory 1011 (step S502). An SDRAM for example is used as data buffer memory 1011.

In a second step, data corresponding to one codeword for example, which is necessary for error correction, is read from buffer memory 1011 and stored temporarily in a data memory device 1041 (step S504).

In a third step, the temporarily stored data is read from data memory device 1041 for calculating a syndrome in a first syndrome calculating circuit 1042 (step S506).

In a fourth step, the calculated syndrome value is supplied to a first error amount calculating circuit 1043 where an error amount is calculated (step S508).

If there is no error, the error amount is regarded as "0" in the calculation.

In a fifth step, the calculated error amount and data temporarily stored in data memory device 1041 are used for calculating the exclusive-OR thereof by an exclusive-OR operating circuit 1047. In this way, all the data having errors corrected are obtained (step S510).

In a sixth step, the data thus corrected is provided to a descrambling circuit 1013 (step S512).

Descrambling circuit 1013 has its structure similar to that in the first embodiment.

In a seventh step, data descrambled by descrambling circuit 1013 is written back into buffer memory 1011 (step S514).

In an eighth step, the data supplied to descrambling circuit 1013 in the sixth step is concurrently supplied to a second syndrome calculating circuit 1045. In addition, a value under the syndrome calculating operation is stored in a syndrome memory device 1044 for performing syndrome calculation by the second syndrome calculating circuit 1045 (step S516).

In a ninth step, the syndrome value thus calculated is supplied to a second error amount calculating circuit 1046 to determine an error amount (step S518).

In a tenth step, the data descrambled in the seventh step and stored in the buffer memory is read only at the position of the second error detection, the exclusive-OR being determined by an exclusive-OR operating circuit 1048, and written back into buffer memory 1011 (step S520).

The process in the third step (step S506) for syndrome calculation by the first syndrome calculating circuit 1042 and the process in the eighth step (step S516) by syndrome calculating circuit 1045 using syndrome memory device 1044 are detailed below.

Figures 23, 24:
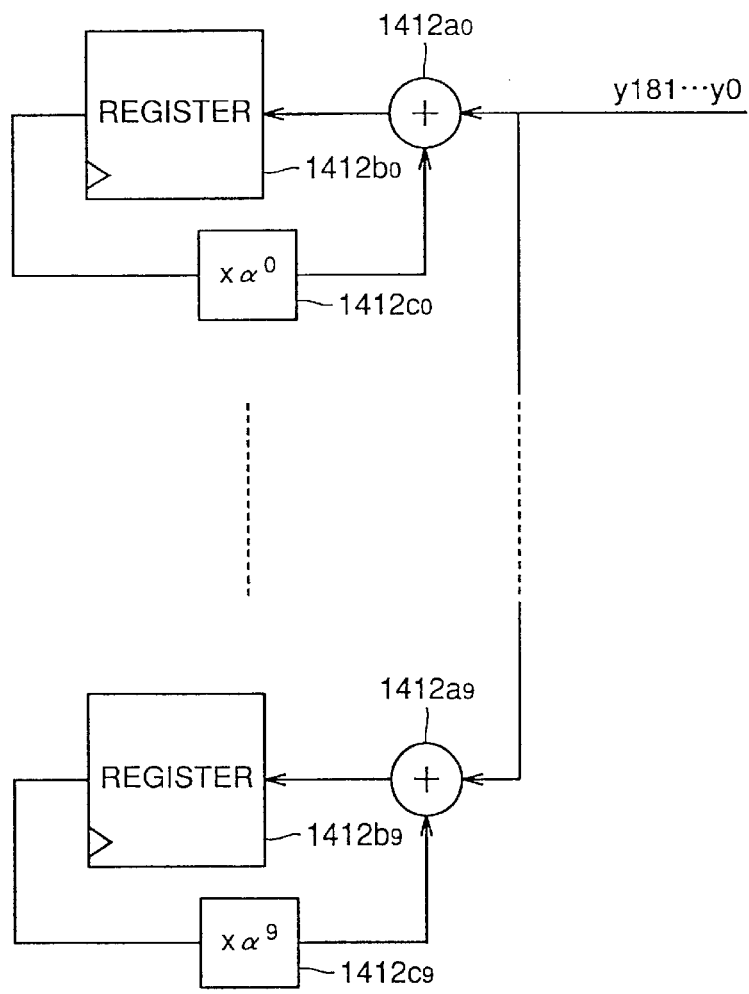
FIG. 23 illustrates an arrangement of data in one block shown in FIG. 2.
FIG. 24 is a block diagram showing a structure of a first syndrome calculating circuit 1042.

FIG. 23 illustrates a data arrangement in one block data shown in FIG. 18. Specifically, in the column direction, 208-byte data from ROW0 to ROW207 are placed. In the row direction, 182-byte data are arranged from COL0 to COL181.

FIG. 24 is a block diagram showing a structure of the first syndrome calculating circuit 1042.

As known, when reception polynomial y (x) of a code column including any error is represented by expression (19) below, a syndrome is provided by expression (20):

$$y(x) = y_{m-1}x^{m-1} + y_{m-2}x^{m-2} + \ldots + y_1 x + y_0 \quad (19)$$

$$Sy_j = \sum_{n=1}^{i=0} y_i(\alpha^j)^i \quad (j = 0, \ldots 2t-1) \quad (20)$$

where m is the number of terms of a primitive polynomial. For the product code block shown in FIG. 23, m=182 when error correction is performed on PI-related line code and m=208 when error correction is performed on PO-related line code.

In the expression, t denotes the number of correctable errors and α denotes the root of the primitive polynomial.

The syndrome calculation formula is implemented by the first syndrome calculating circuit 1042. In this case, exclusive-OR operation is performed instead of a simple summing operation.

The first syndrome calculating circuit 1042 includes n circuits each constituted of an exclusive-OR circuit 1412am, a register 1412bm and a multiplier 1412cm (i.e., m−0, ..., n−1).

According to the format of DVD shown in FIG. 18, it is defined that 10-byte parity PI is added, for example. Therefore, n is equal to 10 (n=0–9) which corresponds to j in expression (6).

Figure 25:
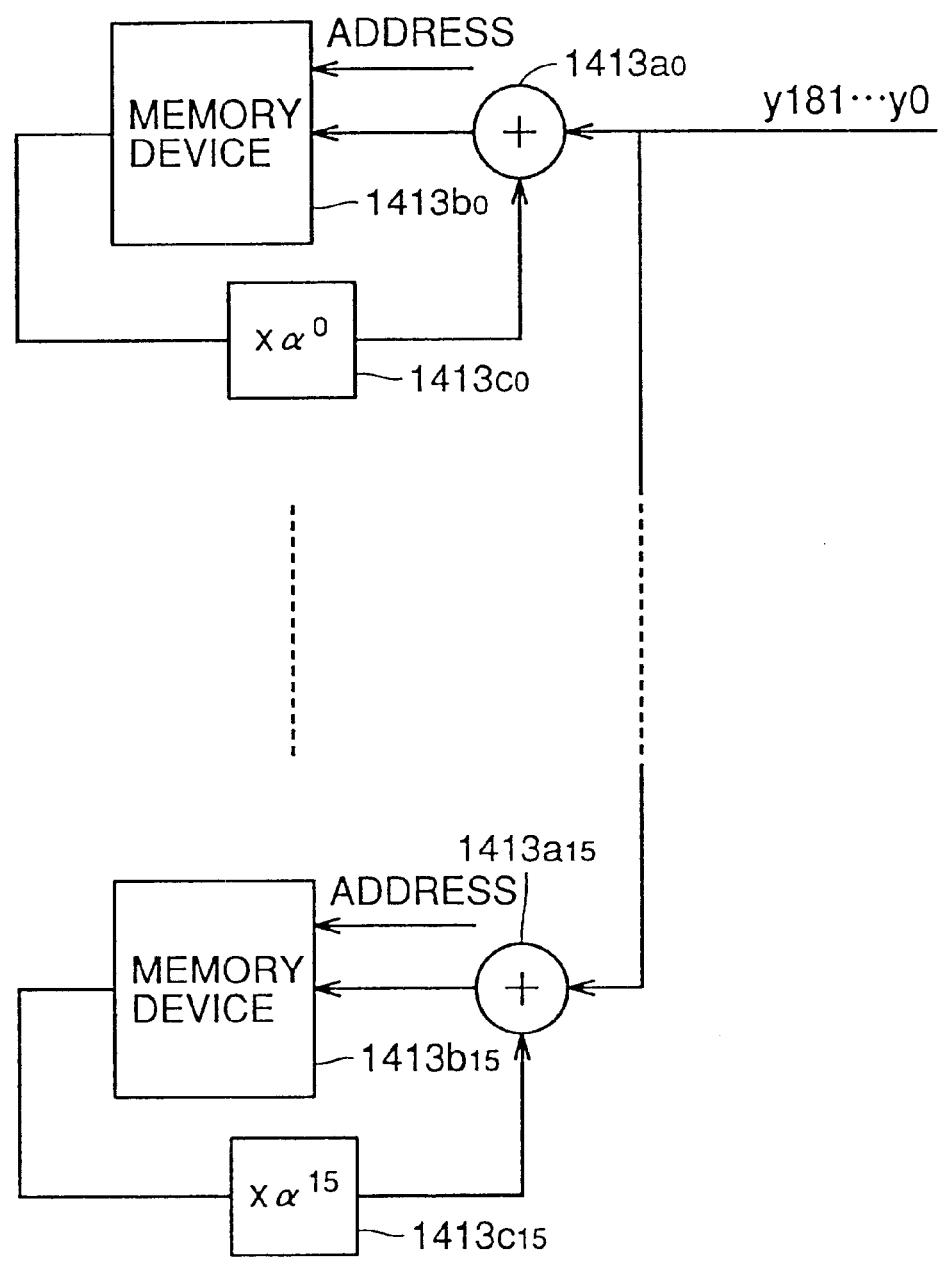
FIG. 25 is a block diagram showing a structure of a syndrome memory device 1044 and a second syndrome calculating circuit 1045.

FIG. 25 is a block diagram showing a structure of syndrome memory device 1044 and the second syndrome calculating circuit 1045. Syndrome memory device 1044 includes a memory device 1413bm (m=0–15) and the second syndrome calculating circuit 1045 includes an exclusive-OR operating circuit 1413am (m=0–15) and a multiplier 1413cm (m=0–15).

The second syndrome calculating circuit 1045 is similar to the first syndrome calculating circuit 1042 in that it implements syndrome calculation of expression (6). However, the former includes m circuits each formed of an exclusive-OR circuit 1413am, a memory device 1413bm and a multiplier 1413cm. For example, according to the DVD format shown in FIG. 18, it is defined that 16-byte parity PO is added. Therefore, m is equal to 16 (0–15). Memory device 1413bm is employed for sequentially storing values under syndrome calculation. Although memory device 1413bm is not limited to a specific one, the device is formed of an SRAM (Static Random Access Memory) for example.

Syndrome operation based on this structure is described following the steps indicated by the arrows in FIG. 21.

A decode command is supplied from controller 1010 to decoding circuit 1210. Decoding circuit 1200 then starts error correction and descrambling on one block data produced as a product code block.

PI-related line data of ROW0 in FIG. 23 is transferred from buffer memory 1011 to data memory device 1041. The first syndrome calculating circuit 1042 performs syndrome calculation on codes of the PI-related line. The first error amount calculating circuit 1043 and exclusive-OR operating circuit 1047 perform error-correcting operation.

Specifically, from buffer memory 1011, data yi (i=181–0) is input successively to exclusive-OR circuit 1412an (n=0–9) per PI-related line of the product code block shown in FIG. 23. The operational result is stored temporarily in register 1412bn (n=0–9). The data stored in register 1412bn is multiplied by $\alpha^n$ (n=0–9) by multiplier 1412cn (n=0–9). The result and next data y (i−1) are used for calculating the exclusive-OR thereof by exclusive-OR circuit 1412an. This is repeated to determine a syndrome.

After syndrome calculation, the first error amount calculating circuit 1043 and exclusive-OR operating circuit 1047 perform error-correcting operation and accordingly the error-correcting operation for this PI-related line is completed.

The data corrected line by line is transferred from exclusive-OR operating circuit 1047 to descrambling circuit 1013 and further transferred to the second syndrome calculating circuit 1045 where error correction in PO direction is performed.

The corrected data from exclusive-OR operating circuit 1047 is descrambled by descrambling circuit 1013 and further transferred to buffer memory 1011 and to the second syndrome calculating circuit 1013.

Corrected PI-related line data yi (i=181–10) are successively supplied from exclusive-OR operating circuit 1047 to exclusive-OR circuit 1413an (n=0–15) and the operational results are stored in memory device 1413bn (n=0–15).

Regarding the PI-related line data of ROW0, there is no data stored previously in memory device 1413bn (n=0–15). Therefore, the value is directly stored in memory device 1413bn. Specifically, at this time, the PI-related line data of ROW0 in FIG. 23 is supplied to the second syndrome calculating circuit 1045 and 172-byte data is stored in memory device 1413bn.

Following this, PI-related line data of ROW1 is transferred from buffer memory 1011 to perform error-correcting operation on codes of the PI-related line by the first syndrome calculating circuit 1042, the first error amount calculating circuit 1043 and exclusive-OR operating circuit 1047. The corrected data of ROW1 is descrambled by descrambling circuit 1013 to be transferred to buffer memory 1011 on which any error is corrected.

Simultaneously with the transfer of corrected data from exclusive-OR operating circuit 1047 to descrambling circuit 1013, the data is transferred to the second syndrome calculating circuit 1045. The second syndrome calculating circuit 1045 shown in FIG. 9 receives y (181) in the PI-related line data of ROW1, reads y (181) (PI-related data of ROW0) stored in memory device 1413bn to transfer it to multiplier 1413cn (n=0–15) that is multiplied by $\alpha^n$ (n=0–15) by multiplier 1413cn. The exclusive-OR of the result and y (181) in the PI-related line data of ROW1 is determined by exclusive-OR circuit 1413an. The resultant value is overwritten on y (181) stored in memory device 1413bn.

In a similar manner, every time PI-related line data y (i) of ROW1 is input, corresponding data is read from memory device 1413bn for the operation by exclusive-OR circuit 1413an. The resultant value is overwritten on y (i) stored in memory device 1413bn.

In memory device 1413bn, new data are successively overwritten on the data therein. Therefore, memory device 1413bn may have an extremely small storage capacity just for storing 172-byte (=182 bytes–10 bytes)×m (=16) data.

The operation above is repeated until ROW207 in FIG. 23 is processed. Error correction for the codes of all PI-related lines in the product code block is accordingly completed which means syndrome calculation for the codes of all PO-related lines is completed.

After this, the second error amount calculating circuit 1046 calculates an error amount and the amount and the data in buffer memory 1011 are used for determining the exclusive-OR by exclusive-OR operating circuit 1048 to perform error correction in PO direction.

The above-discussed structure of decoding circuit 1200 exhibits following advantages.

1. Memory device 1413bn stores values in the process of syndrome calculation, and every time new data is input, the original data is overwritten by the new data successively. Therefore, memory device 1413bn may have an extremely small storage capacity which can reduce the circuit area and power consumption.

2. Simultaneously with corrected data is transferred from exclusive-OR operating circuit 1047 to descrambling circuit 1013, the data is transferred to the second syndrome calculating circuit 1045. Therefore, the number of accesses to buffer memory 1011 decreases and correspondingly the speed of error correction can be enhanced.

Sixth Embodiment

Figure 26:
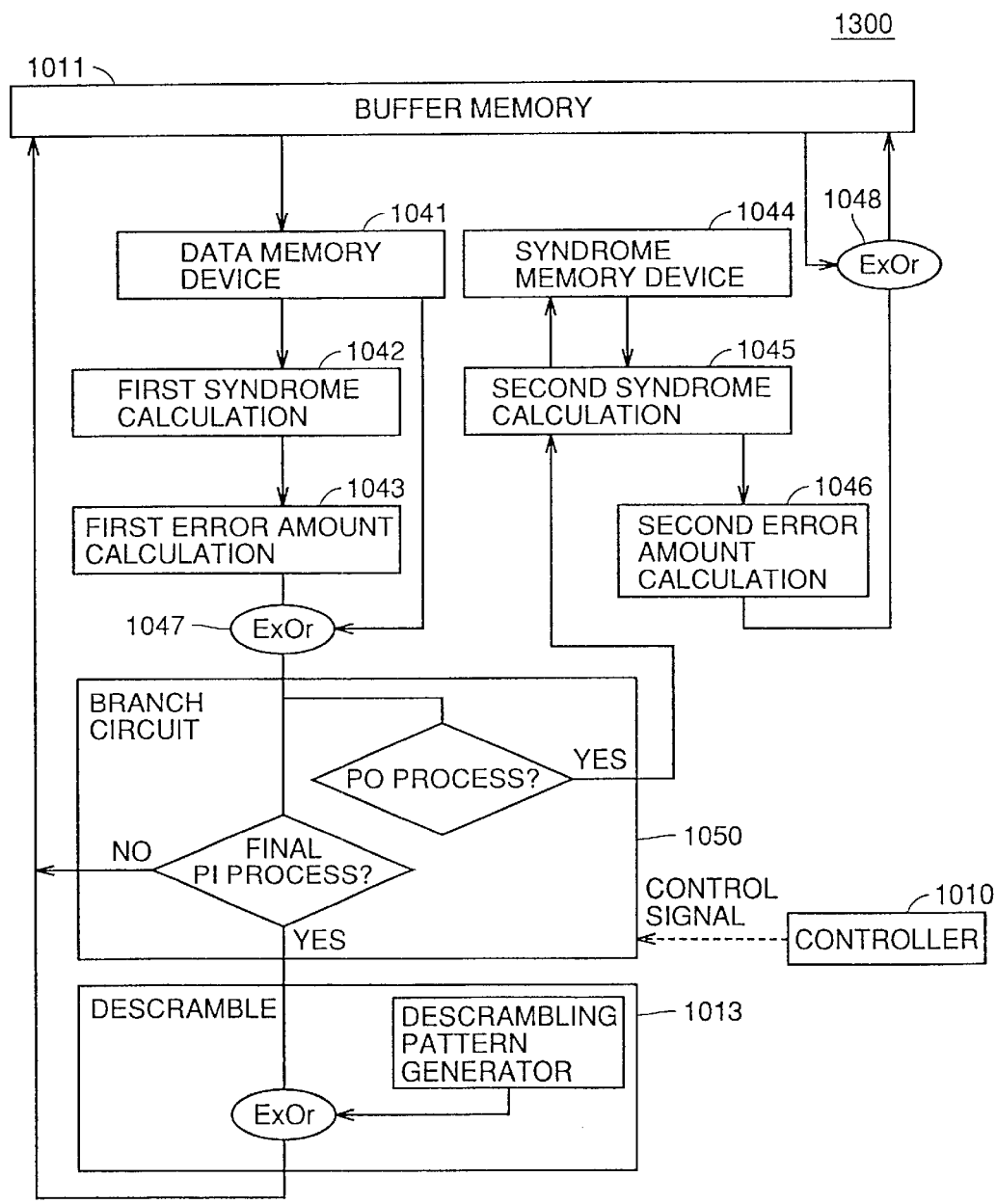
FIG. 26 is a schematic block diagram illustrating a structure of a decoding circuit 1300.

FIG. 26 is a schematic block diagram illustrating a structure of a decoding circuit 1300 according to the sixth embodiment of the invention.

Although the structure of decoding circuit 1300 in the sixth embodiment is basically similar to that of decoding circuit 1200 in the sixth embodiment, a difference is in that a branch circuit 1050 is provided for two branch processes as shown in FIG. 26. One of the branch processes is descrambling of an output supplied from an exclusive-OR operating circuit 1047 and the other is the second syndrome calculation. They are similar to each other except for this and have the same or like components denoted by the same reference character, and description thereof will not be repeated.

Figure 27:
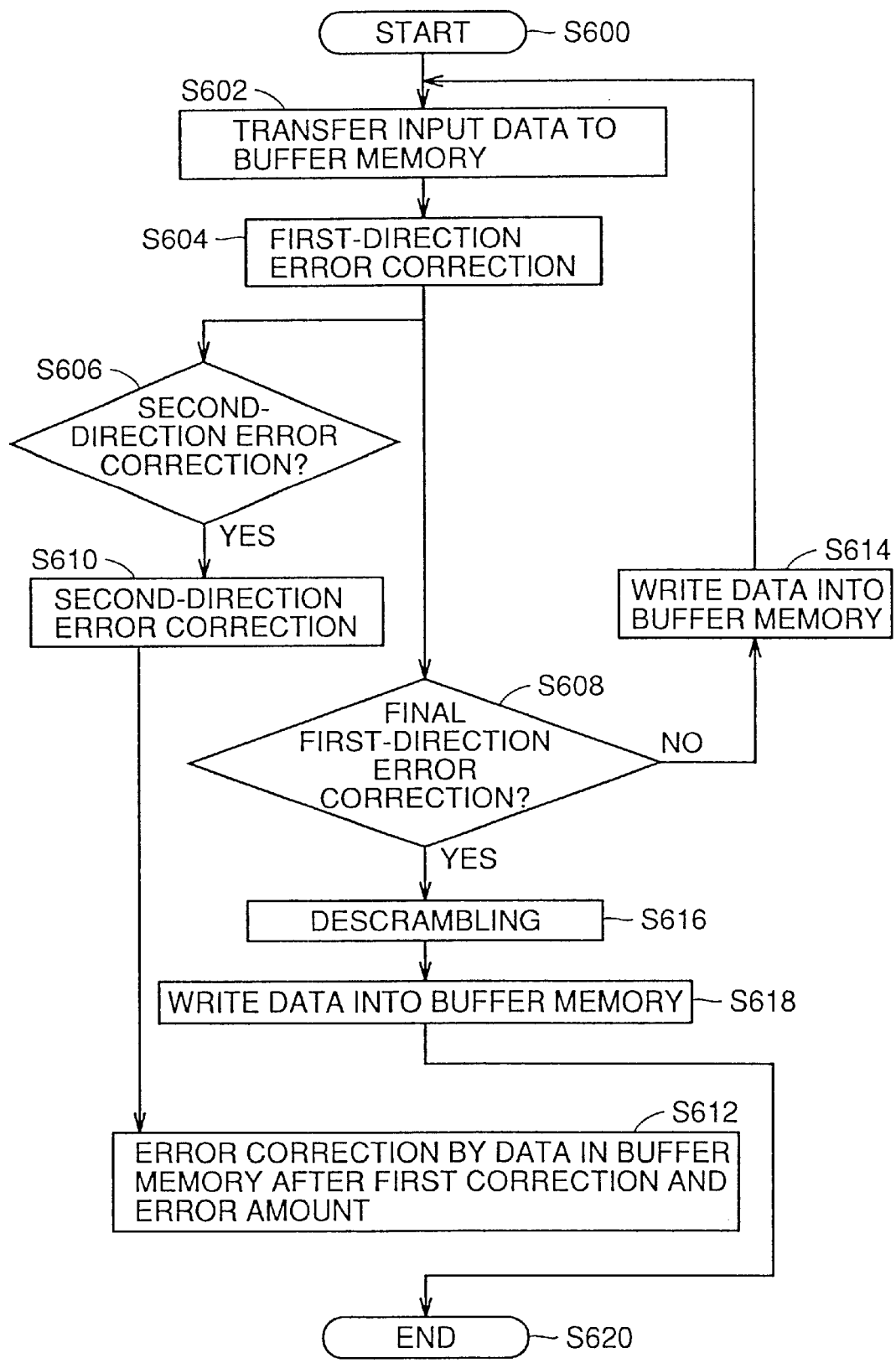
FIG. 27 is a flow chart illustrating an operation of decoding circuit 1300.

FIG. 27 is a flow chart illustrating an operation of decoding circuit 1300 according to the sixth embodiment of the invention.

In the following description of the sixth embodiment, error correction proceeds in the order: inter code (PI), outer code (PO), inter code (PI) of a product code.

According to the sixth embodiment, data is not descrambled but written back into a buffer memory 1011 in the first inter code process, and the data is descrambled in the second inter code process. Consequently, fast processing is accomplished without increase in the circuit scale.

Referring to FIGS. 26 and 27, the process starts (step S600), and input data is transferred to buffer memory 1011 (step S602).

Error correction with respect to a first direction is carried out (step S604), and then it is determined in branch circuit 1050 whether error correction with respect to a second direction is to be performed and whether this is the final first-direction error correction (steps S606 and S608).

The second-direction error correction is performed according to the decision that the second-direction error correction is performed (step S610). Data in the buffer memory that is corrected in the first direction and an error amount are used to conduct error correction (step S612).

It is determined whether this is the final first-direction error correction (step S608). If it is not the final first-direction error correction, memory data is written into buffer memory 1011 (step S614), and the process returns to step S602.

If it is the final first-direction error correction (step S608), descrambling is performed (step S616), data is written into buffer memory 1011 (step S618), and the process is completed (step S620).

This procedure is applicable to error correction in which the product code is processed in the order from inter code (PI), outer code (PO), inter code (PI), and then outer code (PO), i.e., correction is performed four times. In this case, as explained above, in the first inter code process, descrambling is skipped and data is written back to the buffer memory. And descrambling is performed in the second inter code process. Accordingly, high-speed processing is accomplished without increase in the circuit scale.

Even if the number of error corrections for the inter code or outer code increases, similar procedure is applicable.

Seventh Embodiment

An error-correcting circuit according to the seventh embodiment can be used as error-correcting circuit 200 in a disk reproducing apparatus 1000 shown in FIG. 1.

Alternatively, the error-correcting circuit of the seventh embodiment can be used as error-correcting circuit 1012 in disk reproducing apparatus 1002 shown in FIG. 17.

In the following discussion, the error-correcting circuit of the seventh embodiment is used as error-correcting circuit 200 in disk reproducing apparatus 1000.

In addition, the following discussion is applied to error-correcting and concurrent-checking device and the method for a product code corresponding to data recorded on a DVD as one example. However, the present invention is not limited to such application and is applicable to error-correcting process for BCH code and the like to which Euclidean method is applied.

For easy understanding of the discussion, a circuit structure and an algorithm corresponding to a decoding algorithm for (182, 172, 11) RS code are explained. However, the present invention is not limited to the (182, 172, 11) RS code and is applicable to more general use.

Figure 28:
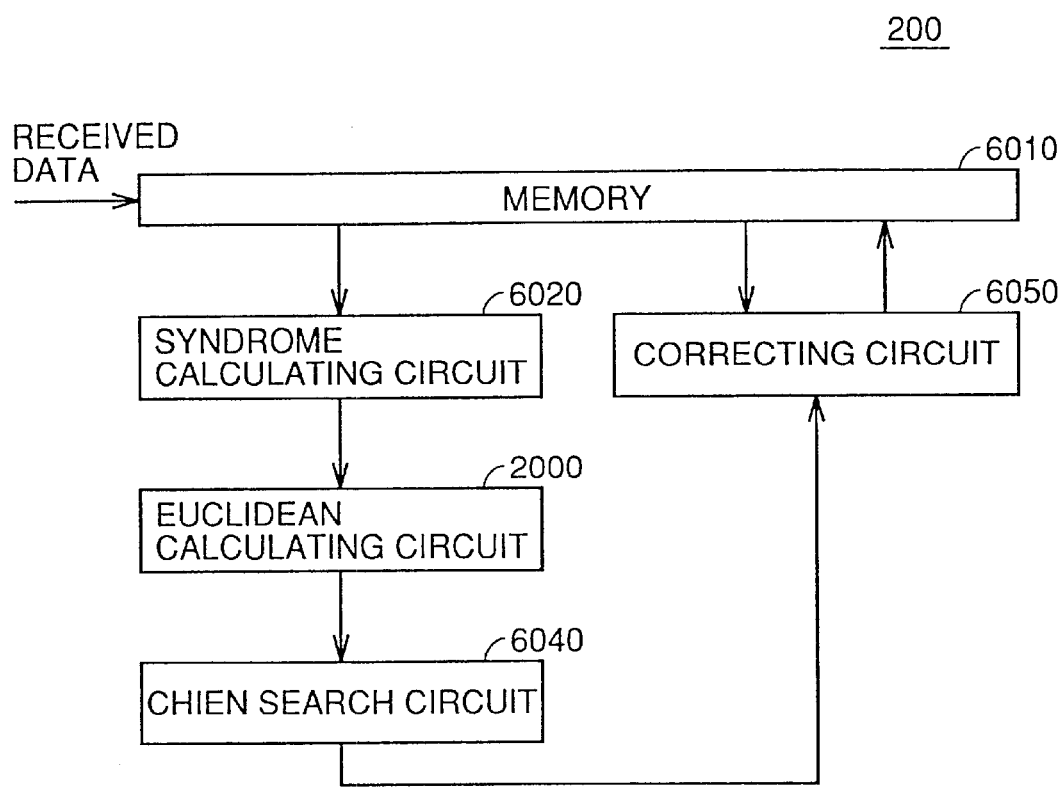
FIG. 28 is a schematic block diagram illustrating a structure of an error-correcting circuit 200.

FIG. 28 is a schematic block diagram illustrating a structure of error-correcting circuit 200 according to the seventh embodiment.

Figure 43:
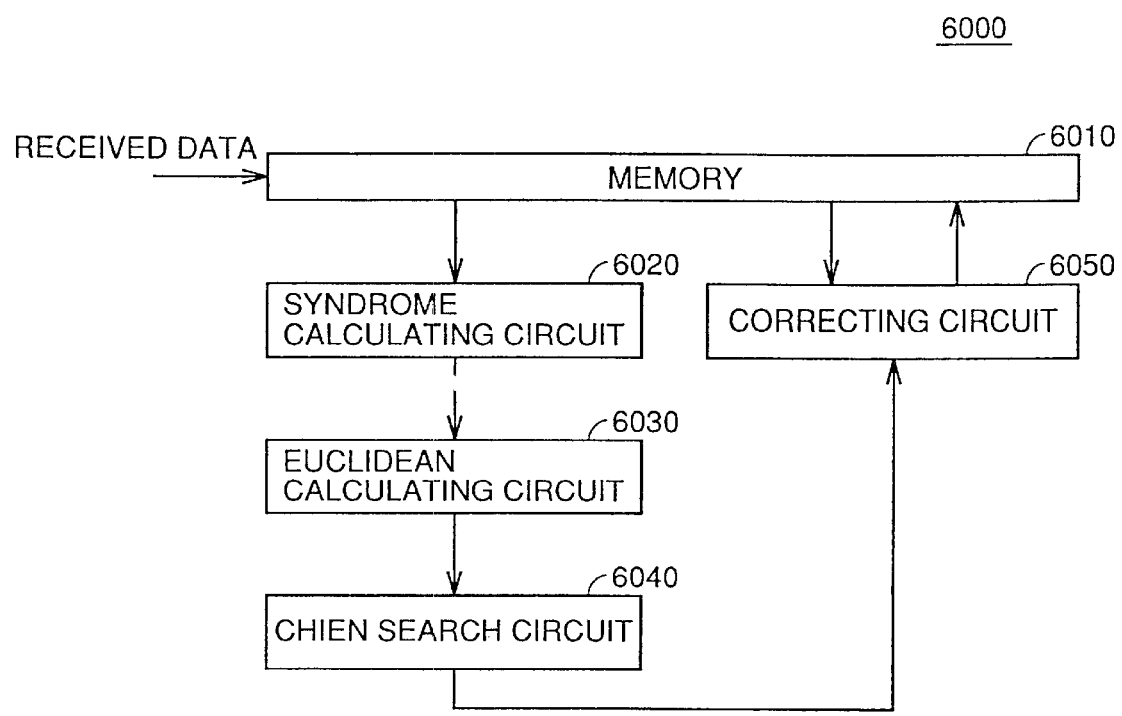
FIG. 43 is a schematic block diagram showing a structure of a conventional error-correcting device 6000.
Figure 44:
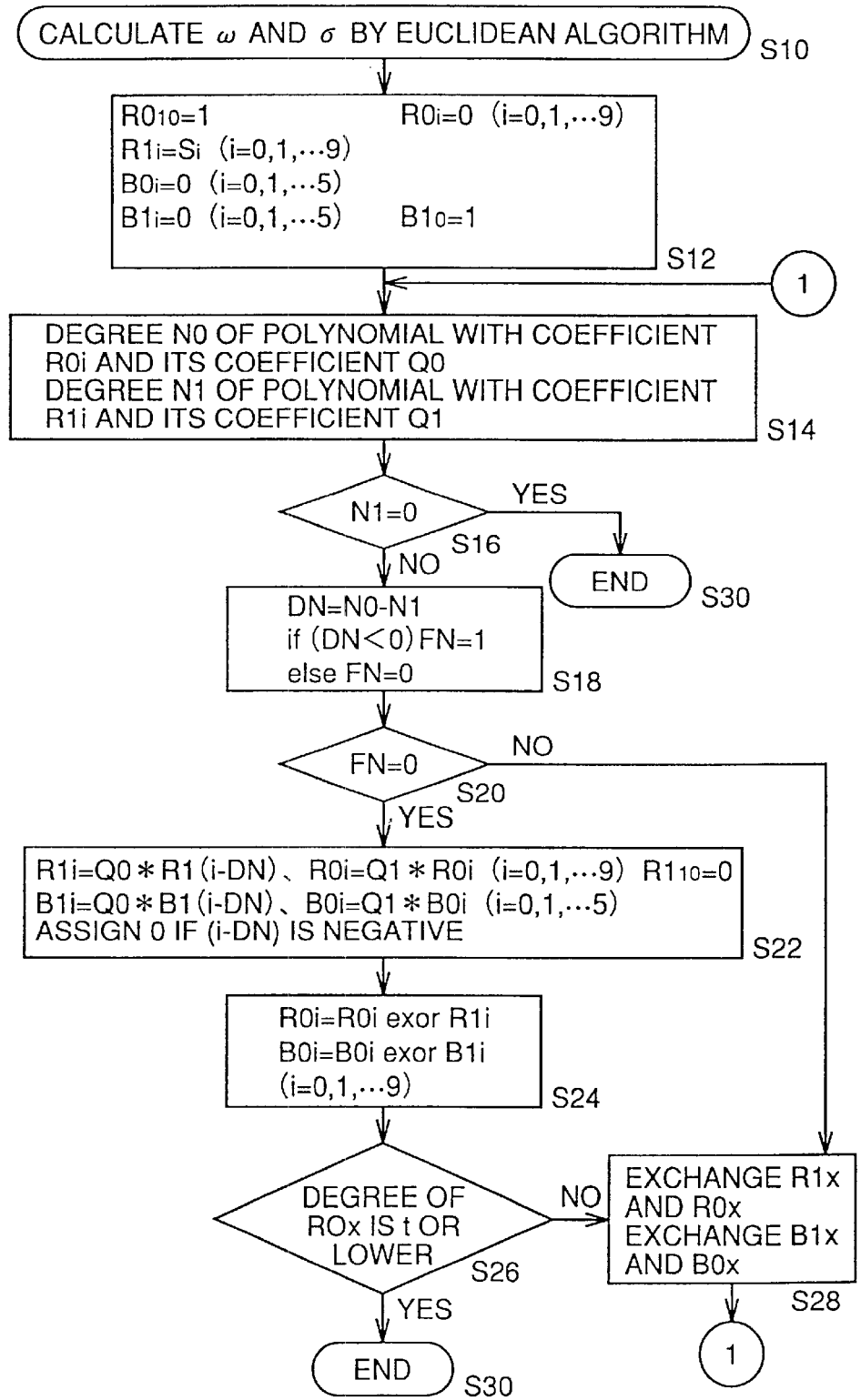
FIG. 44 is a flow chart illustrating a process flow of a conventional Euclidean algorithm.

The structure of error-correcting circuit 200 is similar to that of conventional error-correcting circuit 6000 shown in FIG. 43 except that Euclidean calculating circuit 2000 is employed instead of Euclidean calculating circuit 30. The same components have the same reference character and description thereof will not be repeated here.

Figure 29:
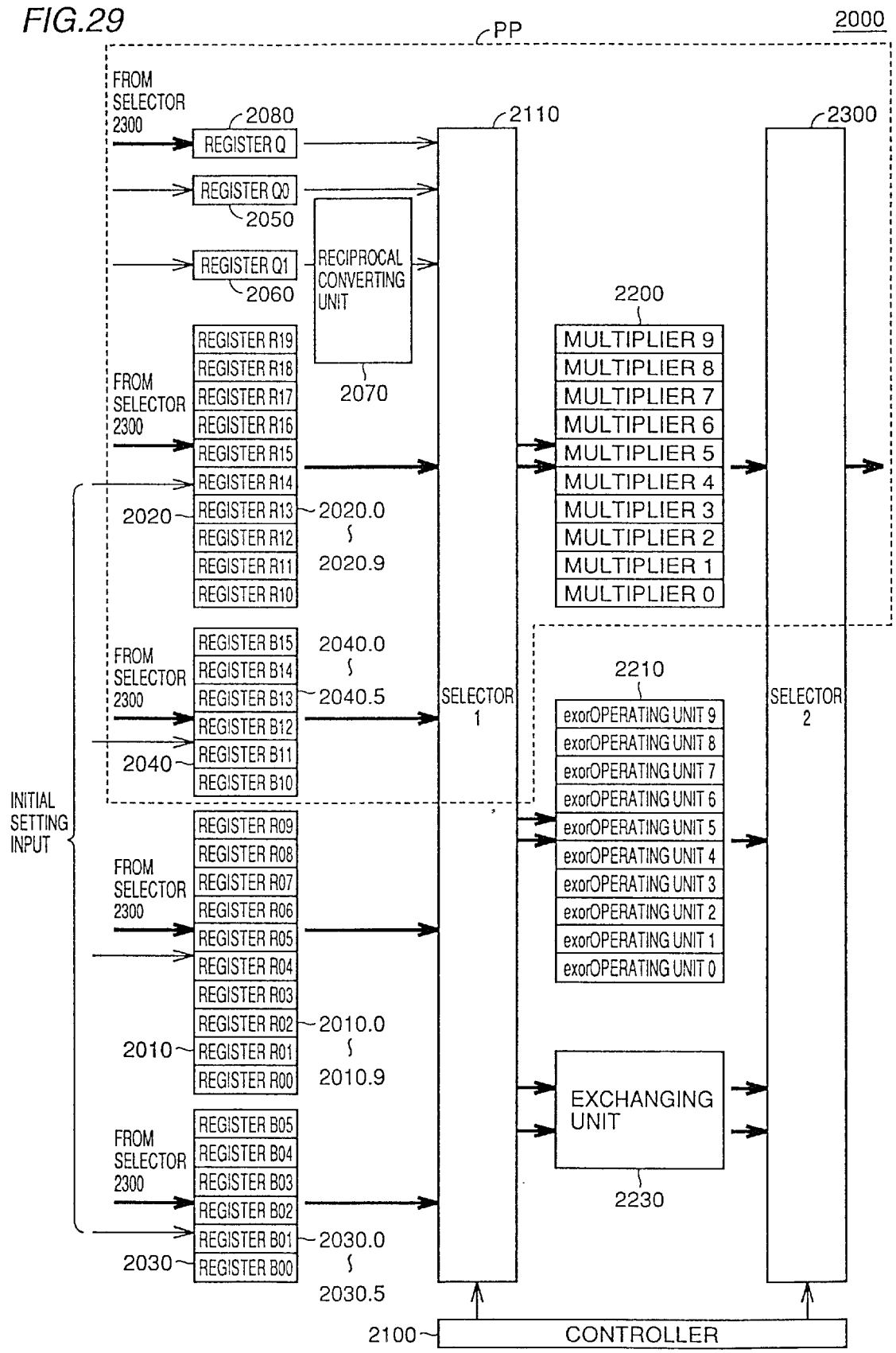
FIG. 29 is a schematic block diagram illustrating a structure of a Euclidean calculating circuit 2000.

FIG. 29 is a schematic block diagram illustrating a structure of Euclidean calculating circuit 2000 shown in FIG. 28.

Referring to FIG. 29, Euclidean calculating circuit 2000 includes a first group of evaluation polynomial registers 2010 and a second group of evaluation polynomial registers 2020 for storing coefficients under operation corresponding to polynomial $Z_{i-2}$ (x) or polynomial $Z_{i-1}$ (x) in order to determine quotient polynomial $Q_i$ (x) and remainder polynomial $Z_i$ (x) in expression (15), a first group of position polynomial registers 2030 and a second group of position polynomial registers 2040 for storing coefficients under operation corresponding to polynomial $Y_{i-2}$ (x) or polynomial $Y_{i-1}$ (x) for determining remainder polynomial $Y_i$ (x) in expression (17), a register 2050 for storing the highest-degree coefficient Q0 of a polynomial corresponding to coefficient $R0_i$ (i=0, 1, . . . , 9) stored in the first group of evaluation polynomial registers 2010, a register 2060 for storing the highest-degree coefficient Q1 of a polynomial corresponding to coefficient $R1_i$ stored in the second group of evaluation polynomial registers 2020, a reciprocal converting unit 2070 receiving data in register 2060 to convert the data into a reciprocal, and a register 2080 for storing value Q=Q0*(1/Q1) calculated based on the data in registers 2050 and register 2060.

Euclidean calculating circuit 2000 further includes a controller 2100 for controlling Euclidean calculation, a first selector circuit 2110 receiving outputs of the first and second groups of evaluation polynomial registers 2010 and 2020, outputs of the first and second groups of position polynomial registers 2030 and 2040, and outputs of registers 2050 and 2080 and reciprocal converting unit 2070 to transfer data to a destination selected under the control of controller 2100, a group of multipliers 2200 receiving an output of the first selector circuit 2110 to perform multiplication on a Galois field, a group of exor operating units 2210 receiving an output of the first selector circuit 2110 to perform exclusive-OR operation, an exchanging unit 2230 receiving an output of the first selector circuit 2110 to exchange data, and a second selector circuit 2300 receiving respective outputs of the multiplier group 2200, exor operating unit group 2210 and exchanging unit 2230 to transfer data to a destination selected under the control of controller 2100.

As described later, the data stored in the second group of evaluation polynomial registers 2020 and the data stored in the second group of position polynomial registers 2040 are supplied selectively to the group of multipliers 2200 via the first selector circuit 2110. One of a set of data stored in the first group of evaluation polynomial registers 2010 and data stored in the second group of evaluation polynomial registers 2020 or a set of data stored in the first group of position polynomial registers 2030 and data stored in the second group of position polynomial registers 2040 is selectively supplied via the first selector circuit 2110 to exor operating unit group 2210.

Based on an output of a syndrome calculating circuit 6020, controller 2100 performs initial setting in the first and second groups of evaluation polynomial registers 2010 and 2020 and the first and second groups of position polynomial registers 2030 and 2040. Contents stored in registers 2050, 2060 and 2080 are successively updated under the control of controller 2100.

Figure 30:
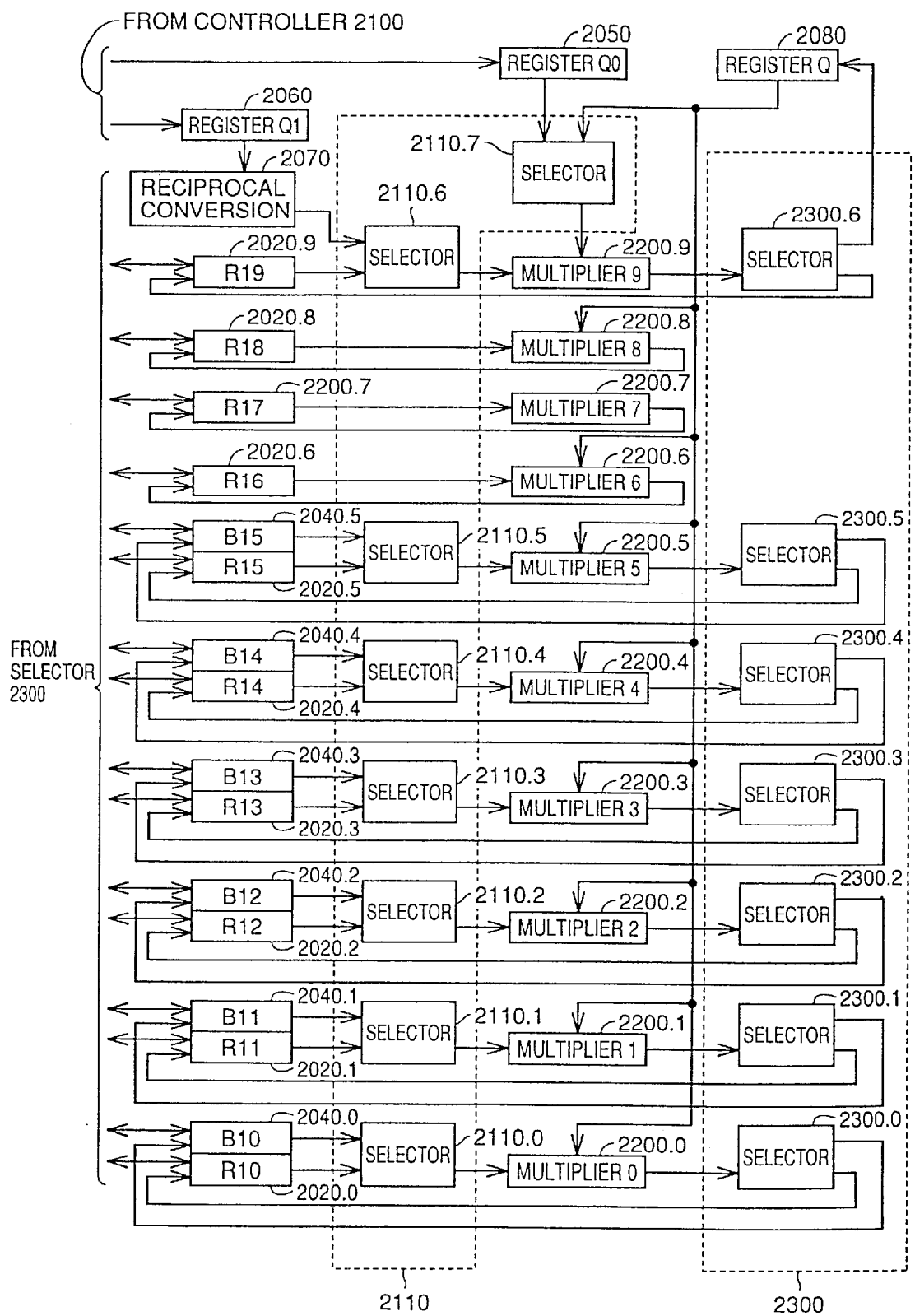
FIG. 30 is a block diagram showing a part of Euclidean calculating circuit 2000 that is enclosed by the dotted line as region PP.

FIG. 30 is a block diagram partially showing Euclidean calculating circuit 2000 in FIG. 29, namely the region PP in FIG. 29 enclosed by the dotted line. This region PP includes the second group of evaluation polynomial registers 2020, the second group of position polynomial registers 2040, registers 2050, 2060 and 2080, reciprocal converting circuit 2070, a part of the first selector circuit 2110, multiplier group 2200, and a part of the second selector circuit 2300.

The second group of evaluation polynomial registers 2020 includes registers 2020.0–2020.9 corresponding to coefficients $R1_i$ (i=0, . . . , 9), and the second group of position polynomial registers 2040 includes registers 2040.0–2040.5 corresponding to coefficients $B1_i$ (i=0, . . . 5). The first group of evaluation polynomial registers 2010 includes registers 2010.0–2010.9 corresponding to coefficients $R0_i$ (i=0, . . . 9) and the first group of position polynomial registers 2030 includes registers 2030.0–2030.5 corresponding to coefficients $B0_i$ (i=0, . . . , 5) that are not shown in FIG. 30.

The second group of evaluation polynomial registers 2020 and the second group of position polynomial registers 2040 can shift stored data under the control of controller 2100.

The first selector circuit 2110 includes selectors 2110.0–2110.7. Multiplier group 2200 includes multipliers 2200.0–2200.9. The second selector circuit 2300 includes selectors 2300.0–2300.6.

Selector 2110.6 (i=0, . . . , 5) receives outputs of registers 2020.i and 2040.i and provides one of them to one input of multiplier 2200.i. Multiplier 2200.i (i=0, . . . , 5) receives at its other input an output of register 2080 to provide multiplication result to selector 2300.i (i=0, . . . , 5).

Multipliers 2200.6–2200.8 receive at respective one inputs outputs of respective registers 2020.6–2020.8. Multipliers 2200.6–2200.8 receive at the other inputs an output of register 2080 to provide multiplication results to registers 2020.6–2020.8 respectively.

Selector 2110.6 receives an output of register 2020.9 and an output of reciprocal converting unit 2070 to provide one of them to one input of multiplier 2200.9. Selector 2110.7 receives respective outputs of register 2050 and register 2080 to provide one of them to the other input of multiplier 2200.9. Multiplier 2200.9 provides a multiplication result to selector 2300.6. Selector 2300.6 provides the output of multiplier 2200.9 to one of registers 2080 and 2020.9.

Figure 31:
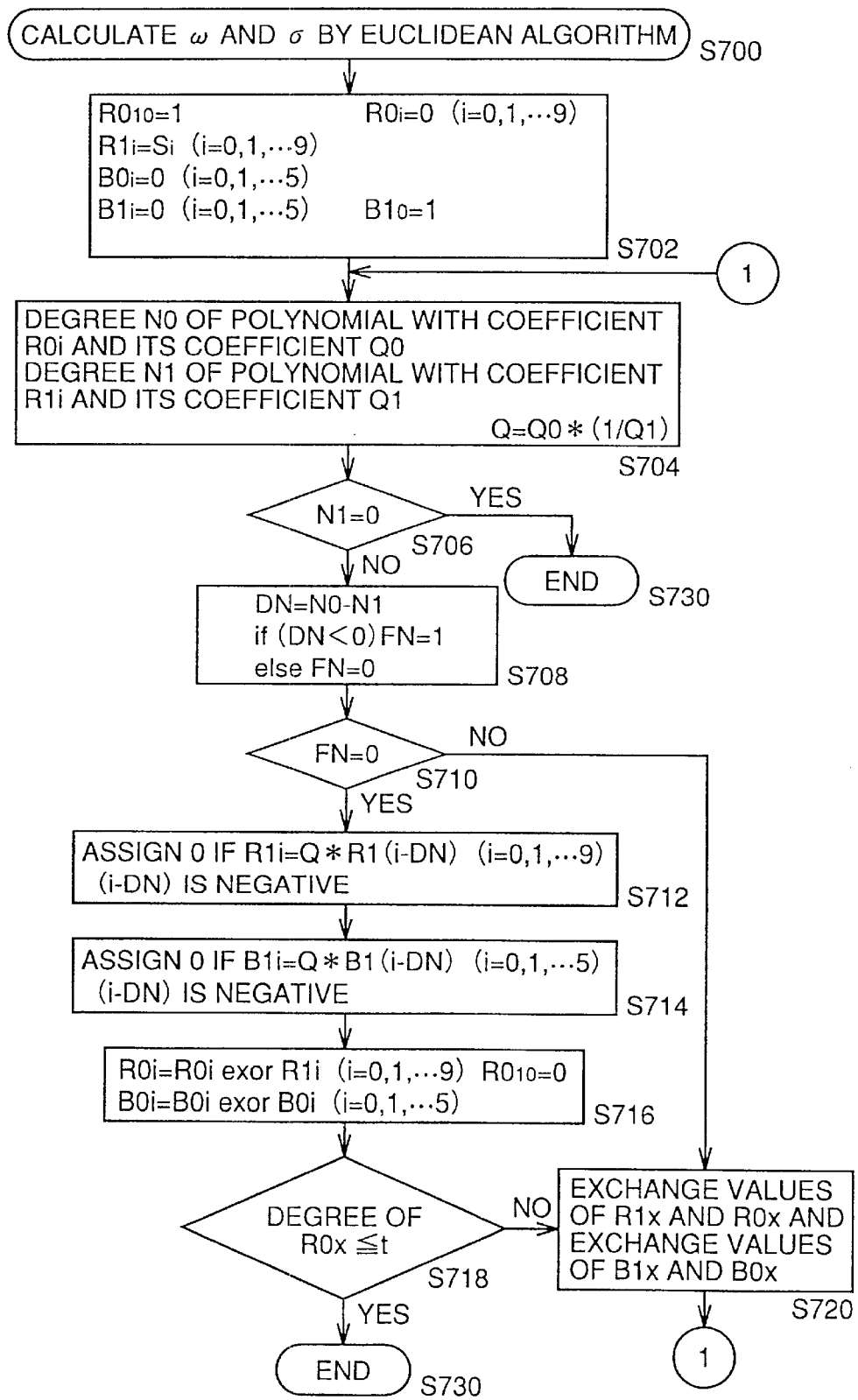
FIG. 31 is a flow chart showing a process flow of Euclidean calculating circuit 2000.
Figure 32:
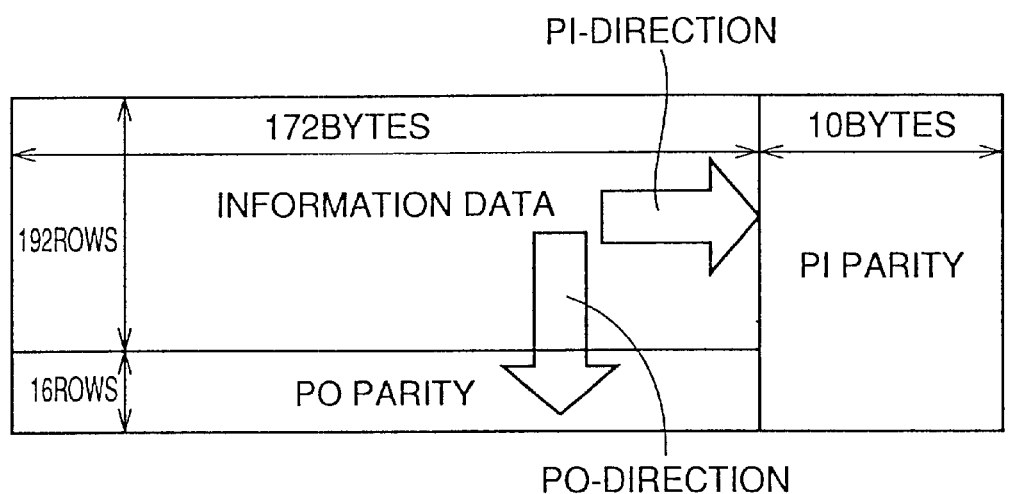
FIG. 32 is a conventional format of an error-correcting product code of a DVD.
Figure 33:
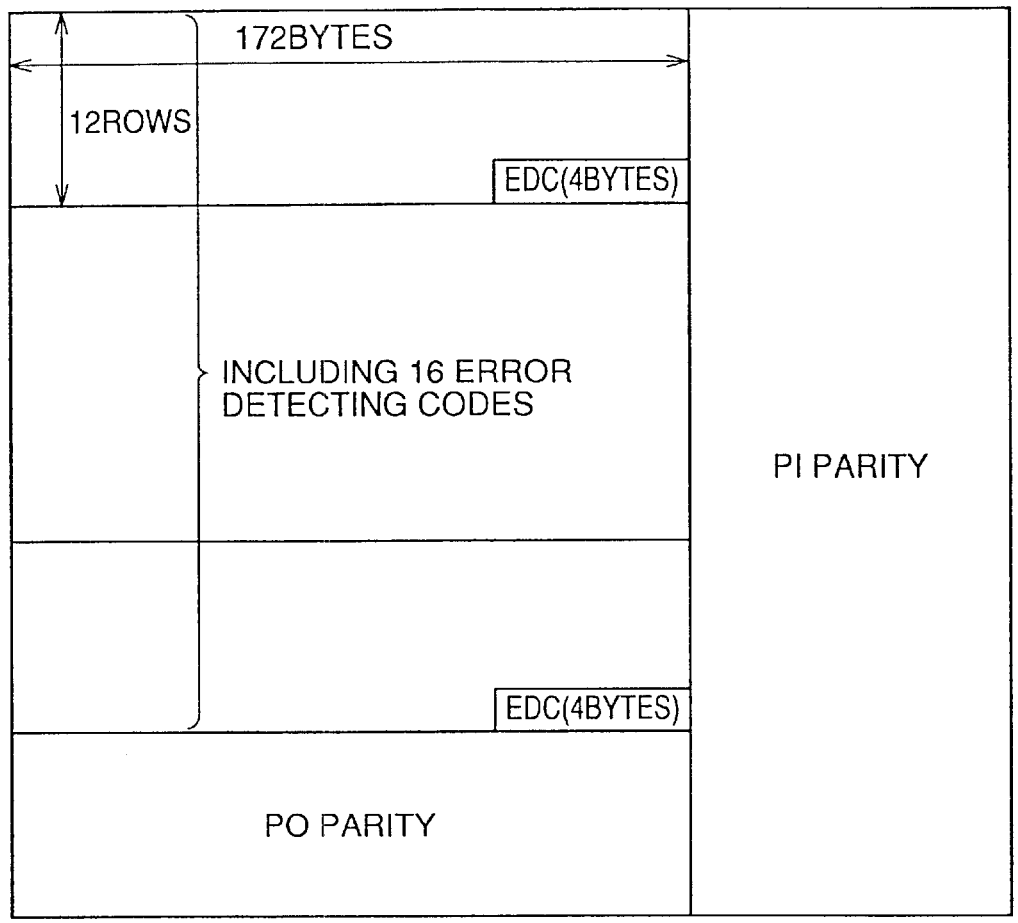
FIG. 33 shows a relation between the error-correcting product code and error detecting codes (EDC) of the DVD.

FIG. 31 is a flow chart showing a process flow in Euclidean calculating circuit 2000 shown in FIGS. 29 and 30.

Referring to FIG. 31, calculation starts for determining error locator polynomial σ (x) and error evaluator polynomial ω (x) by Euclidean algorithm (step S700), and initial value setting is conducted.

$R0_i$ (i=0, 1, ..., 10) below is stored in the first group of evaluation polynomial registers 2010 corresponding to coefficients of expression $x^{2t}=x^{10}$.

$R0_{10}=1$, $R0_i=0$ (i=0, 1, ..., 9)

$R1_i$ (i=0, 1, ..., 9) below is stored in the second group of evaluation polynomial registers 2020 corresponding to coefficients of S (x).

$R1_i=S_i$ (i=0, 1, ..., 9)

Further, $B0_i$ and $B1_i$ (i=0, 1, ... 5) below are stored in the first and second groups of position polynomial registers 2030 and 2040 corresponding to coefficients of $Y_{-1}$ (x) and $Y_0$ (x) respectively.

$B0_i=0$(i=0, 1, ... 5)

$B1_i=0$(i=1, ... 5), $B1_0=1$

The initial setting is accordingly completed (step S702).

Controller 2100 determines degree N0 of a polynomial having coefficient $R0_i$ and the highest-degree coefficient Q0 of that polynomial and stores value Q0 in register 2050. Controller 2100 further determines degree N1 of a polynomial having coefficient $R1_i$ and the highest-degree coefficient Q1 of this polynomial and stores value Q1 in register 2060. Data in register 2060 is converted into a reciprocal by reciprocal converting unit 2070 to be supplied via selector 2110.6 to multiplier 2200.9, and an output of register 2050 is supplied via selector 2110.7 to multiplier 2200.9. The multiplication result Q (=Q0*(1/Q1)) of multiplier 2200.9 is stored via selector 2300.6 in register 2080 (step S704).

N1 and 0 are compared by controller 2100 (step S706). If N1 is equal to 0, this process is completed (step S730). If N1 is not equal to 0, the next step S708 is performed.

Controller 2100 performs operation DN=N0−N1. If DN is smaller than 0, flag variable FN is set to 1. If DN is equal to or greater than 0, flag variable FN is set to 0 (step S708).

Controller 2100 compares flag variable FN with 0. If FN is equal to 0, this process proceeds to step S712. If FN is equal to 1, the process proceeds to step S720 (step S710).

If FN is equal to 0 in step S710, the data stored in the second group of evaluation polynomial registers 2020 is shifted by value DN, and multiplier group 2200 multiplies data stored in the second group of evaluation polynomial registers 2020 by data in register 2080 and the resultant data is stored in the second group of evaluation polynomial registers 2020 again, and thus the following operation is performed.

$R1_i=Q*R1_{(i-DN)}$(i=0, 1, ..., 9)

If (i−DN) is negative, 0 is assigned to the left side member $R1_i$ (step S712).

Data stored in the second group of position polynomial registers 2040 is shifted by value DN. Multiplier group 2200 multiplies data stored in the second group of position polynomial registers 2040 by data stored in register 2080 and the resultant data is stored in the second group of position polynomial registers 2040 again, and thus the following operation is performed.

$B1_i=Q*B1_{(i-DN)}$(i=0, 1, ..., 5)

If (i−DN) is negative, 0 is assigned to the left side member $B1_i$ (step S714).

By exor operating unit group 2210, the operation shown below is performed on the data stored in the first and second groups of evaluation polynomial registers 2010 and 2020 and the data stored in the first and second groups of position polynomial registers 2030 and 2040 (step S716).

$R0_i=R0_i$ exor $R1_i$ (i=0, 1, ..., 9)

$R_{10}=0$ $B0_i=B0_i$ exor $B1_i$ (i=0, 1, ..., 5)

It is determined whether the degree of polynomial R0x represented by variable $R0_i$ is equal to or lower than t (5 in this example) (step S718). If the degree of polynomial R0x is equal to or lower than t, this process is completed (step S730). If the degree of polynomial R0x is not lower than t, the process proceeds to step S720.

If FN=0 is not satisfied in step S710 or the degree of polynomial R0x is not lower than t in step S718, exchanging unit 2230 exchanges the values of variables $R0_i$ and $R1_i$ and exchanges values of variables $B0_i$ and $B1_i$. After this exchange, the process returns to step S704 (step S720).

This process discussed above is similarly applicable to Euclidean calculation for another Reed-Solomon code or more general BCH code.

According to the process described above, polynomial R0x corresponds to error evaluator polynomial ω (x) and polynomial B0x represented by variable $B0_i$ corresponds to error locator polynomial σ (x).

As heretofore discussed, for example, when the number of correctable errors is t, the circuit scale and throughput for implementing the Euclidean method according to the present invention is estimated as follows.

Number of multipliers: 2t

Number of steps required for multiplication: 4t

Number of times multiplication is performed: 2t×(2t+1)

Here, the present invention is compared with the conventional method and circuit structure. According to the invention, the number of multipliers and the number of steps necessary for multiplication are just proportional to t. Consequently, it is possible to implement an error-correcting device having a small circuit scale and operating at a high-speed.

Further, the reduced number of multiplying operations enables reduction of power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error-correcting device comprising:
   an error-correction operating unit performing error correction on data to be corrected including an error-correcting code, said error-correcting code having a product code enabling error correction in first and second directions of a data block,
   said error-correction operating unit including
      a first error-correcting unit performing correction in the first direction of said product code and
      a second error-correcting unit performing correction in the second direction of said product code;
      a first storage element capable of storing said data to be corrected; and
      an error-checking unit performing error checking by error detecting codes for confirming the correction by said error-correction operating unit, said error detecting codes being provided successively in the first direction of said data block, and said error-checking unit including
a first logic operation unit using an error amount detected by the error correction in said first direction and data stored in said first storage element to calculate a first error check result,
a first-direction error-checking unit according to said first error check result to perform error checking after the error correction in said first direction, and
a second-direction error-checking unit using an error amount detected in the error correction in said second direction, calculating a second error check result and performing logical operation on said first and second error check results to perform error check after the error correction in said second direction.

2. The error-correcting device according to claim 1, further comprising a second storage element for receiving and temporarily storing said data to be corrected, wherein said first storage element stores codewords read from said second storage element.

3. The error-correcting device according to claim 1, wherein said second-direction error-checking unit includes:
a partial error-checking unit using the error amount detected in the error correction in said second direction to calculate partial check results for respective data arranged in said second direction of the data block; and
an aggregate error-checking unit aggregating in the first direction said plurality of calculated partial check results to calculate the second error check result.

4. The error-correcting device according to claim 3, wherein at least said second error-correcting unit and said first-direction error-checking unit operate in parallel.

5. The error-correcting device according to claim 3, wherein said second-direction error-checking unit includes:
a third storage element receiving and storing a check result of said first-direction error-checking unit; and
a second logic operation unit receiving the check result of said first-direction error-checking unit stored in said third storage element and the check result of said aggregate error-checking unit to perform error checking after the error correction in said second direction.

6. The error-correcting device according to claim 1, wherein said second-direction error-checking unit performs exclusive-OR on said first and second error check results to perform the error checking after the error correction in said second direction.

7. The error-correcting device according to claim 1, wherein said second-direction error-checking unit includes:
a partial error-checking unit using the error amount detected in the error correction in said second direction and according to an operation table showing a correspondence between a predetermined error amount and partial check results to calculate said partial check results for respective data arranged in said second direction of the data block; and
an aggregate error-checking unit aggregating in the first direction said plurality of calculated partial check, results to calculate the second check result.

8. The error-correcting device according to claim 7, wherein said partial error-checking unit receives successively in a plurality of steps error data corresponding to the error amount detected in the error correction in said second direction, and
wherein said partial error-checking unit includes:
an exclusive-OR operation unit outputting a result of exclusive-OR operation on partial check data based on the error data supplied in a preceding step and the error data supplied in a current step;
a table operation unit receiving the output of said exclusive-OR operation unit and according to an operation table showing a correspondence between predetermined error data and partial check data to output said partial check data; and
data holding means for receiving and holding said partial check data output from said table operation unit to supply said partial check data in the preceding step to said exclusive-OR operation unit, and
wherein said table operation unit outputs, based on said error data supplied in the last step, said partial check results for respective data arranged in said second direction of the data block.

9. The error-correcting device according to claim 8, wherein said table operation unit includes:
data dividing means receiving the output of said exclusive-OR operation unit to divide the output into a predetermined number of groups;
a plurality of sub table operation units respectively receiving outputs of said data dividing unit and according to an operation table showing a correspondence between predetermined error data and partial check data to output said partial check data; and
a partial check operation unit receiving outputs of said plurality of sub table operation units to output said partial check data.

10. An error-correcting method comprising the steps of:
receiving data to be corrected including an error-correcting code having a product code enabling error correction in first and second directions of a data block to perform error correction in said first direction;
receiving said data to be corrected to perform error correction in said second direction,
using successively said data before error correction and an error amount detected by the error correction in said first direction to calculate a first error check result,
performing error checking after the error correction in said first direction according to said first error check result; and
using an error amount detected in the error correction in said second direction, calculating a second error check result and performing logical operation on said first and second error checking results to perform error check after the error correction in said second direction.

11. The error-correcting method according to claim 10, wherein said step of performing error checking after the error correction in said second direction includes the steps of:
using the error amount detected in the error correction in said second direction to calculate partial check results for respective data arranged in said second direction of the data block; and
aggregating in the first direction a plurality of said calculated partial check results to calculate the second error check result.

12. The error-correcting method according to claim 10, wherein in said step of performing the error checking after the error correction in said second direction, exclusive-OR operation is performed on said first and second error check results to perform the error checking after the error correction in said second direction.

13. A decoder for data including an error-correcting product code comprising:

a control unit for controlling an operation of said decoder;

a first storage element for temporarily storing transmitted data;

an error-correcting unit performing error correction on data read into said first storage element; and a descrambling unit for descrambling the data stored in said first storage element, said control unit causing said error-correcting unit to perform error correction on the data read into said first storage element to transfer said error-corrected data to said descrambling unit where said error-corrected data is descrambled and thereafter written back into said first storage element.

14. The decoder according to claim 13, wherein said error-correcting unit includes:

a second storage element for temporarily storing a unit data for error correction read from said first storage element; and an error-correction operating unit for performing error correction on the data in said second storage element.

15. A decoder comprising:

a control unit for controlling an operation of said decoder;

a first storage element for temporarily storing transferred data including an error-correcting product code;

a first error-correcting unit performing error correction in a first direction on data read from said first storage element;

a descrambling unit descrambling said data; and a second error-correcting unit for receiving an error-correction result in said first direction to perform error correction in said second direction, said controller causing i) after the error correction in said first direction on the data read from said first storage element, said descrambling unit to descramble the data having been subjected to the error correction in said first direction, ii) said descrambled data to be written back into said first storage element, and iii) in parallel with said descrambling, said second error-correcting unit to perform error correction on the data stored in said first storage element to be written back into the first storage element.

16. A decoder comprising:

a control unit controlling an operation of said decoder for repeatedly performing error correction in first and second directions;

a first storage element for temporarily storing transferred data including an error-correcting product code;

a first error-correcting unit performing error correction in said first direction on data read from said first storage element;

a descrambling unit writing back a result of descrambling on said data into said first storage element;

a second error-correcting unit for receiving an error-correction result in said first direction to perform error correction in said second direction; and branch means receiving data from said first error-correcting unit for supplying said data to said descrambling unit when last error-correction in the first direction has been performed and for writing back said data into said first storage element when the last error-correction in the first direction has not been performed, said control unit i) supplying to said branch means, after the error correction in the first direction on the data read from said first storage element, said data having been subjected to the error correction in the first direction, ii) causing, when last error-correction in the first direction has been performed, said descrambling unit to descramble the data having been subjected to the error correction in the first direction to write back said descrambled data into said first storage element, and causing, in parallel with said descrambling, said second error-correcting unit to perform error correction on the data stored in said first storage element to write back the data into said first storage element, and iii) writing, when the last error-correction in the first direction has not been performed, the data having been subjected to the error correction in the first direction into said first storage element, and causing said second error-correcting unit to perform error correction on the data stored in said first storage element to write back the data into said first storage element.

17. The decoder according to claim 15, wherein said control unit causing said second error-correcting unit, in parallel with said descrambling, when said second error-correcting unit performs the error correction on the data stored in said first storage element, to perform error correction on data corresponding to an error position derived from the error correction in the second direction, said data included in the data stored in said first storage element.

18. The decoder according to claim 15, wherein said second error-correcting unit includes:

a second storage element for receiving an error-correction result in said first direction to temporarily store the result; and syndrome calculating means based on the data having been subjected to the error correction in said first direction transferred successively from said first error-correcting unit and on data stored in said second storage element for calculating a syndrome for error correction in said second direction and overwriting a calculation result on said second storage element.

19. An error-correcting device comprising:

Euclidean calculating means for determining by operations based on Euclidean algorithm an error locator polynomial indicating an error position of received data and an error evaluator polynomial indicating an error amount; and a correcting unit for performing error correction on said received data based on derived said error locator polynomial and said error evaluator polynomial, said Euclidean calculating means including a first storage unit storing, in an operation for serially deriving coefficients of said error evaluator polynomial, first data corresponding to the coefficients of said error evaluator polynomial, said first storage unit capable of shifting said first data, a second storage unit storing, in an operation for serially deriving coefficients of said error locator polynomial, second data corresponding to the coefficients of said error locator polynomial, said second storage unit capable of shifting said second data, a control unit based on a syndrome polynomial corresponding to said received data for performing initial setting of the data stored in said first and second storage units and controlling processing of said Euclidean algorithm, a multiplier provided commonly to said first and second storage units for performing multiplication on a Galois field based on said Euclidean algorithm, a selector controlled by said control unit for controlling data transfer between said multiplier and said first and second storage units, and a logic operation unit for performing a logical operation on the data stored in said first and second storage units based on said Euclidean algorithm.

20. The error-correcting device according to claim 19, wherein said first storage unit includes a first evaluator polynomial storage unit for holding first coefficient data and a second evaluator polynomial storage unit holding second coefficient data and capable of shifting said second coefficient data, said second storage unit includes a first locator polynomial storage unit for holding third coefficient data and a second locator polynomial storage unit holding fourth coefficient data and capable of shifting said fourth coefficient data, said control unit based on said syndrome polynomial performs initial setting of said first, second, third and fourth coefficients, said multiplier i) multiplies a coefficient quotient, derived from multiplication of a highest-degree coefficient of a first polynomial corresponding to said first coefficient data by a reciprocal of a highest-degree coefficient of a second polynomial corresponding to said second coefficient data, by each of said second coefficient data shifted by said second evaluator polynomial storage unit by a difference between respective degrees of said first and second polynomials, and stores again a result of the multiplication as said second coefficient data in said second evaluator polynomial storage unit, ii) multiplies by said coefficient quotient each of said fourth coefficients shifted by said second locator polynomial storage unit by said difference between the degrees, said logical operation unit stores in said first evaluator polynomial storage unit result of exclusive-OR operation on said first and second coefficient data as said first coefficient data and stores in said first locator polynomial storage unit result of exclusive-OR operation on said third and fourth coefficients as said third coefficient, said Euclidean calculating means further comprises an exchanging unit for exchanging, when said first polynomial corresponding to said first coefficient data has its degree higher than a predetermined degree or when said second polynomial has its degree higher than the degree of said first polynomial, said first coefficient data stored in said first evaluator polynomial storage unit with said second coefficient data stored in said second evaluator polynomial storage unit, and said third coefficient stored in said first locator polynomial storage unit with said fourth coefficient stored in said second locator polynomial storage unit, and said control unit decides that said first polynomial is said error evaluator polynomial and said third polynomial is said error locator polynomial when said first polynomial has its degree lower than the predetermined degree.

21. The error-correcting device according to claim 20, wherein said selector includes first selector means controlled by said control unit for selectively supplying one of an output of said second evaluator polynomial storage unit and an output of said second locator polynomial storage unit, and second selector means controlled by said control unit for selectively supplying an output of said multiplier as said second coefficient data to said second evaluator polynomial storage unit or as said fourth coefficient to said second locator polynomial storage unit.

22. The error-correcting device according to claim 21, wherein said received data is encoded by a BCH code, said control unit performs initial setting of said first and second coefficient data using said first polynomial as $x^{2t}$ and said second polynomial as said syndrome polynomial $S(x)$ where t (t: natural number) represents the number of errors correctable by said BCH code, and said predetermined degree is t.

23. An error-correcting device comprising:

Euclidean calculating means for determining by Euclidean algorithm an error locator polynomial indicating an error position of received data and an error evaluator polynomial indicating an error amount; and a correcting unit for performing error correction on said received data based on derived said error locator polynomial and said error evaluator polynomial, said Euclidean calculating means including a first evaluator polynomial storage unit for storing, for serially performing operations of deriving coefficients of said error evaluator polynomial, first coefficient data in course of operations a second evaluator polynomial storage unit storing second coefficient data in course of the operations of deriving the coefficients of said error evaluator polynomial, said second evaluator polynomial storage unit capable of shifting said second coefficient data a control unit for performing initial setting of said first and second coefficient data based on a syndrome polynomial corresponding to said received data and controlling processing of said Euclidean algorithm a storage unit storing a multiplication result of a highest-degree coefficient of a first polynomial corresponding to said first coefficient data and a reciprocal of a highest-degree coefficient of a second polynomial corresponding to said second coefficient data a multiplier multiplying, by an output of said storage unit, each of said second coefficient data shifted by a difference between respective degrees of said first and second polynomials by said second evaluator polynomial storage unit, and storing again a multiplication result as said second coefficient data in said second evaluator polynomial storage unit a logical operation unit for performing logical operation on said second coefficient data stored again by said multiplier in said second evaluator polynomial storage unit and said first coefficient data stored in said first evaluator polynomial storage unit, and storing operation result as said first coefficient data in said first evaluator polynomial storage unit and an exchanging unit for exchanging the data stored respectively in said first and second evaluator polynomial storage units when said first polynomial corresponding to said first coefficient data has its degree higher than a predetermined degree or said first polynomial is higher in the degree than said second polynomial, and said control unit decides that said first polynomial is said error evaluator polynomial when said first polynomial has its degree lower than the predetermined degree.

24. The error-correcting device according to claim 23, wherein said received data is encoded by a BCH code, said control unit performs initial setting of said first and second coefficient data using said first polynomial as $x^{2t}$ and said second polynomial as said syndrome polynomial S(x) where t (t: natural number) represents the number of errors correctable by said BCH code, and said predetermined degree is t.

25. An error-correcting method comprising the steps of:

determining, based on a syndrome polynomial corresponding to received data, an error locator polynomial indicating an error position and an error evaluator polynomial indicating an error amount by a Euclidean method, said step of determining the error locator polynomial and the error evaluator polynomial including a zeroth step of storing in a storage unit first coefficient data $R0_i$ ($0 \leq i \leq 2t$) as $R0_{2t}=1$, $R0_i=0$ ($0 \leq i \leq 2t-1$), second coefficient data $R1_i$ ($0 \leq i \leq 2t-1$) as $R1i=S_i$ ($0 \leq i \leq 2t-1$), a third coefficient $B0_i$ as $B0_i=0$ ($0 \leq i \leq t$), and a fourth coefficient $B1_i$ as $B1_i=0$ ($0 \leq i \leq t$), $B1_0=1$, a first step of determining degree N0 and highest-degree coefficient Q0 of a first polynomial corresponding to said first coefficient data $R0_i$ and determining degree N1 and highest-degree coefficient Q1 of a second polynomial corresponding to said second coefficient data $R1_i$ to store $Q=Q0*(1/Q1)$ in said storage unit, a second step of determining difference DN=N0−N1 between respective degrees of said first and second polynomials, a third step of exchanging, when the difference in degree DN is less than 0, respective values of said first and second coefficient data $R0i$ and $R1_i$ and exchanging respective values of said third and fourth coefficients $B0_i$ and $B1_i$ to proceed to said first step, a fourth step of storing in said storage unit $R1_i=Q*R1_{(i-DN)}$ ($0 \leq i \leq 2t-1$) when (i−DN) for said second coefficient data is at least 0, and storing said second coefficient data $R1_i$ as 0 when (i−DN) is negative, a fifth step of storing in said storage unit $B1_i=Q*B1_{(i-DN)}$ ($0 \leq i \leq t$) when (i−DN) for said fourth coefficient is not negative, and storing said fourth coefficient $B1_i$ as 0 when (i−DN) is negative, a sixth step of performing on said first and second coefficient data operation $R0_i=R0_i$ exor $R1_i$ ($0 \leq i \leq 2t-1$)

$R1_{2t}=0$ and performing on said third and fourth coefficients operation $B0_i=B0_i$ exor $B1_i$ ($0 \leq \leq t$), and a seventh step of exchanging, when said first polynomial represented by said first coefficient data $R0_i$ has its degree higher than t respective values of said first and second coefficient data $R0_i$ and $R1_i$ and exchanging respective values of said first and fourth coefficients $B0_i$ and $B1_i$ to proceed to said first step; and performing error correction on said received data, when the degree of said first polynomial is lower than t, by calculating the error position and the error amount using said error evaluator polynomial as said first polynomial and said error locator polynomial as a third polynomial represented by said third coefficient $B0_i$.

* * * * *